United States Patent
Aleksov et al.

(10) Patent No.: US 12,057,402 B2
(45) Date of Patent: Aug. 6, 2024

(54) DIRECT BONDING IN MICROELECTRONIC ASSEMBLIES

(71) Applicant: Intel Corporation, Santa Clara, CA (US)

(72) Inventors: Aleksandar Aleksov, Chandler, AZ (US); Adel A. Elsherbini, Tempe, AZ (US); Shawna M. Liff, Scottsdale, AZ (US); Johanna M. Swan, Scottsdale, AZ (US); Feras Eid, Chandler, AZ (US); Randy B. Osborne, Beaverton, OR (US); Van H. Le, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 808 days.

(21) Appl. No.: 17/025,166

(22) Filed: Sep. 18, 2020

(65) Prior Publication Data

US 2022/0093517 A1 Mar. 24, 2022

(51) Int. Cl.
*H01L 23/538* (2006.01)
*H01L 23/49* (2006.01)
*H01L 25/065* (2023.01)

(52) U.S. Cl.
CPC .......... *H01L 23/5384* (2013.01); *H01L 23/49* (2013.01); *H01L 23/5385* (2013.01); *H01L 23/5386* (2013.01); *H01L 25/0657* (2013.01)

(58) Field of Classification Search
CPC . H01L 23/5384; H01L 23/49; H01L 23/5385; H01L 23/5386; H01L 25/0657; H01L 25/03; H01L 25/0652; H01L 24/08
See application file for complete search history.

(56) References Cited

U.S. PATENT DOCUMENTS

| | | | |
|---|---|---|---|
| 2014/0138827 A1 | 5/2014 | Meyer et al. | |
| 2015/0303181 A1 | 10/2015 | Kim et al. | |
| 2018/0040548 A1* | 2/2018 | Kim | H01L 21/4857 |
| 2018/0151502 A1* | 5/2018 | Lin | H01L 24/17 |
| 2019/0164919 A1 | 5/2019 | Hu et al. | |
| 2019/0295912 A1* | 9/2019 | Yu | H01L 25/18 |
| 2019/0295954 A1 | 9/2019 | Nomura et al. | |
| 2020/0066639 A1* | 2/2020 | Lee | H01L 25/50 |

(Continued)

FOREIGN PATENT DOCUMENTS

| | | |
|---|---|---|
| KR | 1020130038825 A | 4/2013 |
| KR | 1020200058129 A | 5/2020 |

(Continued)

OTHER PUBLICATIONS

Aleksov, A., et al., "Structure and Method of Manufacturing Organic Interposers with High Density Interconnects," pp. 1-13 (Jun. 4, 2019).

(Continued)

*Primary Examiner* — Dao H Nguyen
(74) *Attorney, Agent, or Firm* — Akona IP PC

(57) ABSTRACT

Disclosed herein are microelectronic assemblies including microelectronic components that are coupled together by direct bonding, as well as related structures and techniques. For example, in some embodiments, a microelectronic assembly may include an interposer, including an organic dielectric material, and a microelectronic component coupled to the interposer by direct bonding.

20 Claims, 35 Drawing Sheets

(56) References Cited

U.S. PATENT DOCUMENTS

2021/0082825 A1\* 3/2021 Strong ................ H01L 23/5386
2022/0068856 A1\* 3/2022 Chiou .................... H01L 25/50

FOREIGN PATENT DOCUMENTS

WO 2019132958 A1 7/2019
WO 2019132960 A1 7/2019

OTHER PUBLICATIONS

Braunisch, H., et al., "Organic Interposer Package with Embedded Base Dies and Dual-Sided Cooling," pp. 1-3 (Jun. 4, 2019).
Samco, Inc., "Low-temperature PECVD for SiO & SiN Deposition," pp. 1-9 (2020).
U.S. Appl. No. 16/573,943, filed Sep. 17, 2019, "Organic Interposers for Integrated Circuit Packages," 61 pages.
U.S. Appl. No. 16/573,946, filed Sep. 17, 2019, "Dual Sided Thermal Management Solutions for Integrated Circuit Packages," 70 pages.

\* cited by examiner

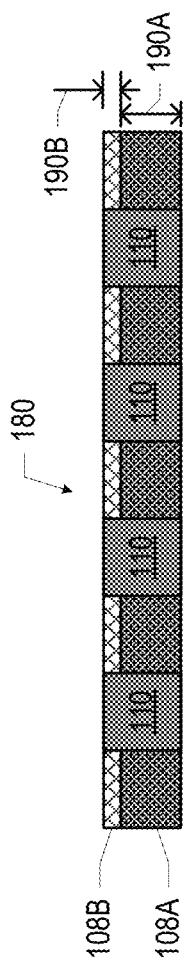
FIG. 3
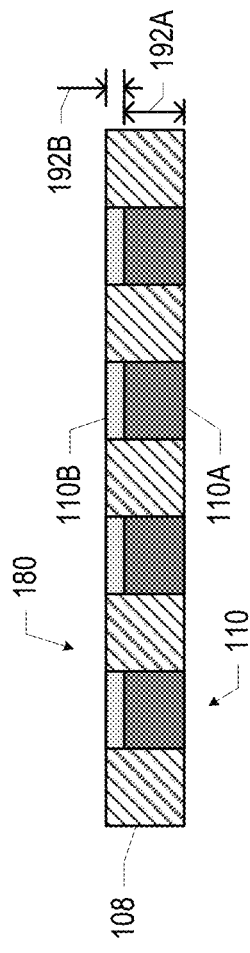
FIG. 4
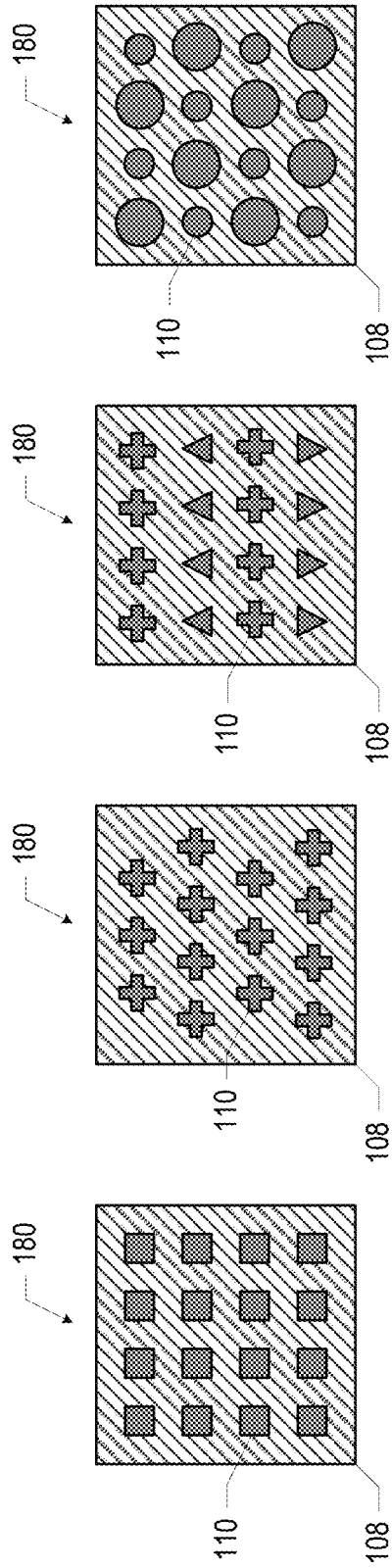
FIG. 5
FIG. 6
FIG. 7
FIG. 8

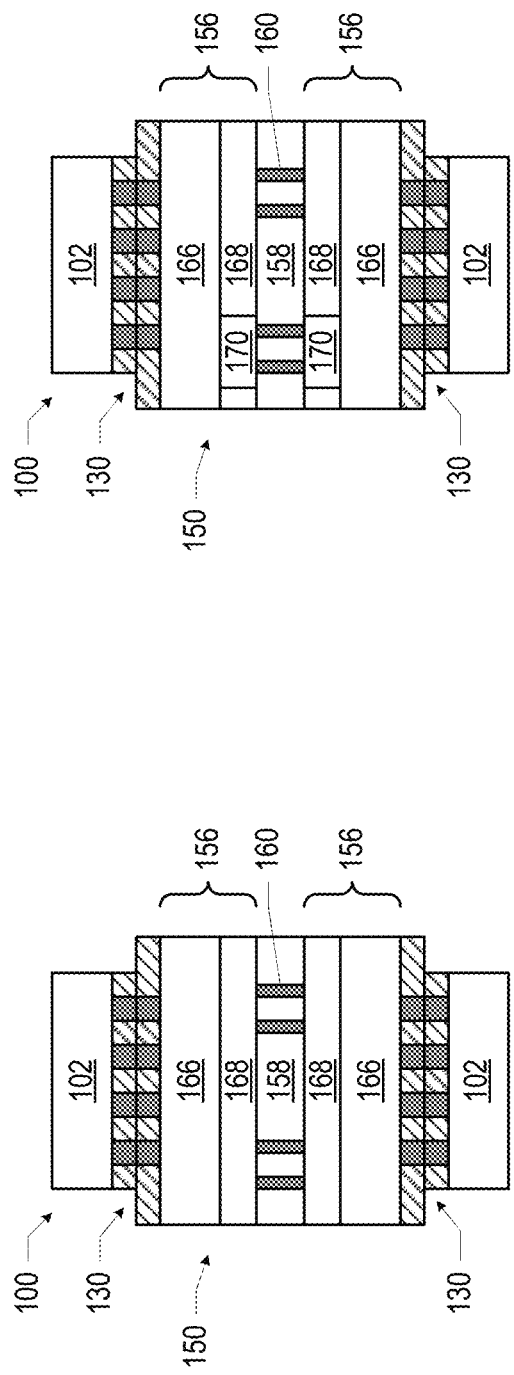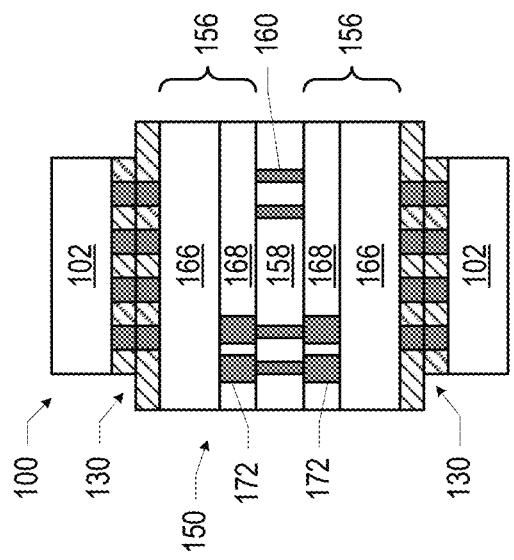

DIRECT BONDING IN MICROELECTRONIC ASSEMBLIES

BACKGROUND

An integrated circuit (IC) package typically includes a die wirebonded or soldered to a package substrate. In use, electrical signals and power are passed between the package substrate and the die through the wirebonds or solder.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, not by way of limitation, in the figures of the accompanying drawings.

FIGS. 3 and 4 are side, cross-sectional views of example direct bonding interfaces of a microelectronic component, in accordance with various embodiments.

FIGS. 5-8 are top views of example direct bonding interfaces of a microelectronic component, in accordance with various embodiments.

FIGS. 31-36 are side, cross-sectional views of example arrangements in microelectronic assemblies including direct bonding, and accordance with various embodiments.

DETAILED DESCRIPTION

Figure 1:
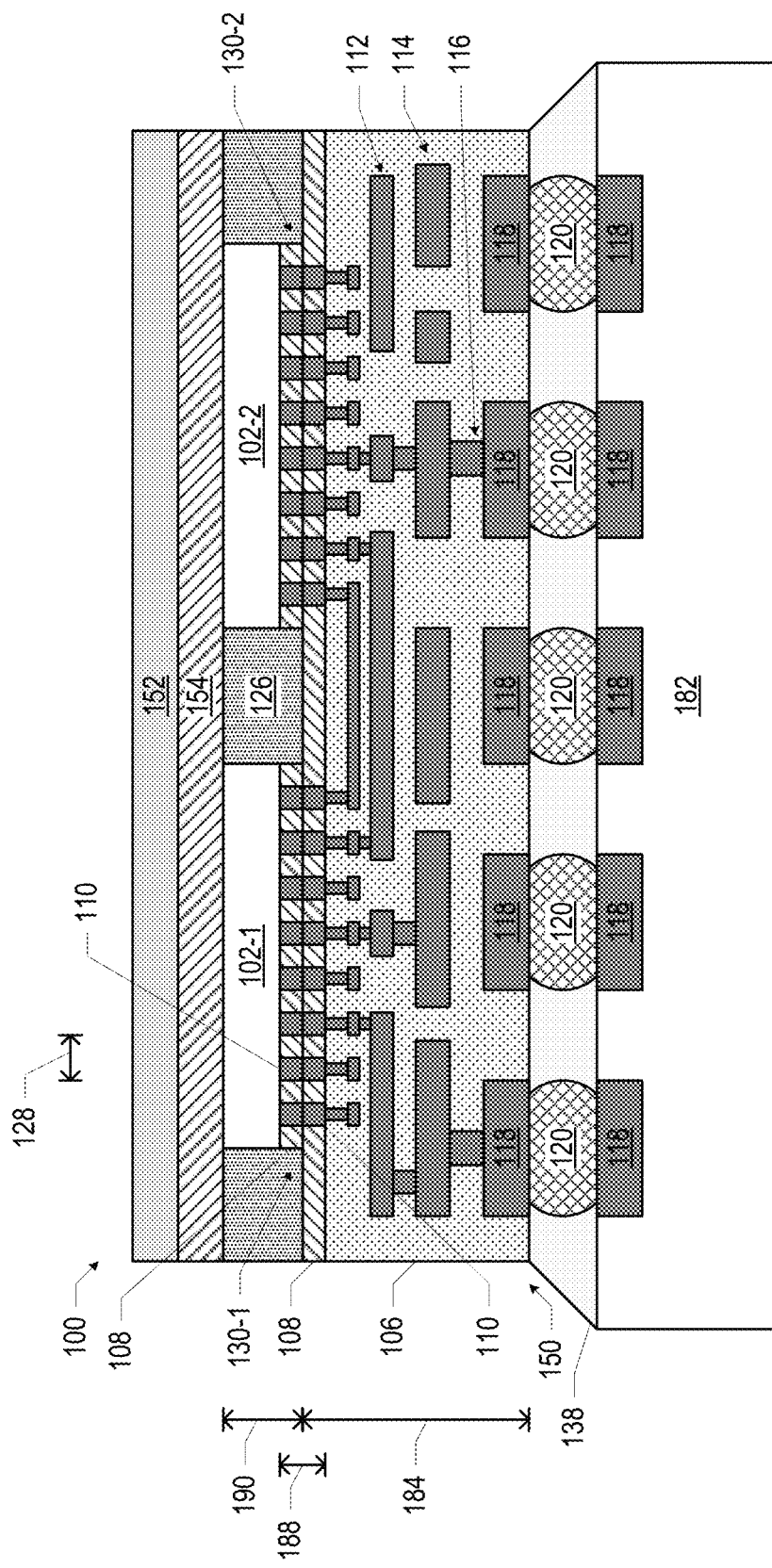
FIG. 1 is a side, cross-sectional view of an example microelectronic assembly including direct bonding, in accordance with various embodiments.

Disclosed herein are microelectronic assemblies including microelectronic components that are coupled together by direct bonding, as well as related structures and techniques. For example, in some embodiments, a microelectronic assembly may include an interposer, including an organic dielectric material, and a microelectronic component coupled to the interposer by direct bonding.

In the following detailed description, reference is made to the accompanying drawings that form a part hereof wherein like numerals designate like parts throughout, and in which is shown, by way of illustration, embodiments that may be practiced. It is to be understood that other embodiments may be utilized, and structural or logical changes may be made, without departing from the scope of the present disclosure. Therefore, the following detailed description is not to be taken in a limiting sense.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrases "A and/or B" and "A or B" mean (A), (B), or (A and B). For the purposes of the present disclosure, the phrases "A, B, and/or C" and "A, B, or C" mean (A), (B), (C), (A and B), (A and C), (B and C), or (A, B, and C). The drawings are not necessarily to scale. Although many of the drawings illustrate rectilinear structures with flat walls and right-angle corners, this is simply for ease of illustration, and actual devices made using these techniques will exhibit rounded corners, surface roughness, and other features.

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. When used to describe a range of dimensions, the phrase "between X and Y" represents a range that includes X and Y. The terms "top," "bottom," etc. may be used herein to explain various features of the drawings, but these terms are simply for ease of discussion, and do not imply a desired or required orientation. Although certain elements may be referred to in the singular herein, such elements may include multiple sub-elements. For example, "a dielectric material" may include one or more dielectric materials. As used herein, a "conductive contact" may refer to a portion of conductive material (e.g., metal) serving as an electrical interface between different components; conductive contacts may be recessed in, flush with, or extending away from a surface of a component, and may take any suitable form (e.g., a conductive pad or socket, or portion of a conductive line or via). For ease of discussion, the drawings of FIGS. 21A and 21B may be referred to herein as "FIG. 21."

FIG. 1 is a side, cross-sectional view of a microelectronic assembly 100, in accordance with various embodiments. A number of elements are illustrated in FIG. 1 as included in the microelectronic assembly 100, but a number of these elements may not be present in a microelectronic assembly 100. For example, in various embodiments, the heat transfer structure 152, the thermal interface material (TIM) 154, the mold material 126, the microelectronic component 102-2, the underfill material 138, and/or the support component 182 may not be included. Further, FIG. 1 illustrates a number of elements that are omitted from subsequent drawings for ease of illustration, but may be included in any of the microelectronic assemblies 100 disclosed herein. Examples of such elements include the heat transfer structure 152, the TIM 154, the mold material 126, the microelectronic component 102-2, the underfill material 138, and/or the support component 182. Many of the elements of the microelectronic assembly 100 of FIG. 1 are included in other ones of the accompanying drawings; the discussion of these elements is not repeated when discussing these drawings, and any of these elements may take any of the forms disclosed herein. In some embodiments, individual ones of the microelectronic assemblies 100 disclosed herein may serve as a system-in-package (SiP) in which multiple microelectronic components 102 having different functionality are included. In such embodiments, the microelectronic assembly 100 may be referred to as an SiP.

Figure 2:
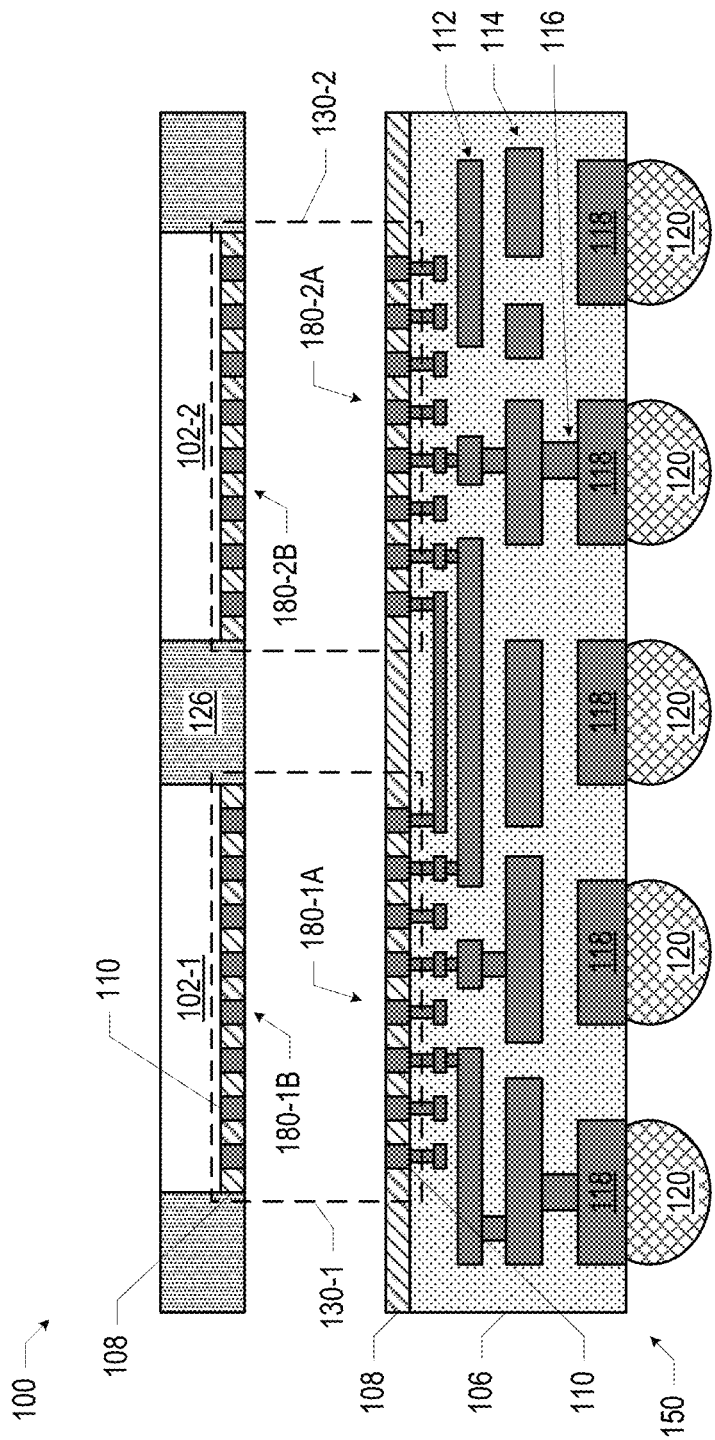
FIG. 2 is a side, cross-sectional exploded view of a portion of the microelectronic assembly of FIG. 1, in accordance with various embodiments.

The microelectronic assembly 100 may include an interposer 150 coupled to a microelectronic component 102-1 by a direct bonding (DB) region 130-1. In particular, as illustrated in FIG. 2, the DB region 130-1 may include a DB interface 180-1A at the top surface of the interposer 150, with the DB interface 180-1A including a set of conductive DB contacts 110 and a DB dielectric 108 around the DB contacts 110 of the DB interface 180-1A. The DB region 130-1 may also include a DB interface 180-1B at the bottom surface of the microelectronic component 102-1, with the DB interface 180-1B including a set of DB contacts 110 and a DB dielectric 108 around the DB contacts 110 of the DB interface 180-1B. The DB contacts 110 of the DB interface 180-1A of the interposer 150 may align with the DB contacts 110 of the DB interface 180-1B of the microelectronic component 102-1 so that, in the microelectronic assembly 100, the DB contacts 110 of the microelectronic component 102-1 are in contact with the DB contacts 110 of the interposer 150. In the microelectronic assembly 100 of FIG. 1, the DB interface 180-1A of the interposer 150 may be bonded (e.g., electrically and mechanically) with the DB interface 180-1B of the microelectronic component 102-1 to form the DB region 130-1 coupling the interposer 150 and the microelectronic component 102-1, as discussed further below. More generally, the DB regions 130 disclosed herein may include two complementary DB interfaces 180 bonded together; for ease of illustration, many of the subsequent drawings may omit the identification of the DB interfaces 180 to improve the clarity of the drawings.

As used herein, the term "direct bonding" is used to include metal-to-metal bonding techniques (e.g., copper-to-copper bonding, or other techniques in which the DB contacts 110 of opposing DB interfaces 180 are brought into contact first, then subject to heat and compression) and hybrid bonding techniques (e.g., techniques in which the DB dielectric 108 of opposing DB interfaces 180 are brought into contact first, then subject to heat and sometimes compression, or techniques in which the DB contacts 110 and the DB dielectric 108 of opposing DB interfaces 180 are brought into contact substantially simultaneously, then subject to heat and compression). In such techniques, the DB contacts 110 and the DB dielectric 108 at one DB interface 180 are brought into contact with the DB contacts 110 and the DB dielectric 108 at another DB interface 180, respectively, and elevated pressures and/or temperatures may be applied to cause the contacting DB contacts 110 and/or the contacting DB dielectrics 108 to bond. In some embodiments, this bond may be achieved without the use of intervening solder or an anisotropic conductive material, while in some other embodiments, a thin cap of solder may be used in a DB interconnect to accommodate planarity, and this solder may become an intermetallic compound (IMC) in the DB region 130 during processing. DB interconnects may be capable of reliably conducting a higher current than other types of interconnects; for example, some conventional solder interconnects may form large volumes of brittle IMGs when current flows, and the maximum current provided through such interconnects may be constrained to mitigate mechanical failure.

A DB dielectric 108 may include one or more dielectric materials, such as one or more inorganic dielectric materials. For example, a DB dielectric 108 may include silicon and nitrogen (e.g., in the form of silicon nitride); silicon and oxygen (e.g., in the form of silicon oxide); silicon, carbon, and nitrogen (e.g., in the form of silicon carbonitride); carbon and oxygen (e.g., in the form of a carbon-doped oxide); silicon, oxygen, and nitrogen (e.g., in the form of silicon oxynitride); aluminum and oxygen (e.g., in the form of aluminum oxide); titanium and oxygen (e.g., in the form of titanium oxide); hafnium and oxygen (e.g., in the form of hafnium oxide); silicon, oxygen, carbon, and hydrogen (e.g., in the form of tetraethyl orthosilicate (TEOS)); zirconium and oxygen (e.g., in the form of zirconium oxide); niobium and oxygen (e.g., in the form of niobium oxide); tantalum and oxygen (e.g., in the form of tantalum oxide); and combinations thereof. Some particular embodiments of arrangements of DB dielectrics 108 including multiple dielectric materials are discussed below with reference to FIG. 4.

A DB contact 110 may include a pillar, a pad, or other structure. The DB contacts 110, although depicted in the accompanying drawings in the same manner at both DB interfaces 180 of a DB region 130, may have a same structure at both DB interfaces 180, or the DB contacts 110 at different DB interfaces 180 may have different structures. For example, in some embodiments, a DB contact 110 in one DB interface 180 may include a metal pillar (e.g., a copper pillar), and a complementary DB contact 110 in a complementary DB interface 180 may include a metal pad (e.g., a copper pad) recessed in a dielectric. A DB contact 110 may include any one or more conductive materials, such as copper, manganese, titanium, gold, silver, palladium, nickel, copper and aluminum (e.g., in the form of a copper aluminum alloy), tantalum (e.g., tantalum metal, or tantalum and nitrogen in the form of tantalum nitride), cobalt, cobalt and iron (e.g., in the form of a cobalt iron alloy), or any alloys of any of the foregoing (e.g., copper, manganese, and nickel in the form of manganin). Some particular arrangements of multiple materials in a DB contact 110 are discussed below with reference to FIG. 3). In some embodiments, the DB dielectric 108 and the DB contacts 110 of a DB interface 180 may be manufactured using low-temperature deposition techniques (e.g., techniques in which deposition occurs at temperatures below 250 degrees Celsius, or below 200 degrees Celsius), such as low-temperature plasma-enhanced chemical vapor deposition (PECVD).

FIGS. 1 and 2 also illustrate a microelectronic component 102-2 coupled to the interposer 150 by a DB region 130-2 (via the DB interfaces 180-2A and 180-2B, as shown in FIG.

2). Although FIG. 1 depicts a particular number of microelectronic components 102 coupled to the interposer 150 by DB regions 130, this number and arrangement are simply illustrative, and a microelectronic assembly 100 may include any desired number and arrangement of microelectronic components 102 coupled to an interposer 150 by DB regions 130. Although a single reference numeral "108" is used to refer to the DB dielectrics of multiple different DB interfaces 180 (and different DB regions 130), this is simply for ease of illustration, and the DB dielectric 108 of different DB interfaces 180 (even within a single DB region 130) may have different materials and/or structures (e.g., in accordance with any of the embodiments discussed below with reference to FIG. 3). Similarly, although a single reference numeral "110" is used to refer to the DB contacts of multiple different DB interfaces 180 (and different DB regions 130), this is simply for ease of illustration, and the DB contacts 110 of different DB interfaces 180 (even within a single DB region 130) may have different materials and/or structures (e.g., in accordance with any of the embodiments discussed below with reference to FIG. 4).

The interposer 150 may include an insulating material 106 (e.g., one or more dielectric materials formed in multiple layers, as known in the art) and one or more conductive pathways 112 through the insulating material 106 (e.g., including conductive lines 114 and/or conductive vias 116, as shown). In some embodiments, the insulating material 106 of the interposer 150 may be an organic material, such as polyimide or polybenzoxazole, or may include an organic polymer matrix (e.g., epoxy) with a filler material (which may be inorganic, such as silicon nitride, silicon oxide, or aluminum oxide). In some such embodiments, the interposer 150 may be referred to as an "organic interposer." In some embodiments, the insulating material 106 of an interposer 150 may be provided in multiple layers of organic buildup film. Organic interposers 150 may be less expensive to manufacture than semiconductor- or glass-based interposers, and may have electrical performance advantages due to the low dielectric constants of organic insulating materials 106 and the thicker lines that may be used (allowing for improved power delivery, signaling, and potential thermal benefits). Organic interposers 150 may also have larger footprints than can be achieved for semiconductor-based interposers, which are limited by the size of the reticle used for patterning. Further, organic interposers 150 may be subject to less restrictive design rules than those that constrain semiconductor- or glass-based interposers, allowing for the use of design features such as non-Manhattan routing (e.g., not being restricted to using one layer for horizontal interconnects and another layer for vertical interconnects) and the avoidance of through-substrate vias (TSVs) such as through-silicon vias or through-glass vias (which may be limited in the achievable pitch, and may result in less desirable power delivery and signaling performance). Conventional integrated circuit packages including an organic interposer have been limited to solder-based attach technologies, which may have a lower limit on the achievable pitch that precludes the use of conventional solder-based interconnects to achieve the fine pitches desired for next generation devices. Utilizing an organic interposer 150 in a microelectronic assembly 100 with direct bonding, as disclosed herein, may leverage these advantages of organic interposers in combination with the ultra-fine pitch (e.g., the pitch 128 discussed below) achievable by direct bonding (and previously only achievable when using semiconductor-based interposers), and thus may support the design and fabrication of large and sophisticated die complexes that can achieve packaged system competition performance and capabilities not enabled by conventional approaches.

In other embodiments, the insulating material 106 of the interposer 150 may include a fire retardant grade 4 material (FR-4), bismaleimide triazine (BT) resin, or low-k or ultra low-k dielectric (e.g., carbon-doped dielectrics, fluorine-doped dielectrics, and porous dielectrics). When the interposer 150 is formed using standard printed circuit board (PCB) processes, the insulating material 106 may include FR-4, and the conductive pathways 112 in the interposer 150 may be formed by patterned sheets of copper separated by buildup layers of the FR-4. In some such embodiments, the interposer 150 may be referred to as a "package substrate" or a "circuit board."

In some embodiments, one or more of the conductive pathways 112 in the interposer 150 may extend between a conductive contact at the top surface of the interposer 150 (e.g., one of the DB contacts 110) and a conductive contact 118 at the bottom surface of the interposer 150. In some embodiments, one or more of the conductive pathways 112 in the interposer 150 may extend between different conductive contacts at the top surface of the interposer 150 (e.g., between different DB contacts 110 potentially in different DB regions 130, as discussed further below). In some embodiments, one or more of the conductive pathways 112 in the interposer 150 may extend between different conductive contacts 118 at the bottom surface of the interposer 150.

In some embodiments, an interposer 150 may only include conductive pathways 112, and may not contain active or passive circuitry. In other embodiments, an interposer 150 may include active or passive circuitry (e.g., transistors, diodes, resistors, inductors, and capacitors, among others). In some embodiments, an interposer 150 may include one or more device layers including transistors (e.g., as discussed below with reference to FIGS. 31-36).

Although FIGS. 1 and 2 (and others of the accompanying drawings) illustrate a specific number and arrangement of conductive pathways 112 in the interposer 150, these are simply illustrative, and any suitable number and arrangement may be used. The conductive pathways 112 disclosed herein (e.g., including lines 114 and/or vias 116) may be formed of any appropriate conductive material, such as copper, silver, nickel, gold, aluminum, other metals or alloys, or combinations of materials, for example. Examples of some particular arrangements of liner materials 132 that may be part of conductive pathways 112 are discussed below with reference to FIGS. 9-10.

In some embodiments, a microelectronic component 102 may include an IC die (packaged or unpackaged) or a stack of an IC dies (e.g., a high-bandwidth memory dies stack). In some such embodiments, the insulating material of a microelectronic component 102 may include silicon dioxide, silicon nitride, oxynitride, polyimide materials, glass-reinforced epoxy matrix materials, or a low-k or ultra low-k dielectric (e.g., carbon-doped dielectrics, fluorine-doped dielectrics, porous dielectrics, organic polymeric dielectrics, photo-imageable dielectrics, and/or benzocyclobutene-based polymers). In some further embodiments, the insulating material of a microelectronic component 102 may include a semiconductor material, such as silicon, germanium, or a III-V material (e.g., gallium nitride), and one or more additional materials. For example, an insulating material of a microelectronic component 102 may include silicon oxide or silicon nitride. The conductive pathways in a microelectronic component 102 may include conductive lines and/or conductive vias, and may connect any of the conductive contacts in the microelectronic component 102 in any suitable manner (e.g., connecting multiple conductive contacts on a same surface or on different surfaces of the microelectronic component 102). Example structures that may be included in the microelectronic components 102 disclosed herein are discussed below with reference to FIG. 48. In particular, a microelectronic component 102 may include active and/or passive circuitry (e.g., transistors, diodes, resistors, inductors, and capacitors, among others). In some embodiments, a microelectronic component 102 may include one or more device layers including transistors. When a microelectronic component 102 includes active circuitry, power and/or ground signals may be routed through the interposer 150 and to/from a microelectronic component 102 through a DB region 130 (and further through intervening microelectronic components 102) (e.g., as discussed below with reference to FIGS. 31-36). In some embodiments, a microelectronic component 102 may take the form of any of the embodiments of the interposer 150 herein. Although the microelectronic components 102 of the microelectronic assembly 100 of FIG. 1 are single-sided components (in the sense that an individual microelectronic component 102 only has conductive contacts (e.g., DB contacts 110) on a single surface of the individual microelectronic component 102), in some embodiments, a microelectronic component 102 may be a double-sided (or "multi-level," or "omni-directional") component with conductive contacts on multiple surfaces of the component. Some particular examples of double-sided microelectronic components 102 are discussed below with reference to FIGS. 21-23.

Additional components (not shown), such as surface-mount resistors, capacitors, and/or inductors, may be disposed on the top surface or the bottom surface of the interposer 150, or embedded in the interposer 150. The microelectronic assembly 100 of FIG. 1 also includes a support component 182 coupled to the interposer 150. In the particular embodiment of FIG. 1, the support component 182 includes conductive contacts 118 that are electrically coupled to complementary conductive contacts 118 of the interposer 150 by intervening solder 120 (e.g., solder balls in a ball grid array (BGA) arrangement), but any suitable interconnect structures may be used (e.g., pins in a pin grid array arrangement, lands in a land grid array arrangement, pillars, pads and pillars, etc.). The solder 120 utilized in the microelectronic assemblies 100 disclosed herein may include any suitable materials, such as lead/tin, tin/bismuth, eutectic tin/silver, ternary tin/silver/copper, eutectic tin/copper, tin/nickel/copper, tin/bismuth/copper, tin/indium/copper, tin/zinc/indium/bismuth, or other alloys. In some embodiments, the couplings between the interposer 150 and the support component 182 may be referred to as second-level interconnects (SLI) or multi-level interconnects (MLI).

In some embodiments, the support component 182 may be a package substrate (e.g., may be manufactured using PCB processes, as discussed above). In some embodiments, the support component 182 may be a circuit board (e.g., a motherboard), and may have other components attached to it (not shown). The support component 182 may include conductive pathways and other conductive contacts (not shown) for routing power, ground, and signals through the support component 182, as known in the art. In some embodiments, the support component 182 may include another IC package, an interposer, or any other suitable component. An underfill material 138 may be disposed around the solder 120 coupling the interposer 150 to the support component 182. In some embodiments, the underfill material 138 may include an epoxy material.

In some embodiments, the support component 182 may be a lower density component, while the interposer 150 and/or the microelectronic components 102 may be higher density components. As used herein, the term "lower density" and "higher density" are relative terms indicating that the conductive pathways (e.g., including conductive lines and conductive vias) in a lower density component are larger and/or have a greater pitch than the conductive pathways in a higher density component. In some embodiments, a microelectronic component 102 may be a higher density component, and an interposer 150 may be a lower density component. In some embodiments, a higher density component may be manufactured using a dual damascene or single damascene process (e.g., when the higher density component is a die), while a lower density component may be manufactured using a semi-additive or modified semi-additive process (with small vertical interconnect features formed by advanced laser or lithography processes) (e.g., when the lower density component is a package substrate or an interposer). In some other embodiments, a higher density component may be manufactured using a semi-additive or modified semi-additive process (e.g., when the higher density component is a package substrate or an interposer), while a lower density component may be manufactured using a semi-additive or a subtractive process (using etch chemistry to remove areas of unwanted metal, and with coarse vertical interconnect features formed by a standard laser process) (e.g., when the lower density component is a PCB).

The microelectronic assembly 100 of FIG. 1 may also include a mold material 126. The mold material 126 may extend around one or more of the microelectronic components 102 on the interposer 150. In some embodiments, the mold material 126 may extend between multiple microelectronic components 102 on the interposer 150 and around the DB regions 130. In some embodiments, the mold material 126 may extend above one or more of the microelectronic components 102 on an interposer 150 (not shown). The mold material 126 may be an insulating material, such as an appropriate epoxy material. The mold material 126 may be selected to have a coefficient of thermal expansion (CTE) that may mitigate or minimize the stress between the microelectronic components 102 and the interposer 150 arising from uneven thermal expansion in the microelectronic assembly 100. In some embodiments, the CTE of the mold material 126 may have a value that is intermediate to the CTE of the interposer 150 (e.g., the CTE of the insulating material 106 of the interposer 150) and a CTE of the microelectronic components 102. In some embodiments, the mold material 126 used in a microelectronic assembly 100 may be selected at least in part for its thermal properties. For example, one or more mold materials 126 used in a microelectronic assembly 100 may have low thermal conductivity (e.g., conventional mold compounds) to retard heat transfer, or may have high thermal conductivity (e.g., mold materials including metal or ceramic particles with high thermal conductivity, such as copper, silver, diamond, silicon carbide, aluminum nitride, and boron nitride, among others) to facilitate heat transfer. Any of the mold materials 126 referred to herein may include one or more different materials with different material compositions.

The microelectronic assembly 100 of FIG. 1 may also include a TIM 154. The TIM 154 may include a thermally conductive material (e.g., metal particles) in a polymer or other binder. The TIM 154 may be a thermal interface material paste or a thermally conductive epoxy (which may be a fluid when applied and may harden upon curing, as known in the art). The TIM 154 may provide a path for heat generated by the microelectronic components 102 to readily flow to the heat transfer structure 152, where it may be spread and/or dissipated. Some embodiments of the microelectronic assembly 100 of FIG. 1 may include a sputtered metallization (not shown) across the top surfaces of the mold material 126 and the microelectronic components 102; the TIM 154 (e.g., a solder TIM) may be disposed on this metallization.

The microelectronic assembly 100 of FIG. 1 may also include a heat transfer structure 152. The heat transfer structure 152 may be used to move heat away from one or more of the microelectronic components 102 (e.g., so that the heat may be more readily dissipated). The heat transfer structure 152 may include any suitable thermally conductive material (e.g., metal, appropriate ceramics, etc.), and may include any suitable features (e.g., a heat spreader, a heat sink including fins, a cold plate, etc.). In some embodiments, a heat transfer structure 152 may be or may include an integrated heat spreader (IHS).

The elements of a microelectronic assembly 100 may have any suitable dimensions. Only a subset of the accompanying drawings are labeled with reference numerals representing dimensions, but this is simply for clarity of illustration, and any of the microelectronic assemblies 100 disclosed herein may have components having the dimensions discussed herein. In some embodiments, the thickness 184 of the interposer 150 may be between 20 microns and 200 microns. In some embodiments, the thickness 188 of a DB region 130 may be between 50 nanometers and 5 microns. In some embodiments, a thickness 190 of a microelectronic component 102 may be between 5 microns and 800 microns. In some embodiments, a pitch 128 of the DB contacts 110 in a DB region 130 may be less than 20 microns (e.g., between 0.1 microns and 20 microns).

Figure 9:
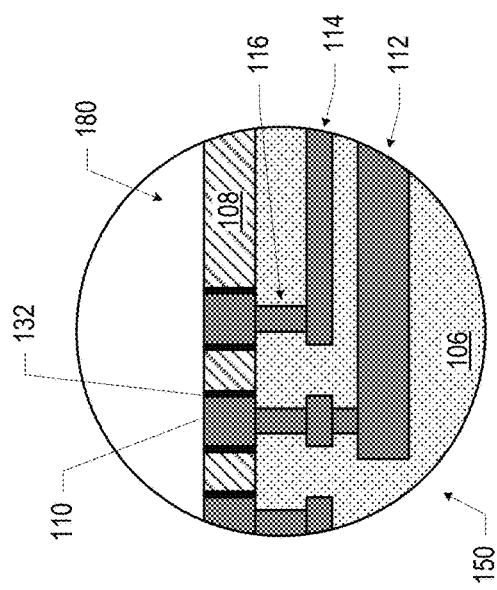
FIGS. 9-12 are side, cross-sectional views of example direct bonding interfaces of a microelectronic component, in accordance with various embodiments.

FIGS. 3-46 illustrate additional example microelectronic assemblies 100 and components thereof. Any of the features discussed with reference to any of FIGS. 3-46 herein may be combined with any other features to form a microelectronic assembly 100 or component thereof. For example, as discussed further below, FIG. 4 illustrates an embodiment of a DB interface 180 in which a DB contact 110 includes multiple different material portions, and FIG. 9 illustrates an embodiment of a DB interface 180 in which a liner material 132 is present between a DB contact 110 and the adjacent DB dielectric 108. These features of FIGS. 4 and 9 may be combined so that a DB interface 180, in accordance with the present disclosure, has DB contacts 110 with multiple different material portions and a liner material 132 between DB contacts 110 and adjacent DB dielectric 108. This particular combination is simply an example, and any combination may be used.

As noted above, a DB dielectric 108 may include one or more materials arranged in any desired manner. For example, FIG. 3 illustrates a DB interface 180 (which may be part of an interposer 150 or a microelectronic component 102) that includes DB dielectric 108 around DB contacts 110. In the particular embodiment of FIG. 3, the DB dielectric 108 may include a first portion 108A and a second portion 108B, with the second portion 108B between the first portion 108A and the bonding surface of the DB interface 180. The first portion 108A and the second portion 108B may have different material compositions. For example, in some embodiments, the first portion 108A may include silicon and oxygen (e.g., in the form of silicon oxide), and the second portion 108B may include silicon, oxygen, carbon, and nitrogen (e.g., in the form of silicon oxycarbonitride). The thickness 190A of the first portion 108A may be greater than the thickness 190B of the second portion 108B. For example, in some embodiments, the thickness 190B may be less than 5 nanometers (e.g., less than 3 nanometers), while the thickness 190A may be greater than 5 nanometers (e.g., between 50 nanometers and 5 microns). When the thickness 190A is greater than the thickness 190B, the first portion 108A may be referred to as a "bulk" material and the second portion 108B may be referred to as an "interface" material of the DB dielectric 108. Although FIG. 3 illustrates an embodiment in which the DB dielectric 108 includes two portions, a DB dielectric 108 may include more than two portions (e.g., arranged in layers parallel to the bonding surface of the DB interface 180).

As also noted above, a DB contact 110 may include one or more materials arranged in any desired manner. For example, FIG. 4 illustrates a DB interface 180 (which may be part of an interposer 150 or a microelectronic component 102) that includes DB dielectric 108 around DB contacts 110. In the particular embodiment of FIG. 4, the DB contacts 110 may include a first portion 110A and a second portion 110B, with the second portion 110B between the first portion 110A and the bonding surface of the DB interface 180. The first portion 110A and the second portion 110B may have different material compositions. For example, in some embodiments, the first portion 110A may include copper, and the second portion 110B may include a noble metal (e.g., silver or gold); in such embodiments, the second portion 110B may serve to improve the resistance of the DB contacts 110 to corrosion. The thickness 192A of the first portion 110A may be greater than the thickness 192B of the second portion 110B. For example, in some embodiments, the thickness 192B may be less than 5 nanometers, while the thickness 192A may be greater than 50 nanometers. When the thickness 192A is greater than the thickness 192B, the first portion 110A may be referred to as a "bulk" material and the second portion 110B may be referred to as an "interface" material of the DB contacts 110. Although FIG. 4 illustrates an embodiment in which the DB contacts 110 include two portions, a DB contact 110 may include more than two portions (e.g., arranged in layers parallel to the bonding surface of the DB interface 180). In some embodiments, a DB interface 180 may include a DB dielectric 108 with multiple portions and a DB contact 110 with multiple portions.

The footprints of the DB contacts 110 in a DB interface 180 may have any desired shape, and multiple DB contacts 110 may be arranged within a DB interface 180 in any desired manner (e.g., by the use of lithographic patterning techniques to form the DB contacts 110). For example, FIGS. 5-8 are top views of various arrangements of DB contacts 110 in a DB dielectric 108 of a DB interface 180. In the embodiment of FIG. 5, the DB contacts 110 have rectangular (e.g., square) footprints and are arranged in a rectangular array. In the embodiment of FIG. 6, the DB contacts 110 have cross-shaped footprints and are arranged in a triangular array. In the embodiment of FIG. 7, the DB contacts 110 are arranged in a rectangular array, and alternating rows of the DB contacts 110 have cross-shaped footprints and triangular footprints. In the embodiment of FIG. 8, the DB contacts 110 are arranged in a rectangular array, the DB contacts 110 have circular footprints, and the diameters of the footprints of the DB contacts 110 vary in a checkerboard pattern. DB contacts 110 included in a DB interface 180 may have any suitable combination of these and other footprint shapes, sizes, and arrangements (e.g., hexagonal arrays, oval footprints, etc.). In some particular embodiments, DB contacts 110 in a DB interface 180 may have footprints shaped as convex polygons (e.g., squares, rectangles, octagons, cross shapes, etc.) or circles.

Figure 10:
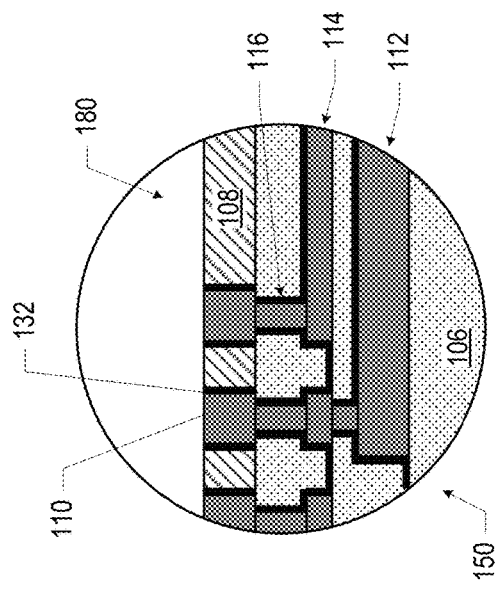

As noted above, in some embodiments, a liner material may be present between a DB contact 110 and the adjacent DB dielectric 108. For example, FIG. 9 illustrates a portion of an interposer 150 and its DB interface 180. In the embodiment of FIG. 9, a liner material 132 is present between the DB contacts 110 and the adjacent DB dielectric 108. The liner material 132 may serve as a diffusion barrier (e.g., to limit diffusion between the DB contacts 110 and the adjacent DB dielectric 108, such as the copper diffusion that may occur when the DB contacts 110 include copper and the DB dielectric 108 includes silicon oxide) and/or as an adhesion promoter (e.g., to improve the strength of the mechanical interface between the DB contacts 110 and the adjacent DB dielectric 108). In the particular embodiment of FIG. 9, the liner material 132 may not be present around the vias 116 and/or the lines 114 through the insulating material 106 of the interposer 150. In other embodiments, the liner material 132 may also be present around the vias 116 and/or the lines 114; such an embodiment is illustrated in FIG. 10. In some embodiments, a liner material 132 may only be present around the vias 116 and/or the lines 114, but not around the DB contacts 110 (not shown). In the embodiment of FIG. 9, the liner material 132 may be a conductive material (e.g., may include cobalt, ruthenium, or tantalum and nitrogen (e.g., in the form of tantalum nitride)), or a non-conductive material (e.g., silicon and nitrogen (e.g., in the form of silicon nitride), or diamond-like carbon). In the embodiment of FIG. 10, the liner material 132 may be a non-conductive material. In still other embodiments, no liner material 132 may be present in an interposer 150. Although various embodiments of the use of liner material 132 are depicted in FIGS. 9 and 10 and discussed with respect to their presence in an interposer 150, this is simply for ease of illustration, and DB interfaces 180 of microelectronic components 102 may also include liner materials 132 (e.g., only around the DB contacts 110, and/or around lines and vias in a metallization stack of the microelectronic component 102).

Figure 11:
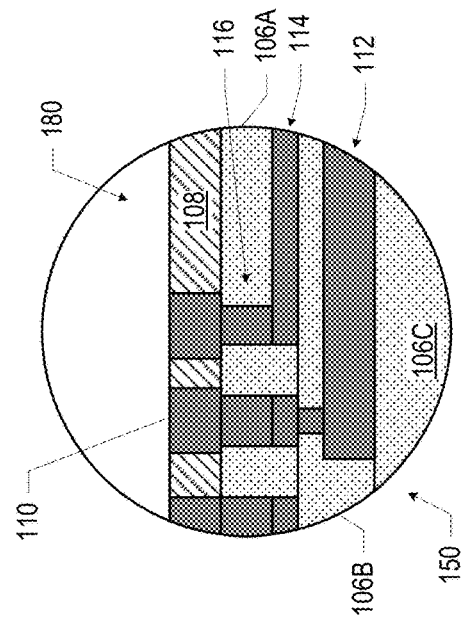

In some embodiments, lithographic via techniques may be used to form one or more layers of metallization in an interposer 150 (e.g., in an organic interposer 150) or a microelectronic component 102. For example, FIG. 11 illustrates a portion of an interposer 150 and its DB interface 180. In the embodiment of FIG. 11, three different layers of insulating material 106 are shown (labeled as 106A, 106B, and 106C). Within the "top" layer 106A (the layer closest to the DB interface 180), vias 116 may be patterned using lithographic techniques (e.g., "zero-misalignment" techniques) so that their side faces are aligned with side faces of the lines 114 on which they land. In "lower" layers (e.g., the layer 106B), vias 116 may be patterned using conventional techniques and the side faces of the vias 116 may not align with side faces of the lines 114 on which they land. More generally, a via 116 formed lithographically may have any desired footprint (e.g., a non-circular footprint). In the embodiment of FIG. 11, the DB contacts 110 may be "pads" in conductive contact with the vias 116 of the layer 106A. The use of lithographic via techniques in the formation of the DB interface 180 may result in an extremely flat DB interface 180 due to the planarization (e.g., chemical mechanical polishing) operations performed during lithographic via fabrication, and flat DB interfaces 180 may more reliably form direct bonds than more "uneven" DB interfaces 180. Thus, the use of lithographic via techniques to form the DB contacts 110 of a DB interface 180 may support a mechanically and electrically reliable DB region 130.

Figure 12:
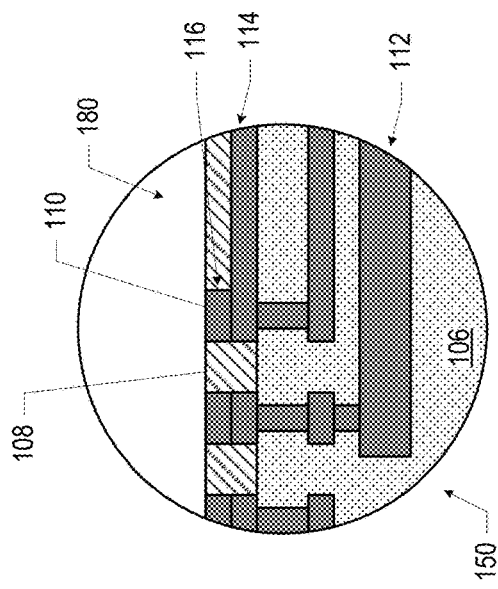

In some embodiments, lithographic via techniques to be used to form the DB contacts 110 in a DB interface 180 of an interposer 150 (e.g., in an organic interposer 150) or a microelectronic component 102. For example, FIG. 12 illustrates a portion of an interposer 150 and its DB interface 180. In the embodiment of FIG. 12, a DB contact 110 includes a via 116 and a line 114 on which the via 116 lands; these vias 116 may be patterned using lithographic techniques (e.g., so that the side faces of the vias 116 are aligned with side faces of the lines 114 on which they land). The DB dielectric 108 may contact the vias 116 and lines 114 of the DB contacts 110, as shown. Metallization in the insulating material 106 may be patterned using lithographic techniques or conventional techniques. Although various embodiments of vias 116/lines 114 are depicted in FIGS. 11 and 12 and discussed with respect to their presence in an interposer 150, this is simply for ease of illustration, and DB interfaces 180 of microelectronic components 102 may also include lithographically patterned vias 116/lines 114 in the DB interfaces 180 and/or the other metallization.

Figure 13:
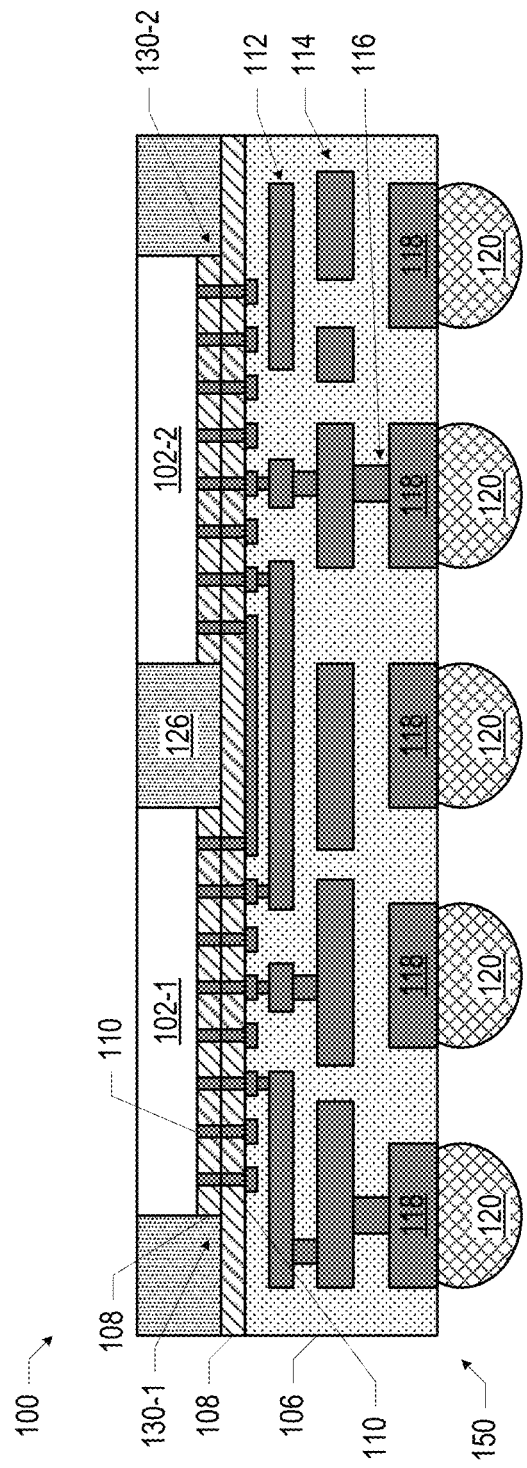
FIG. 13 is a side, cross-sectional view of an example microelectronic assembly including direct bonding, in accordance with various embodiments.

In the embodiment of FIGS. 1 and 2, the DB contacts 110 are shown as pads in contact with vias 116 in the underlying insulating material 106. In other embodiments, the DB contacts 110 may be vias themselves. For example, FIG. 13 illustrates an embodiment in which the DB contacts 110 are vias in contact with pads in the insulating material 106; as shown, the DB contacts 110 may be narrower than the pads with which they are in contact.

The microelectronic assembly 100 of FIGS. 1 and 2, and others of the microelectronic assemblies 100 disclosed herein, may be manufactured in any suitable manner. For example, FIGS. 14-17 are side, cross-sectional views of example stages in the manufacture of a portion of the microelectronic assembly 100 of FIGS. 1 and 2, in accordance with various embodiments. Although the operations discussed with reference to FIGS. 14-17 may be illustrated with reference to particular embodiments of the microelectronic assemblies 100 disclosed herein, the manufacturing methods discussed with reference to FIGS. 14-17 may be used to form any suitable microelectronic assemblies 100. Operations are illustrated once each and in a particular order in FIGS. 14-17, but the operations may be reordered and/or repeated as desired (e.g., with different operations performed in parallel when manufacturing multiple microelectronic assemblies 100 simultaneously). The manufacturing processes discussed below with reference to FIGS. 14-17 may be particularly advantageous when the interposer 150 is an organic interposer, and may also be advantageous for glass-based or semiconductor-based interposers (e.g., glass-based or silicon-based interposers in which the underlying glass or silicon wafer has already been thinned, and TSVs formed, before any direct bonding operations). However, any suitable manufacturing processes may be used to manufacture any of the microelectronic assemblies 100 disclosed herein.

Figure 14:
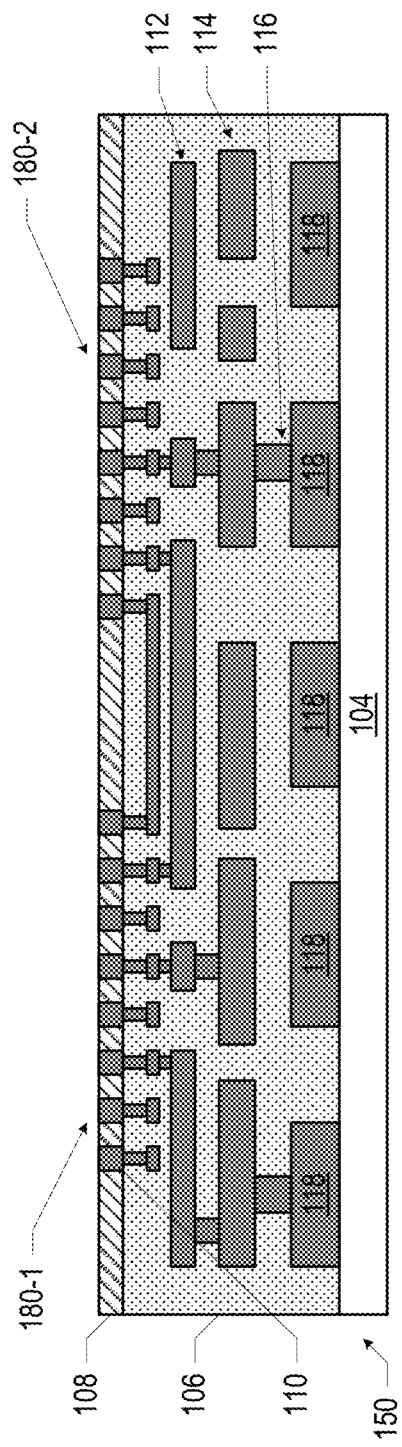
FIGS. 14-17 are side, cross-sectional views of example stages in the manufacture of a portion of the microelectronic assembly of FIGS. 1 and 2, in accordance with various embodiments.

FIG. 14 illustrates an assembly including an interposer 150 mounted on a carrier 104. The interposer 150 includes two exposed DB interfaces 180-1 and 180-2. The carrier 104 may include any suitable material, and in some embodiments, may include a semiconductor wafer (e.g., a silicon wafer) or glass (e.g., a glass panel). When the interposer 150 is an organic interposer, the interposer 150 may be advantageously manufactured on the carrier 104, which may provide a mechanically stable surface on which the layers of the interposer 150 may be formed.

Figure 15:
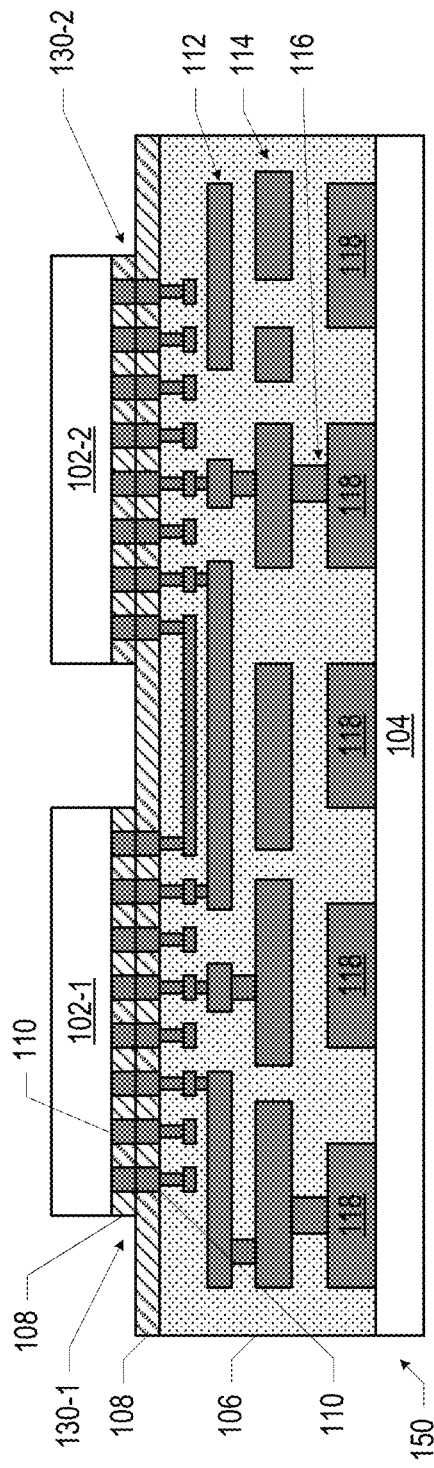

FIG. 15 illustrates an assembly subsequent to direct bonding microelectronic components 102-1 and 102-2 to the interposer 150/carrier 104 of FIG. 14. In particular, DB interfaces 180 (not labeled) of the microelectronic components 102 may be brought into contact with the DB interfaces 180 of the interposer 150, and heat and/or pressure to be applied to bond the contacting DB interfaces 180 to form DB regions 130 (with DB regions 130-1 and 130-2 corresponding to the DB interfaces 180-1 and 180-2, respectively).

Figure 16:
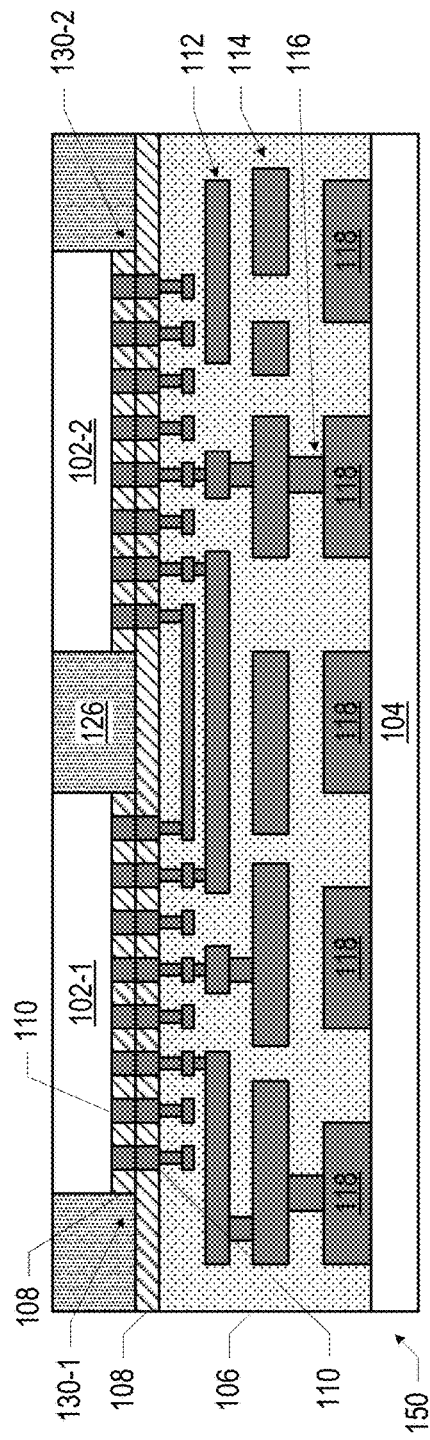

FIG. 16 illustrates an assembly subsequent to providing a mold material 126 around the microelectronic components 102 and on the surface of the interposer 150 of the assembly of FIG. 15. In some embodiments, the mold material 126 may extend above and remain above the microelectronic components 102, while in other embodiments, the mold material 126 may be polished back to expose the top surfaces of the microelectronic components 102, as shown.

Figure 17:
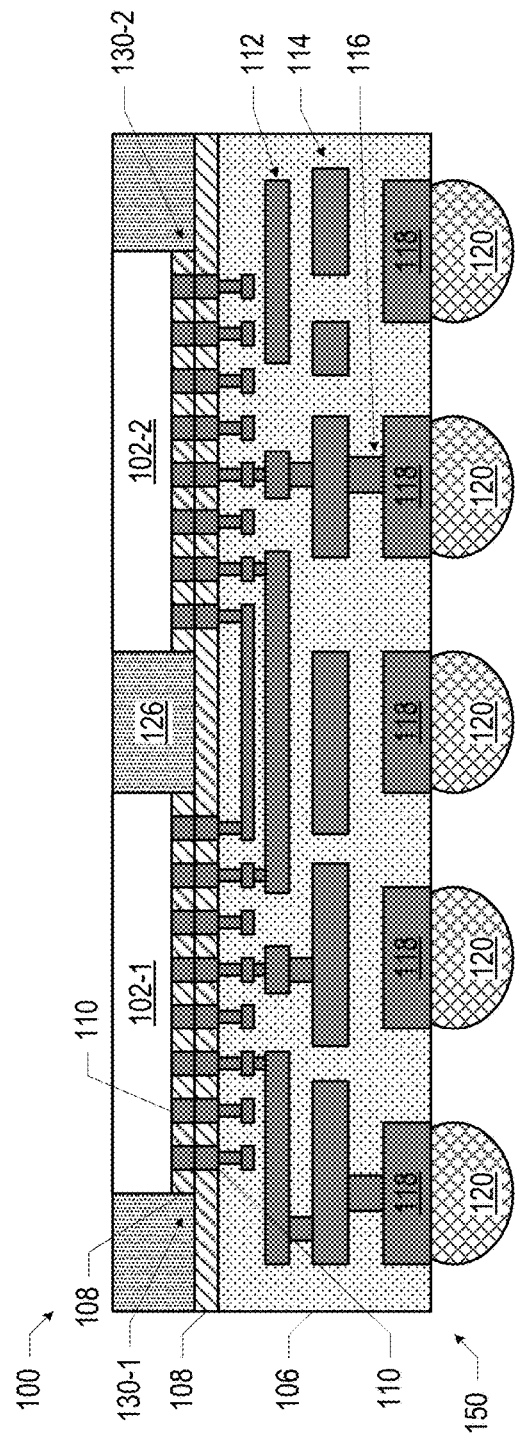

FIG. 17 illustrates an assembly subsequent to removing the carrier 104 from the assembly of FIG. 16, and providing solder 120 on the newly exposed conductive contacts 118. The assembly of FIG. 17 may itself be a microelectronic assembly 100, as shown. Further manufacturing operations may be performed on the microelectronic assembly 100 of FIG. 17 to form other microelectronic assemblies 100; for example, the solder 120 may be used to couple the microelectronic assembly 100 of FIG. 17 to a support component 182, and a TIM 154 and heat transfer structure 152 may be provided on the top surface of the microelectronic assembly 100 of FIG. 17, forming the microelectronic assembly 100 of FIGS. 1 and 2.

Figure 18:
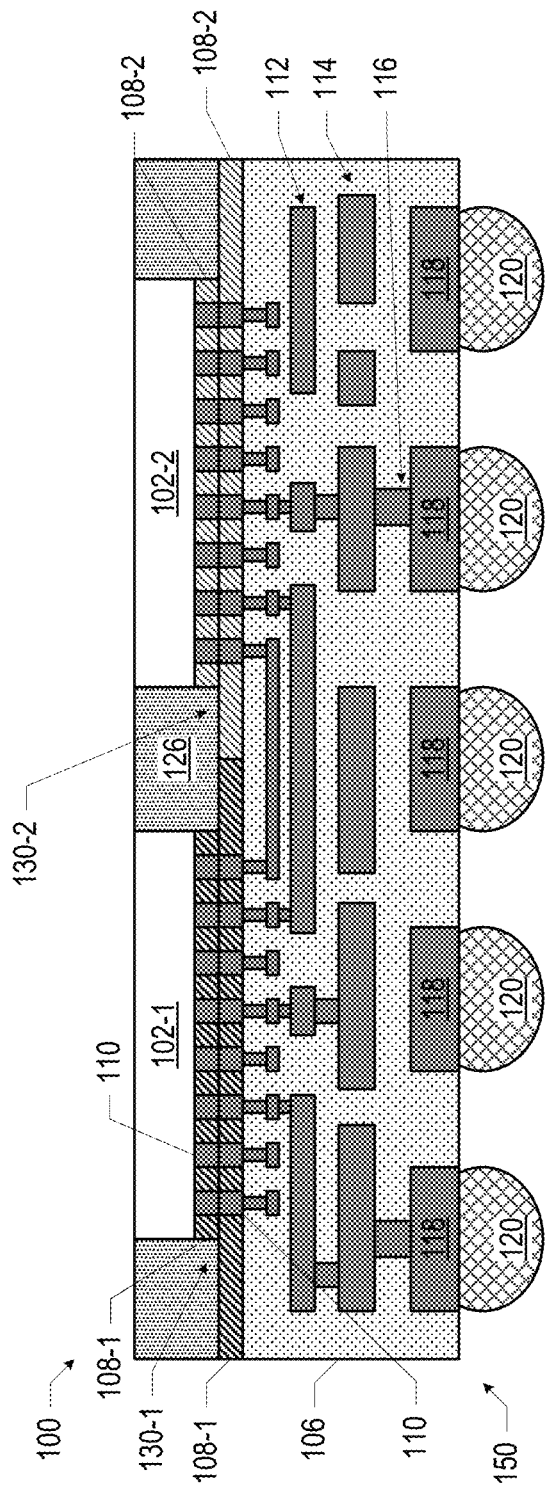
FIGS. 18-20, 21A-21B, and 22-30 are side, cross-sectional views of example microelectronic assemblies including direct bonding, in accordance with various embodiments.

Different DB regions 130 in a microelectronic assembly 100 may include different DB dielectrics 108. For example, FIG. 18 illustrates a microelectronic assembly 100 in which a DB region 130-1 includes a DB dielectric 108-1 and a DB region 130-2 includes a different DB dielectric 108-2. The DB dielectrics 108-1 and 108-2 may differ in their material composition and/or their structure. In some embodiments, DB dielectrics 108 in different DB regions 130 may be selected to have different thermal conductivities so as to facilitate and/or limit heat transfer between the interposer 150 and the microelectronic components 102. For example, the DB dielectric 108-1 may have a higher thermal conductivity than the DB dielectric 108-2, resulting in greater heat transfer between the microelectronic component 102-1 and the interposer 150 than between the microelectronic component 102-2 and the interposer 150. In some such embodiments, the DB dielectric 108-1 may include silicon and nitrogen (e.g., in the form of silicon nitride) and the DB dielectric 108-2 may include silicon and oxygen (e.g., in the form of silicon oxide); silicon nitride may have a higher thermal conductivity than silicon oxide, and thus the use of silicon nitride as the DB dielectric 108-1 may enhance local heat transfer from the microelectronic component 102-1 to the interposer 150, while the use of silicon oxide as the DB dielectric 108-2 may mitigate thermal cross-talk through the interposer 150 between the microelectronic component 102-1 and the microelectronic component 102-2.

Figure 19:
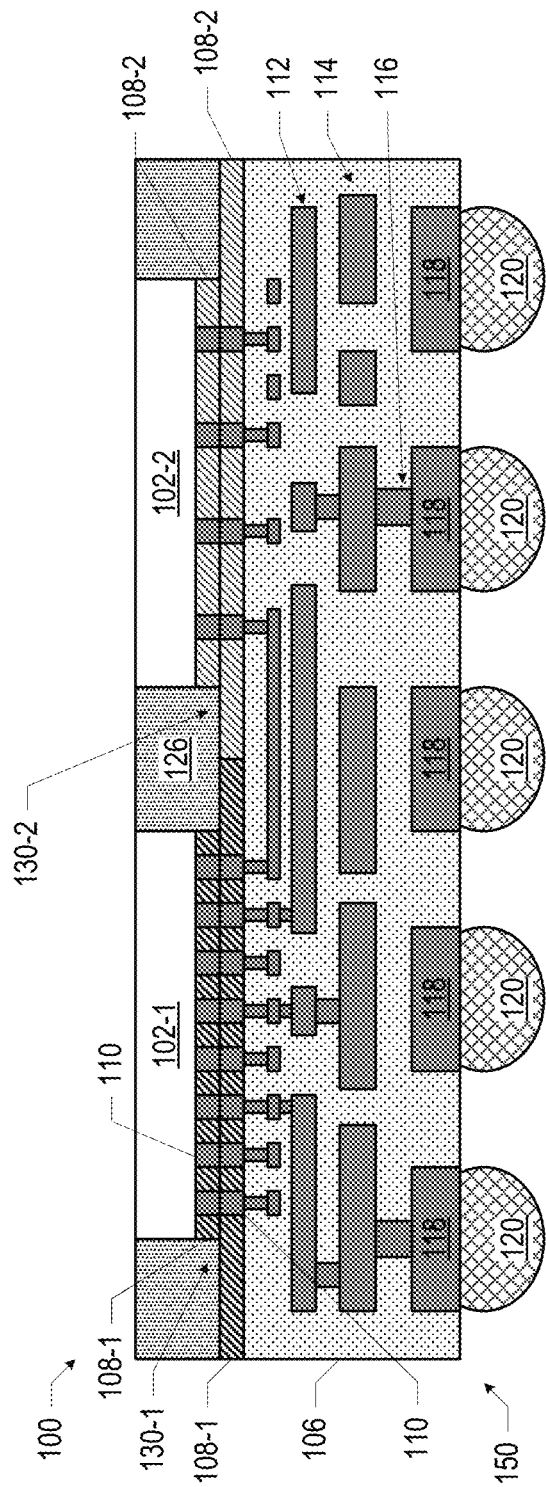

In some embodiments, the density of the DB contacts 110 (i.e., the proportion of the area of a bonding surface of a DB interface 180 occupied by DB contacts 110) may differ between different DB regions 130. In some embodiments, this differing density may be due to one DB region 130 requiring fewer electrical pathways than another DB region 130. In other embodiments, this differing density may be used to enhance or suppress heat transfer, with greater density of DB contacts 110 (and therefore a higher proportion of thermally conductive metal) being used to enhance heat transfer and lesser density of DB contacts 110 (and therefore a lower portion of thermally conductive metal) being used to suppress heat transfer. For example, FIG. 19 illustrates an embodiment in which the density of DB contacts 110 is greater in the DB region 130-1 than in the DB region 130-2 to enhance heat transfer between the microelectronic component 102-1 and the interposer 150 and to reduce heat transfer between the microelectronic component 102-2 and the interposer 150. FIG. 19 illustrates different densities of DB contacts 110 being accompanied by the use of different DB dielectrics 108 in different DB regions 130, but in some embodiments, two DB regions 130 may have different densities of DB contacts 110 while having DB dielectrics 108 with the same material composition.

Figure 20:
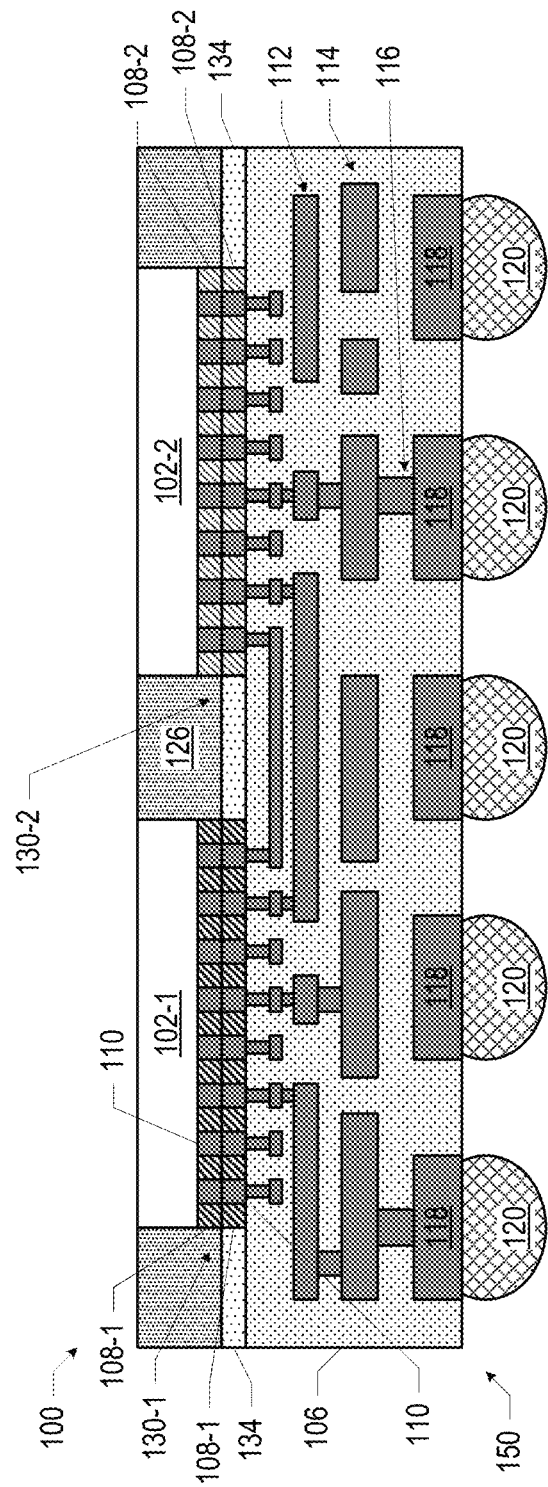

In the embodiment of FIGS. 1 and 2, the DB dielectric 108 extends outside of the DB regions 130, covering the remainder of the top surface of the interposer 150. In other embodiments, a different material may be disposed at the top surface of the interposer 150 outside of the DB regions 130. For example, FIG. 20 illustrates a microelectronic assembly 100 in which a material 134, different from the DB dielectrics 108-1 and 108-2, is disposed at the top surface of the interposer 150 (e.g., in contact with the mold material 126). In some embodiments, the material 134 may include one or more dielectric materials, such as one or more organic or inorganic dielectric materials. For example, the material 134 may include an inorganic dielectric material that includes silicon and nitrogen (e.g., in the form of silicon nitride); silicon and oxygen (e.g., in the form of silicon oxide); or silicon, carbon, and nitrogen (e.g., in the form of silicon carbonitride); or the material 134 may include an organic dielectric material, such as a particle-filled epoxide, a polyimide, a particle-filled polyimide, or polybenzoxazole. In some embodiments, the material 134 may be a dielectric material, and an additional conductive material (e.g., a metal such as aluminum or copper) may be disposed on the material 134; examples of such embodiments are discussed below with reference to FIGS. 44-46.

Figure 21A:
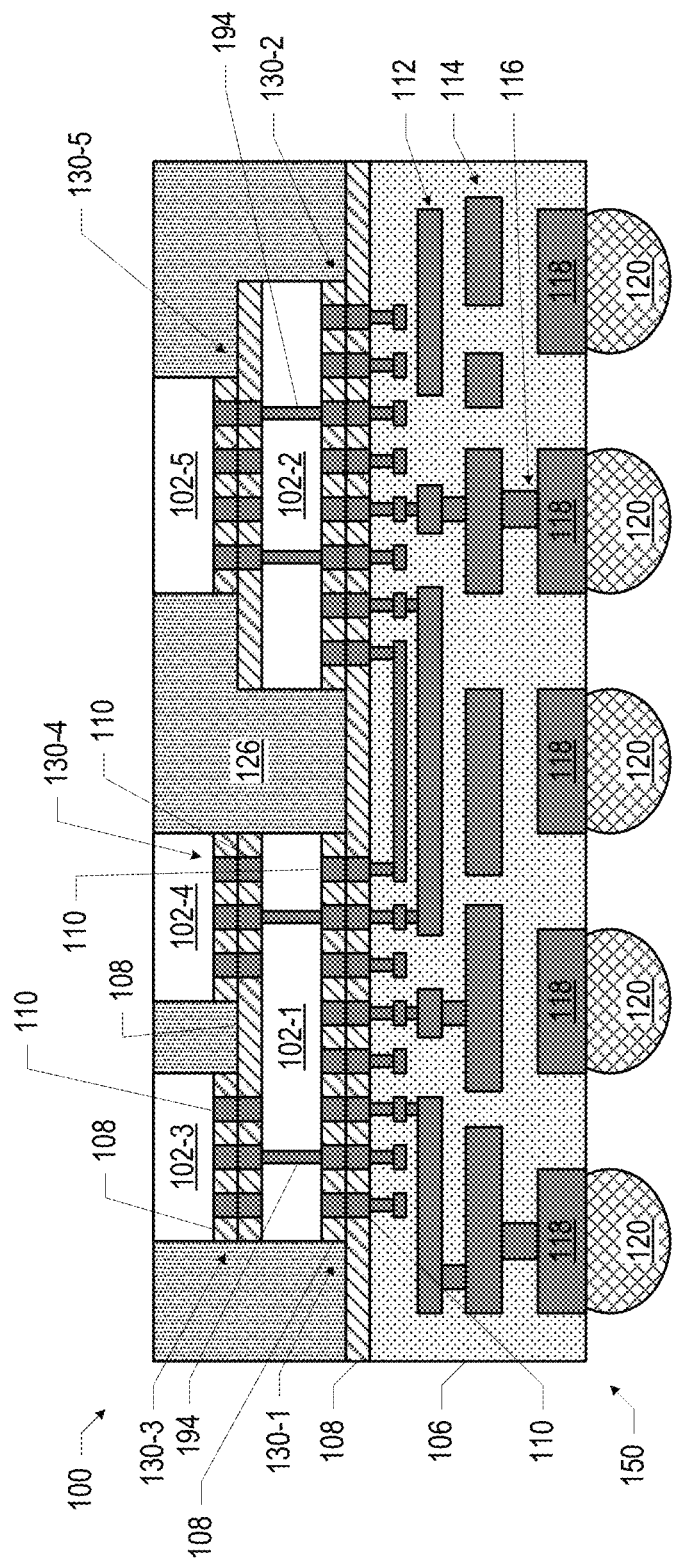
Figure 21B:
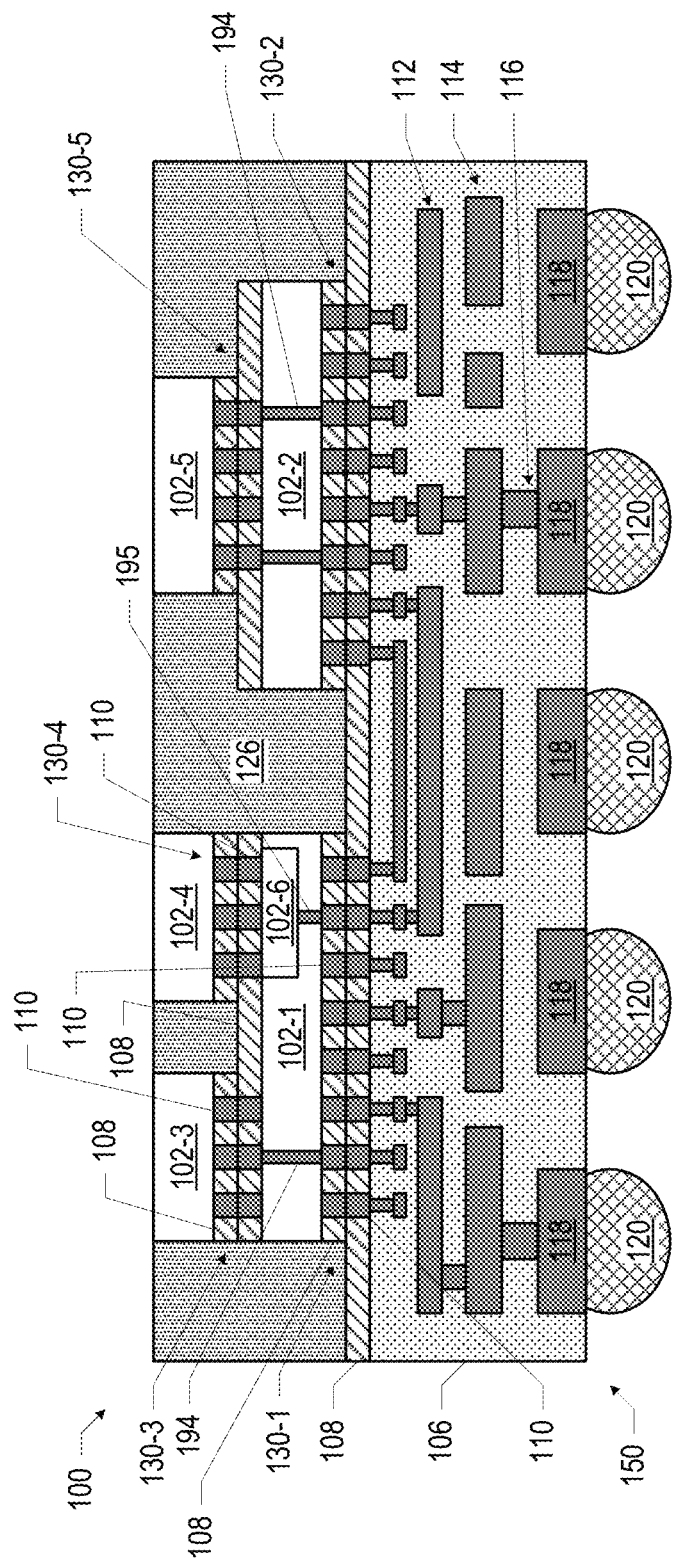

A microelectronic assembly 100 may include multiple "tiers" of microelectronic components 102 coupled by direct bonding. For example, FIGS. 21A and 21B illustrate microelectronic assemblies 100 in which a microelectronic component 102-1 includes two DB interfaces 180 (not labeled) at its top surface, and microelectronic components 102-3 and 102-4 with their own DB interfaces 180 (not labeled) at the bottom surfaces are coupled to the microelectronic component 102-1 via DB regions 130-3 and 130-4, respectively. Similarly, the microelectronic component 102-2 includes a DB interface 180 (not labeled) at its top surface, and a microelectronic component 102-5 with its own DB interface 180 (not labeled) at its bottom surface is coupled to the microelectronic component 102-2 via a DB region 130-5. The microelectronic assemblies 100 of FIG. 21 may thus be described as having two tiers of direct bonded microelectronic components 102. The microelectronic assemblies 100 of FIGS. 21A and 21B share many features, and FIG. 21B illustrates a particular embodiment in which the microelectronic component 102-1 includes an embedded microelectronic component 102-6 (e.g., an embedded die), and the DB region 130-4 is at the top face of the embedded microelectronic component 102-6. In some embodiments, the embedded microelectronic component 102-6 may be a higher density component and the microelectronic component 102-1 may be a lower density component. The microelectronic component 102-1 may include one or more conductive structures 195 that conductively couple contacts (not shown) at the bottom surface of the embedded microelectronic component 102-6 to the DB contacts 110 at the bottom surface of the microelectronic component 102-1. More generally, any microelectronic component 102 disclosed herein may include one or more dies and may have different types of pass-through conductive interconnects, such as copper pillars and TSVs (e.g., through-silicon vias).

In some embodiments, the microelectronic components 102-1 and 102-2 in the first tier of the microelectronic assembly 100 of FIG. 21 may include conductive structures 194 that extend between the DB regions 130 at their top and bottom surfaces, providing conductive pathways for power, ground, and/or signals to the microelectronic components 102 in the second tier (i.e., the microelectronic components 102-3, 102-4, and 102-5). In some embodiments, such a conductive structure 194 may include one or more TSVs, including a conductive material via, such as a metal via, isolated from the surrounding silicon or other semiconductor material by a barrier oxide), such as through-silicon vias when the microelectronic components 102-1 and 102-2 include silicon substrates or through-glass vias when the microelectronic components 102-1 and 102-2 include glass substrates. In some embodiments, the microelectronic components 102-1 and 102-2 in a first tier may be passive (e.g., including no transistors) or active (e.g., including transistors in the form of memory circuitry and/or power delivery circuitry).

In the embodiment of FIG. 21, a mold material 126 may extend up to and may laterally surround the microelectronic components 102 in the second tier, and in some embodiments (not shown), the mold material 126 may cover the top surfaces of the microelectronic components 102 in the second tier. As shown in FIG. 21, in some embodiments, the top surface of the mold material 126 may be coplanar with the exposed DB interfaces 180. In some embodiments, a microelectronic assembly 100 including exposed DB interfaces 180 may have a temporary, removable protective material (e.g., an adhesive material, not shown) on the exposed DB interfaces 180 to protect them until direct bonding operations are performed. Microelectronic assemblies 100 including multiple tiers of microelectronic components 102 may be formed in a manner discussed above with reference to FIGS. 14-17, with the additional tiers of microelectronic components 102 coupled to the preceding assemblies prior to deposition of the mold material 126. In some other embodiments, a microelectronic assembly 100 including multiple tiers of microelectronic components 102 may be formed by first assembling the tiers of microelectronic components 102, and then coupling the assembled tiers to an interposer 150 as discussed above with reference to FIG. 15. A microelectronic assembly 100 may not be limited to two tiers of microelectronic components 102, but may include three or more tiers, as desired. Further, although the microelectronic components 102 in an individual tier in FIG. 21 are depicted as having a same height, this is simply for ease of illustration, and microelectronic components 102 in any individual tier in a microelectronic assembly 100 may have different heights. Further, not every microelectronic component 102 in a microelectronic assembly 100 may be part of a stack of multiple microelectronic components 102; for example, in some variants of the microelectronic assembly 100 of FIG. 21, no microelectronic component 102-5 may be present on top of the microelectronic component 102-2 (and thus the microelectronic component 102-2 may not include conductive structures 194 (e.g., may not include TSVs)).

Figure 22:
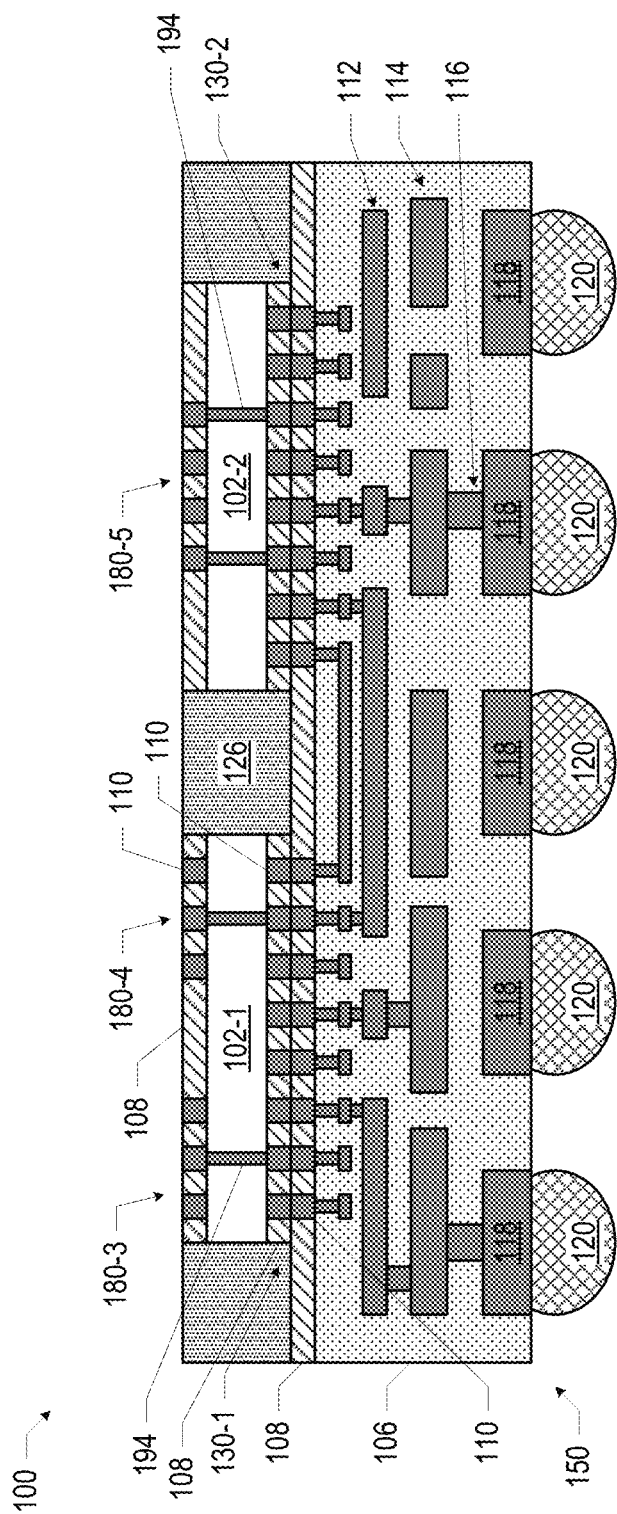
Figure 23:
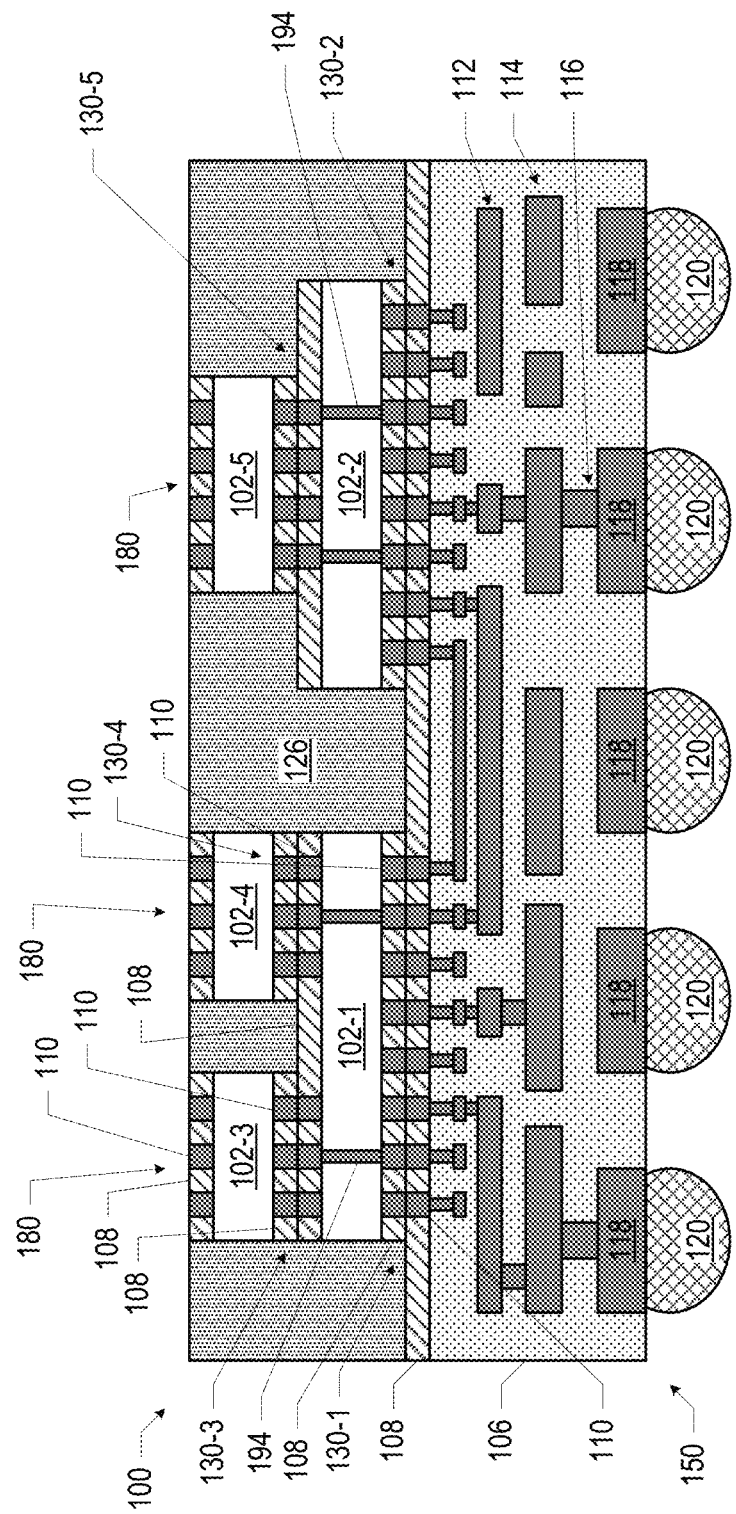

In some embodiments, a microelectronic assembly 100 may include one or more DB interfaces 180 exposed at a surface of the microelectronic assembly 100. For example, FIG. 22 illustrates a microelectronic assembly 100 similar to that of FIG. 21, but in which the second tier of microelectronic components 102 is not present and the corresponding DB interfaces 180 (i.e., the DB interfaces 180-3, 180-4, and 180-5) are exposed at the top surfaces of the microelectronic components 102-1 and 102-2. Such a microelectronic assembly 100 may be useful when a customer or other entity wishes to couple, via direct bonding, their own additional microelectronic components 102 (e.g., the microelectronic components 102-3, 102-4, and 102-5 of FIG. 21) to the top surfaces of the microelectronic assembly 100 of FIG. 22 via the exposed DB interfaces 180. FIG. 22 illustrates a particular embodiment in which DB interfaces 180 are exposed at top surfaces of a first tier of microelectronic components 102, but a microelectronic assembly 100 may include more than one tier of microelectronic components 102 with DB interfaces 180 exposed at top surfaces of microelectronic components 102 in a second (or higher) tier. For example, FIG. 23 illustrates a microelectronic assembly 100 similar to that of FIG. 21, but in which the microelectronic components 102-3, 102-4, and 102-5 have DB interfaces 180 that are exposed at the top surface of the microelectronic assembly 100. As shown in FIG. 23, in some embodiments, the top surface of the mold material 126 may be coplanar with the exposed DB interfaces 180.

Figure 24:
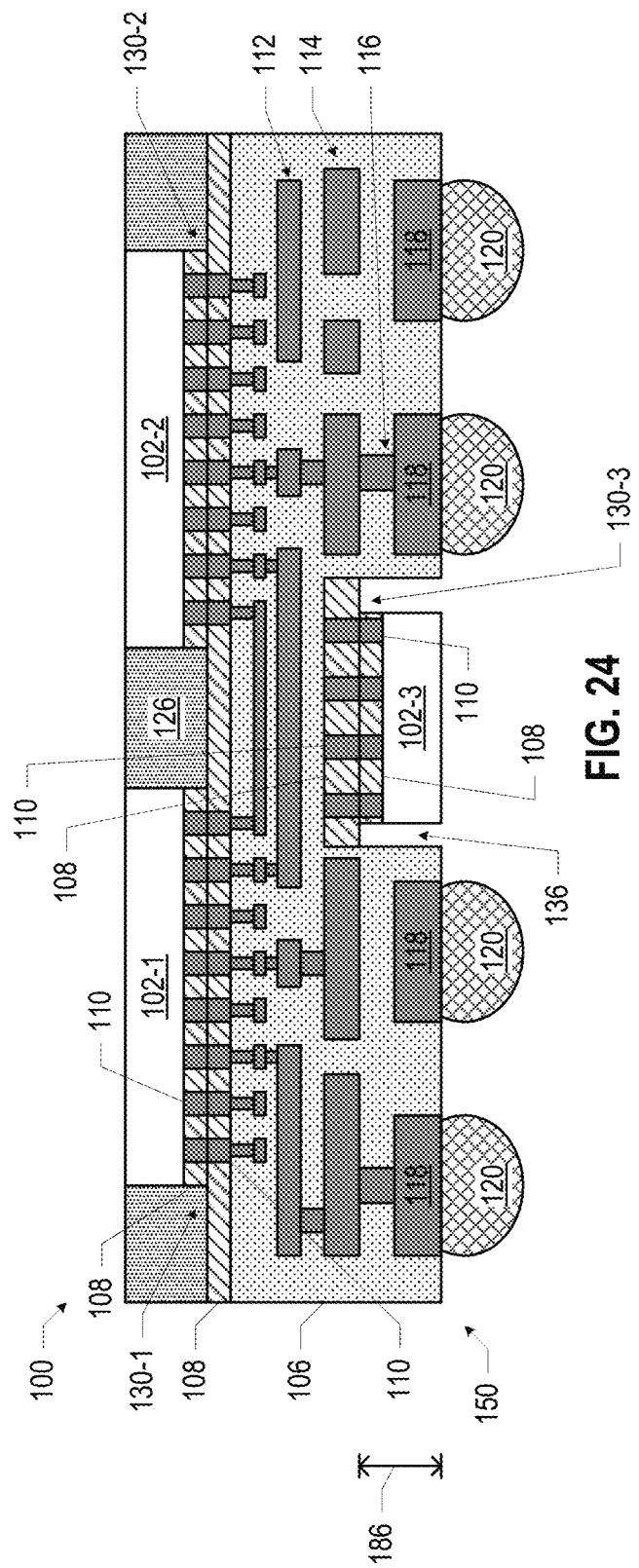

Although various ones of the preceding drawings illustrate DB regions 130 at a single surface of the interposer 150 (e.g., the top surface), a microelectronic assembly 100 may include DB regions 130 at multiple surfaces of an interposer 150. For example, FIG. 24 illustrates a microelectronic assembly 100 having features similar to those of the microelectronic assembly 100 of FIG. 1, and also including a microelectronic component 102-3 coupled to a bottom surface of the interposer 150 by a DB region 130-3. The interposer 150 may include conductive pathways 112 between the DB region 130-1 and the DB region 130-3, between the DB region 130-2 and a DB region 130-3, and/or between the conductive contacts 118 and the DB region 130-3. In the particular embodiment of FIG. 24, the microelectronic component 102-3 is disposed in a recess 136 at the bottom surface of the interposer 150, with the bottom of the recess 136 provided by a DB interface 180 (not labeled) of the interposer 150, but in other embodiments, one or more microelectronic components 102 may be coupled to a bottom surface of an interposer 150 by a DB region 130 without the microelectronic components 102 being disposed in a recess 136. The microelectronic component 102-3 of FIG. 24 may be said to be "embedded" in the interposer 150. In some embodiments, one or more microelectronic components 102 may be direct bonded to a bottom surface of an interposer 150 and disposed in a recess, and one or more microelectronic components 102 may be direct bonded to the bottom surface of the interposer 150 outside of the recess 136.

Although FIG. 24 depicts only a single microelectronic component 102 in the recess 136, one or more microelectronic components 102 may be disposed in a single recess 136. In some embodiments, the recess 136 may have a depth 186 between 5 microns and 100 microns (e.g., between 10 microns and 100 microns). In some embodiments, the depth 186 may be equal to a certain number of buildup layers in the interposer 150. For example, the depth 186 may be approximately equal to between 1 layer and 5 layers (e.g., between 1 layer and 4 layers). In some embodiments, the depth 186 may be equal to the thickness of a solder resist material (not shown) on the bottom surface of the interposer 150. The height of the microelectronic component 102-3 may be such that the entirety of the microelectronic component 102-3 is contained within the recess 136 (as shown), or the microelectronic component 102-3 may be tall enough to extend beyond the recess 136 such that a portion of the microelectronic component 102-3 is between the solder 120.

Figure 25:
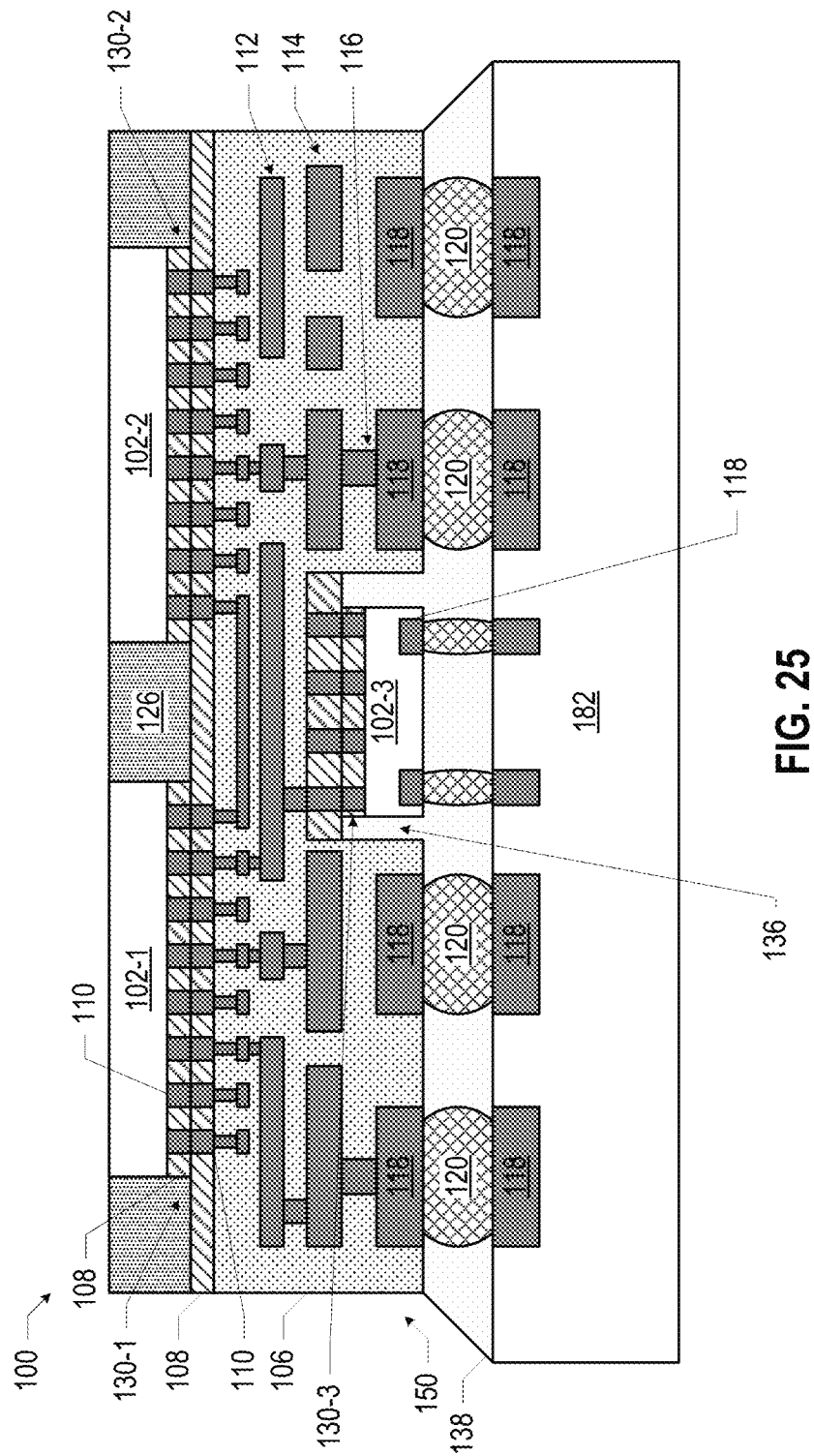

In some embodiments, a microelectronic component 102 coupled by direct bonding to a bottom surface of the interposer 150 may include conductive contacts on its bottom surface for coupling to another component (e.g., a support component 182). For example, FIG. 25 illustrates a microelectronic assembly in which the microelectronic component 102-3 includes conductive contacts 118 at its bottom surface, and solder 120 couples the conductive contacts 118 of the microelectronic component 102-3 to conductive contacts 118 of a support component 182. In this manner, power, ground, and/or signals may be transmitted between the microelectronic component 102-3 and the support component 182 without having to go through the interposer 150.

Figure 26:
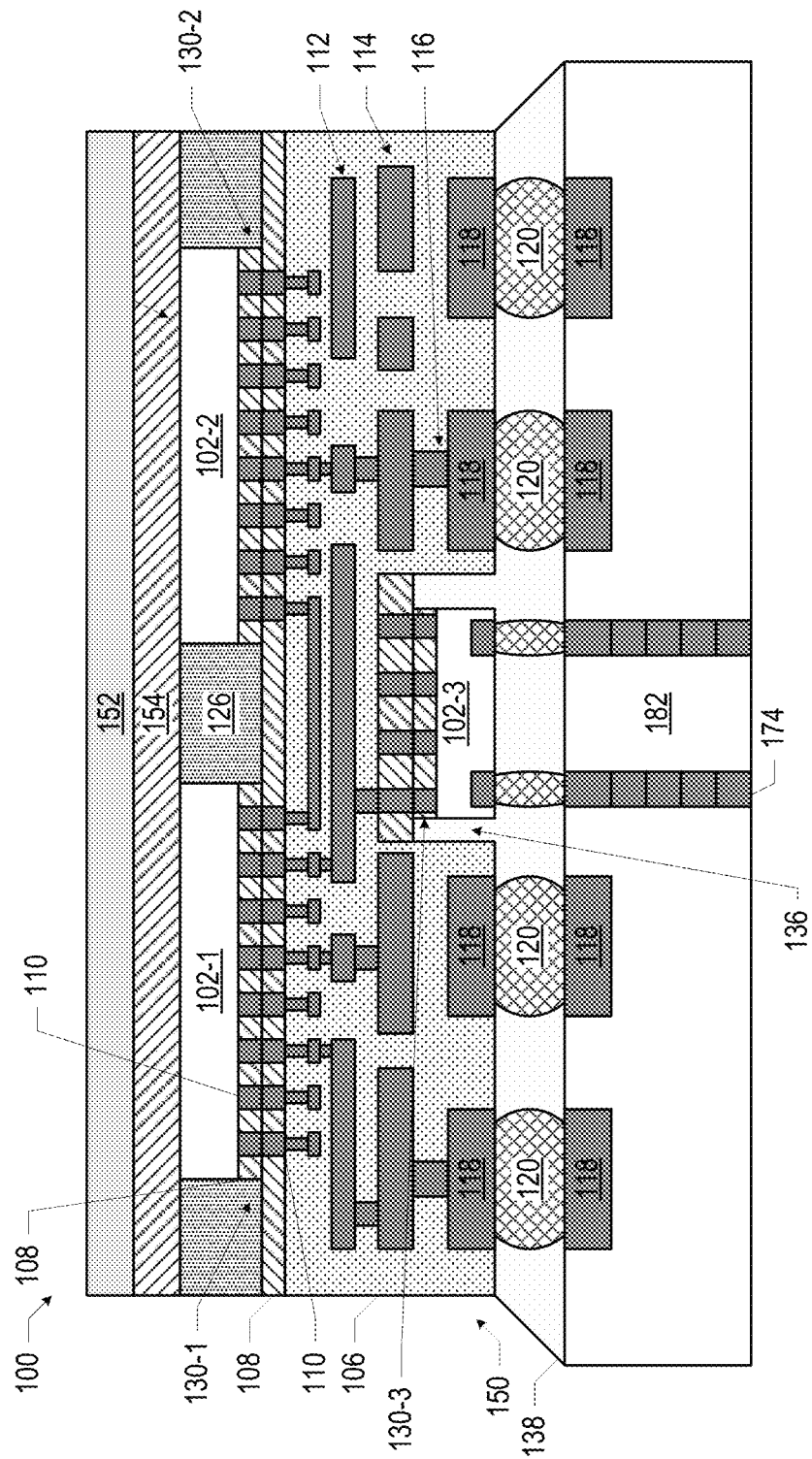

In some embodiments, a support component 182 may include metal or other thermally conductive structures to direct heat away from the interposer 150 or microelectronic components 102 coupled thereto. For example, FIG. 26 depicts a microelectronic assembly 100 like that of FIG. 25, but in which the support component 182 includes metal slugs 174 in contact with the conductive contacts 118 coupled to the microelectronic component 102-3. The metal slugs 174/conductive contacts 118/solder 120 in thermal contact with the microelectronic component 102-3 may serve to draw heat away from the microelectronic component 102-3 during operation, and thus may help mitigate the potential for damage to the microelectronic assembly 100 arising from the "overheating" of the microelectronic component 102-3. A support component 182 including slugs 174 may be included in any of the microelectronic assemblies 100 disclosed herein, with the slugs 174 positioned to draw heat away from any desired element.

Figure 27:
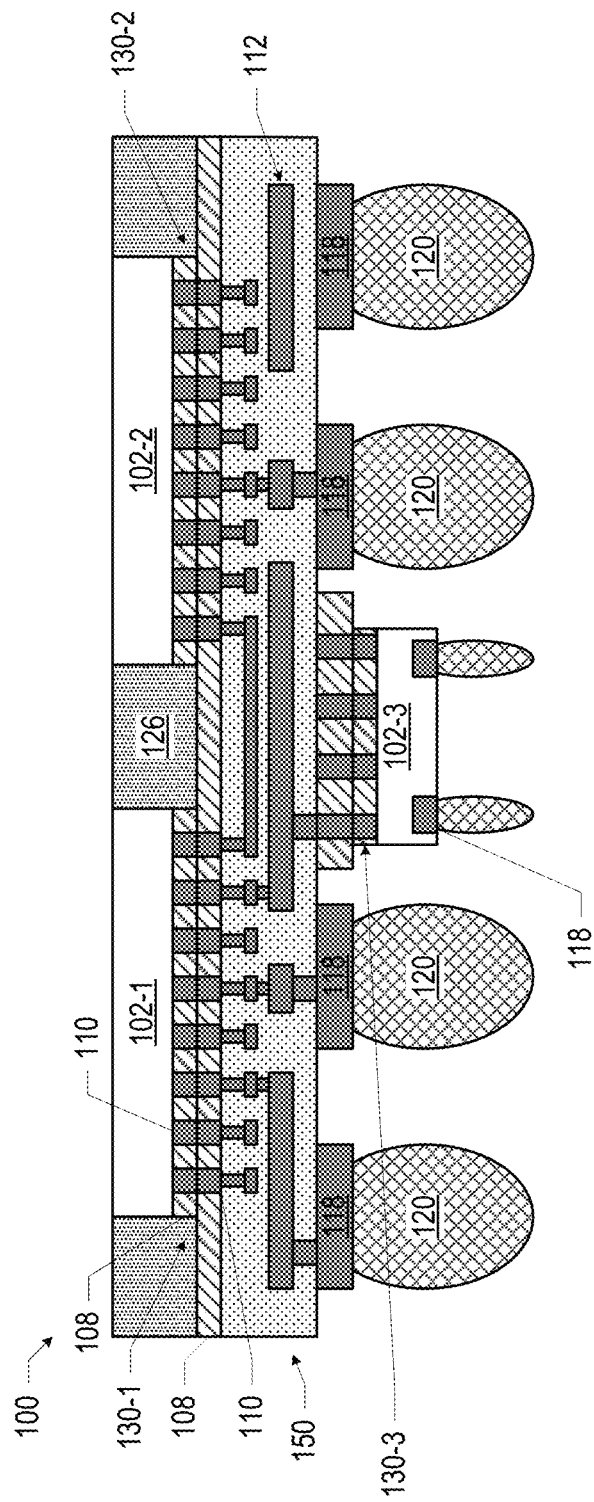

As noted above, a microelectronic component 102 coupled by direct bonding to a bottom surface of an interposer 150 may not be disposed in a recess 136. FIG. 27 illustrates an embodiment of a microelectronic assembly 100 having features like those illustrated in FIG. 25, but in which the microelectronic component 102-3 is not disposed in a recess (but does include conductive contacts 118 at its bottom surface, and solder 120 on the conductive contacts 118), and FIG. 28 illustrates a microelectronic assembly 100 including the microelectronic assembly of FIG. 27 coupled to a support component 182.

Figure 28:
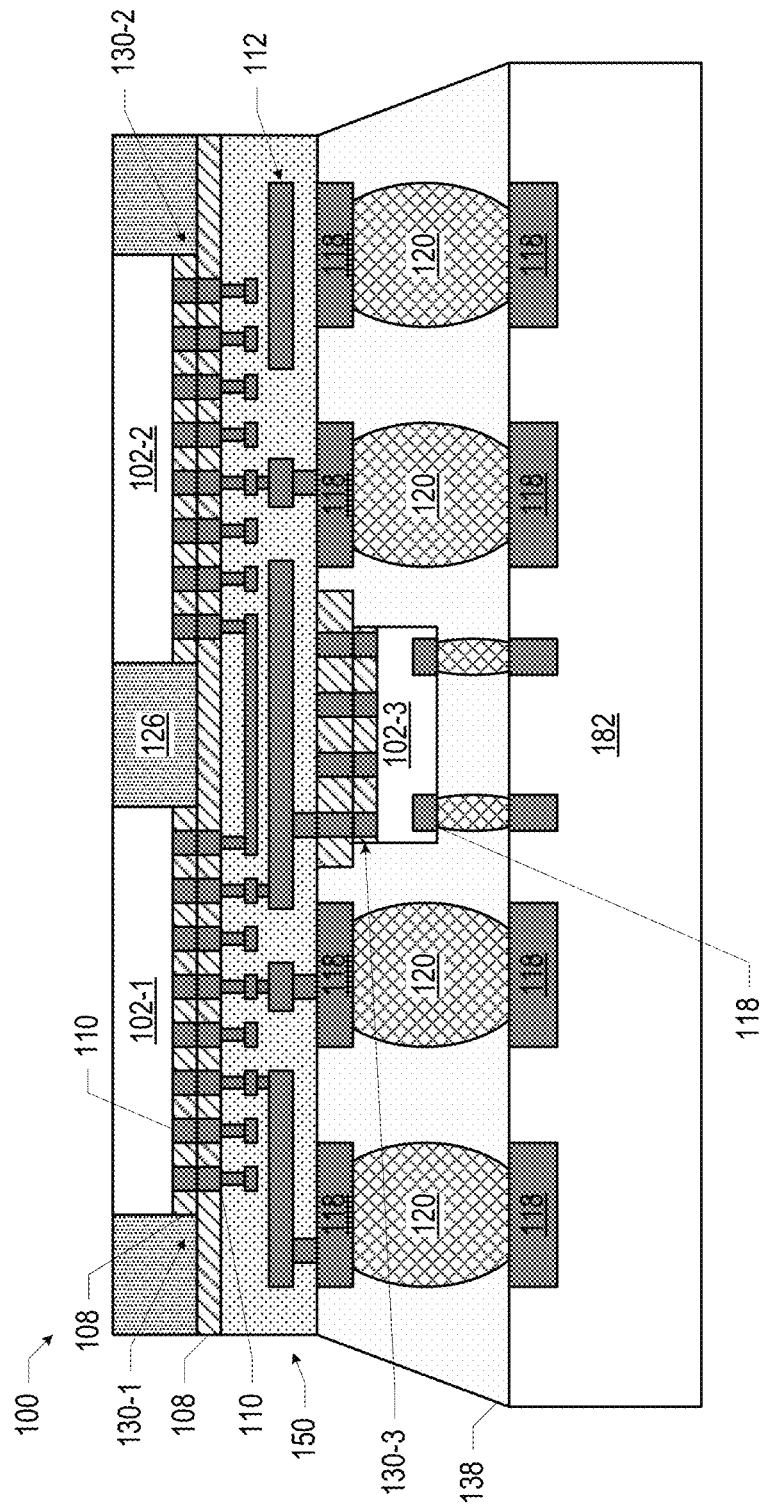
Figure 29:
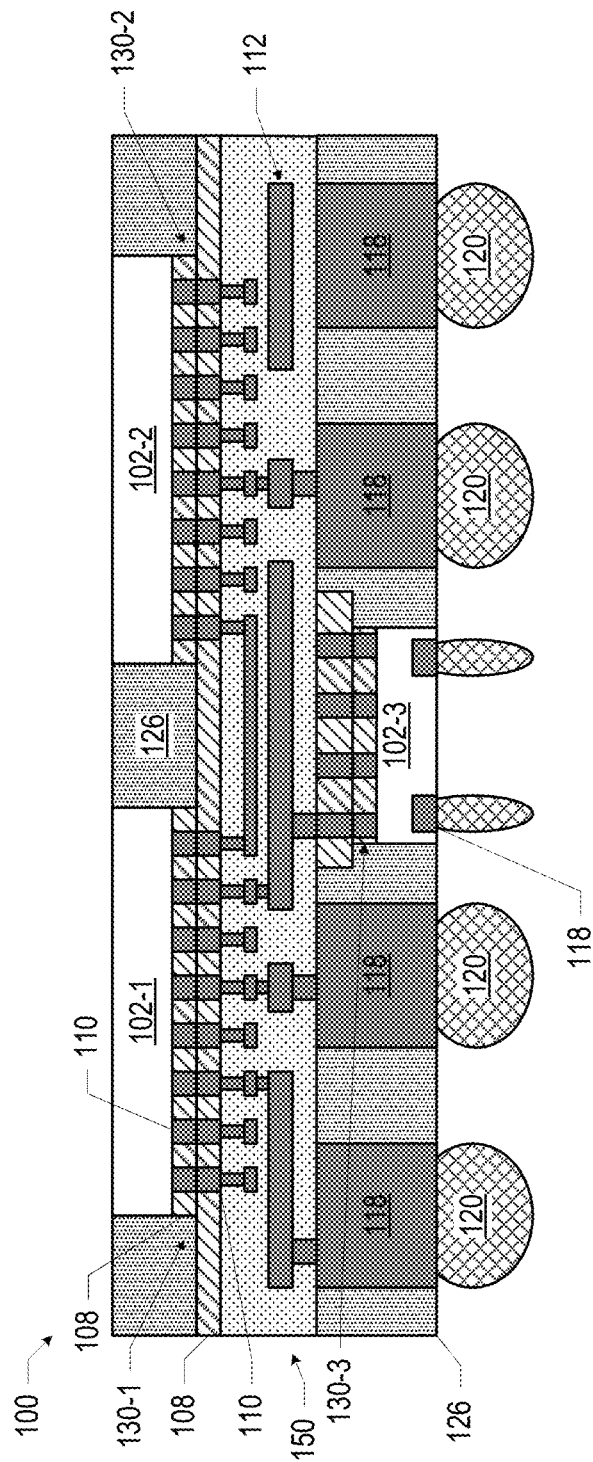

In the embodiments of FIGS. 27-28, the height of the solder 120 between the conductive contacts 118 of the interposer 150 and the conductive contacts 118 of the support component 182 is greater than the height of the microelectronic component 102-3. In other embodiments, the height of the conductive contacts 118 of the interposer 150 may be increased so that the height of the solder 120 required in a microelectronic assembly 100 like that of FIGS. 27 and 28 may be decreased. For example, FIG. 29 illustrates an embodiment in which the height of the conductive contacts 118 is greater than the height of the microelectronic component 102-3, and in which the bottom surfaces of the conductive contacts 118 of the interposer 150 are coplanar with the bottom surfaces of the conductive contacts 118 of the microelectronic component 102-3. In such an embodiment, the height of the solder 120 required on the conductive contacts 118 of the interposer 150 may be smaller than that required in an embodiment like that of FIGS. 27-28. In the embodiment of FIG. 29, the conductive contacts 118 of the interposer 150 may be metal pillars (e.g., copper pillars) surrounded by mold material 126.

Figure 30:
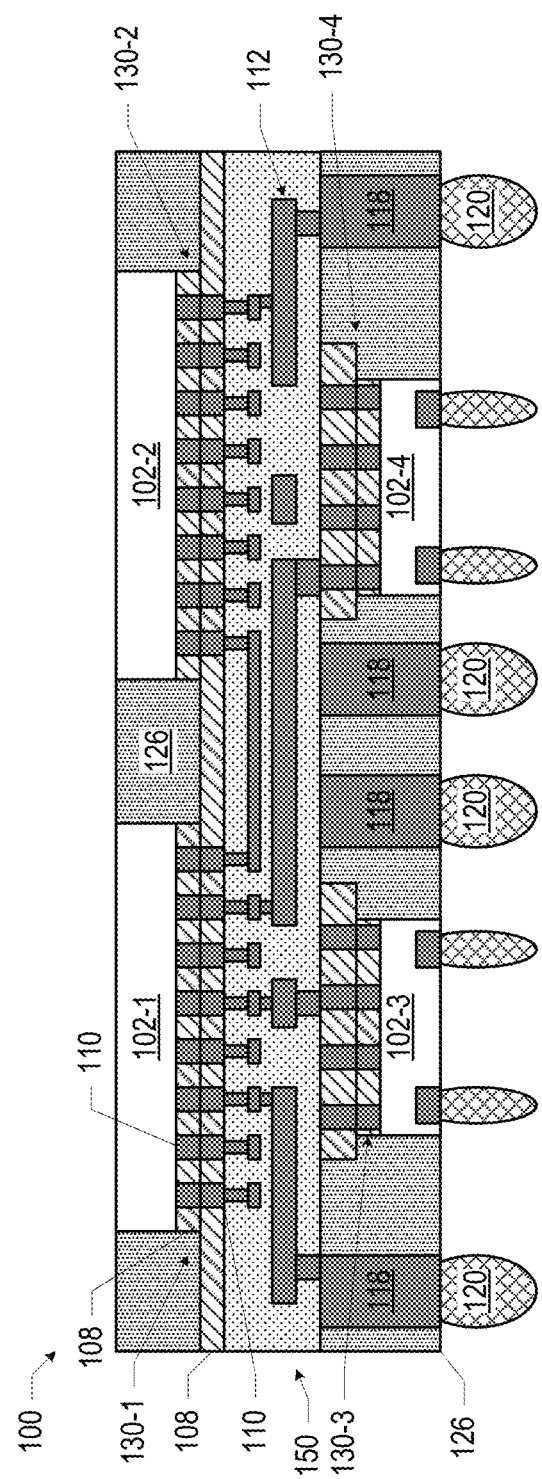

As noted above, multiple microelectronic components 102 may be located at a bottom surface of an interposer 150. For example, FIG. 30 illustrates a microelectronic assembly 100 similar to that of FIG. 29, but in which two microelectronic components 102 (i.e., the microelectronic components 102-3 and the microelectronic components 102-4) are electrically coupled to a bottom surface of the interposer 150 by direct bonding (i.e., the DB regions 130-3 and 130-4, respectively).

In some conventional die complexes, multiple dies are stacked onto a base die to form a computing package. However, in such complexes, the base die may need to provide power, provide signal routing, provide memory (e.g., L3/L4 cache memory), and manage thermal issues; such a large set of requirements may require extensive design that cannot be readily ported to or modified for other settings. The microelectronic assemblies 100 disclosed herein may provide an advantageous alternate approach that allows particular functionality to be implemented by microelectronic components 102 (e.g., memory, voltage regulators, compute units, graphics processing, input/output, etc.) coupled to faces of an interposer 150, allowing the interposer 150 to be designed with fewer constraints. For example, FIGS. 31-36 illustrate various example architectures for an interposer 150 having microelectronic components 102 coupled to its top and bottom surfaces via DB regions 130 (e.g., in accordance with the embodiments depicted in FIGS. 25-30). In such embodiments, the interposer 150 may provide power, ground, and/or signal pathways between the microelectronic components 102 at opposite surfaces of the interposer 150, and the architecture of the interposer 150 may facilitate these pathways. Positioning microelectronic components 102 at opposite surfaces of the interposer 150 may have a smaller footprint and/or a shorter data path relative to embodiments in which microelectronic components 102 are positioned at a same surface of the interposer 150.

Figure 31:
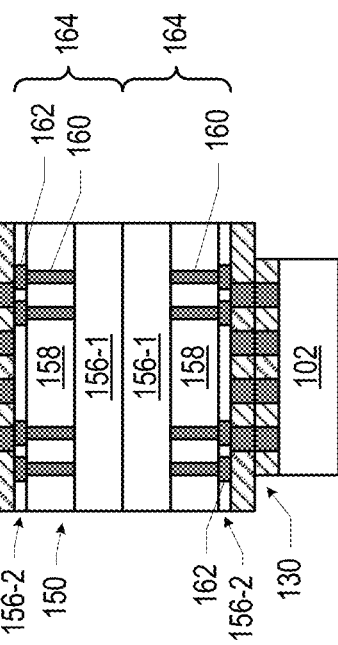

In the embodiment of FIG. 31, the interposer 150 may include a TSV substrate 158 having TSVs 160 therethrough. The TSV substrate 158 may include a semiconductor material (e.g., silicon) or another material (e.g., glass, silicon carbide, sapphire, etc.) through which the TSVs extend. The interposer 150 may also include metallization stacks 156 that sandwich the TSV substrate 158; these metallization stacks 156 may include multiple layers of dielectric material and vias and lines therein, in accordance with any of the embodiments disclosed herein, to provide conductive pathways between the microelectronic components 102 and the TSVs 160. In some embodiments, a metallization stack 156 may have a thickness that is between 0.5 microns and 50 microns (e.g., with package-like traces to support high power and low ohmic voltage drop). In some embodiments, a TSV substrate 158 may have a thickness between 50 microns and 200 microns. An architecture like that depicted in FIG. 31 may be fabricated by forming an initial structure including the TSV substrate 158 and a metallization stack 156 thereon, then coupling a microelectronic component 102 to that initial structure by direct bonding; the direct bonding between the microelectronic component 102 and the initial structure may provide mechanical stability for subsequent processing operations. The backside of the initial structure may then be ground away, revealing the opposite face of the TSV substrate 158, and the other metallization stack 156 may be formed on this opposite face and another microelectronic component 102 coupled to this other metallization stack 156 by direct bonding.

Figure 32:
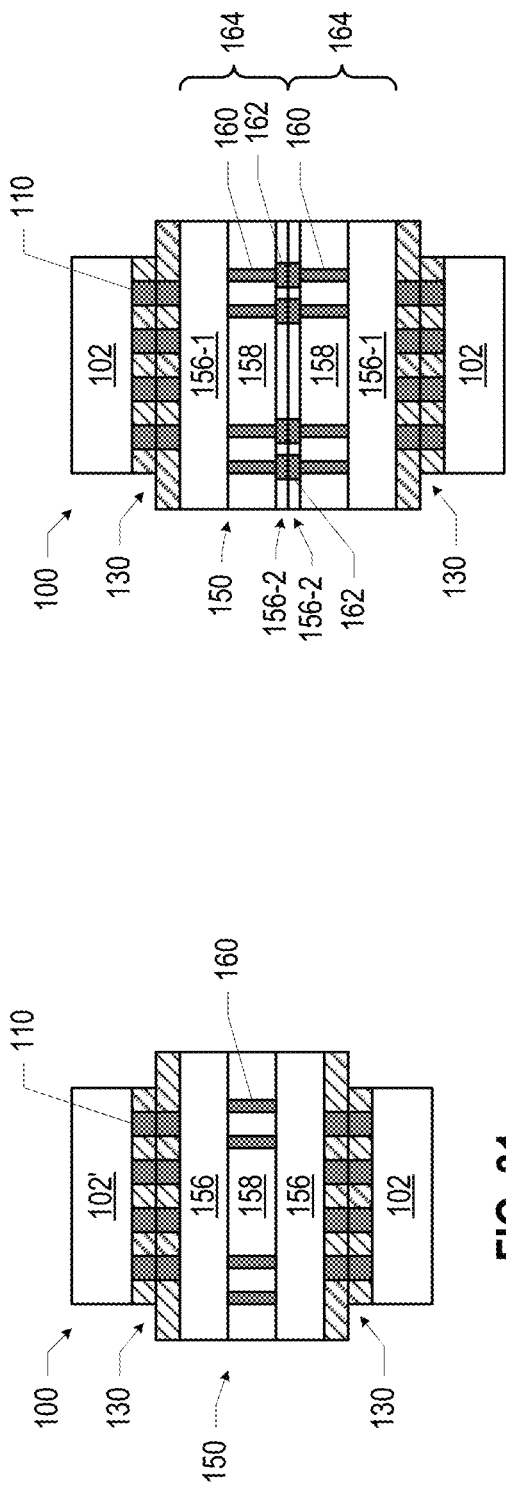

In the embodiment of FIG. 32, the interposer 150 may include two substructures 164 having mirror-image architectures. An individual substructure 164 may include a TSV substrate 158 between a metallization stack 156-1 and a metallization stack 156-2. The metallization stacks 156 of the embodiment of FIG. 32 may take any of the forms disclosed herein, with the metallization stacks 156-2 including attach pads 162. In the embodiment of FIG. 32, the substructures 164 are arranged so that the metallization stacks 156-2 are between the metallization stacks 156-1, with the attach pads 162 of the metallization stacks 156-2 in conductive contact with each other. An architecture like that depicted in FIG. 32 may be fabricated by separately forming the substructures 164 and then bonding them together at the attach pads 162 (e.g., by wafer-to-wafer or die-to-die bonding), then attaching the microelectronic components 102 by direct bonding. Such a fabrication technique may allow the microelectronic components 102 to be attached later in the process relative to the fabrication technique discussed above with reference to FIG. 31, and thus may avoid yield fall-out due to the processing performed after attachment of the microelectronic components 102. The fabrication technique discussed with reference to FIG. 32 may also have a thicker core region (including the TSV substrates 158) than the embodiment of FIG. 31, which may help achieve better mechanical performance during manufacturing and operation.

Figure 33:
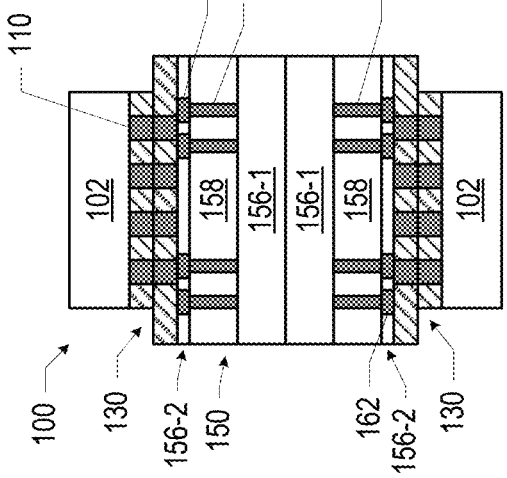

In the embodiment of FIG. 33, the interposer 150 may also include two substructures 164 having mirror-image architectures. However, in contrast to the embodiment of FIG. 32, the embodiment of FIG. 33 has the substructures 164 arranged so that the metallization stacks 156-1 are between the metallization stacks 156-2, with the attach pads 162 of the metallization stacks 156-2 in conductive contact with the DB contacts 110 of the DB regions 130, and conductive pathways (not shown) of the metallization stacks 156-1 in contact with each other. An architecture like that depicted in FIG. 33 may be fabricated by separately forming the substructures 164 and then bonding them together at the metallization stacks 156 (e.g., by wafer-to-wafer or die-to-die bonding), then attaching the microelectronic components 102 by direct bonding. The embodiment of FIG. 33 may allow some of the routing in the metallization stacks 156 to be shared, which may improve utilization. However, the pitch of contacts between the two microelectronic components 102 may be limited by the pitch of the TSVs 160, which may itself depend on the thickness of the TSV substrates 158. In any of the embodiments of FIGS. 31-33, one or more active layers may be included (e.g., between a metallization stack 156 and a TSV substrate 158, or in an interior of a metallization stack 156).

FIGS. 34-36 illustrate some particular embodiments of the interposer architecture illustrated in FIG. 31. In the embodiments of FIGS. 34-36, the interposer 150 includes a TSV substrate 158 sandwiched between two metallization stacks 156. In the particular embodiment of FIG. 34, a metallization stack 156 includes a fine metal layer region 166 and a thick metal layer region 168; lines (e.g., the lines 114) in the thick metal layer region 168 may be thicker than the lines (e.g., the lines 114) in the fine metal layer region 166. The metallization stacks 156 in the embodiment of FIG. 34 may be arranged in a mirror-image manner, with the thick metal layer regions 168 between the fine metal layer regions 166. Typically, the presence of thick metal structures proximate to a semiconductor material (e.g., the thick metal layer region 168 on a TSV substrate 158 that includes a semiconductor such as silicon) can result in mechanical issues arising from differences in the CTE of these materials; however, such mechanical issues may be mitigated by the symmetric structure of the interposer 150 of FIG. 34 (in the interposers 150 of FIGS. 35 and 36, discussed below). The thick metal layer regions 168 may include thick power and ground planes, and thus may facilitate good power delivery performance. In some embodiments, the thick metal layer regions 168 may be fabricated using semi-additive manufacturing techniques, which may be less expensive than Damascene techniques.

The embodiment of FIG. 35 may share many features with the embodiment of FIG. 34, and may also include pass-through via dies 170 embedded in the thick metal layer regions 168. The pass-through via dies 170 may include vertical interconnects (e.g., TSVs) to facilitate signaling between the microelectronic components 102 through the thick metal layer regions 168.

The embodiment of FIG. 36 may share many features with the embodiment of FIG. 34, and may also include multi-layer vias 172 (which may also be referred to as "super vias") in the thick metal layer regions 168. A multi-layer via 172 may be a single via that extends through multiple layers of dielectric material (in contrast to a stack of multiple vias). The multi-layer vias 172 may be included in the thick metal layer regions 168 instead of or in addition to pass-through via dies 170, and may provide vertical interconnects to facilitate signaling between the microelectronic components 102 through the thick metal layer regions 168. In any of the embodiments of FIGS. 31-36 (and any of the embodiments of the other microelectronic assemblies 100 disclosed herein), the interposer 150 may include embedded inductors (e.g., thin-film magnetic inductors and/or high-Q inductors); including such inductors in an interposer 150 may support the implementation of high-efficiency regulators with the microelectronic components 102.

In some embodiments, a microelectronic assembly 100 may include microelectronic components 102 coupled to an interposer 150 (or to other microelectronic components 102) only via DB regions 130. In other embodiments, a microelectronic assembly 100 may also include microelectronic components 102 coupled to an interposer 150 (or to other microelectronic components 102) by other attach technologies, such as solder bonding and/or wirebonding. Utilizing other attach technologies in combination with direct bonding may enable the design and assembly of component complexes with additional advantages. For example, a solder bond in a microelectronic assembly 100 may facilitate less heat transfer than a direct bond, and a wirebond may facilitate less heat transfer than a solder bond; consequently, the attach technologies used to couple various components may be selected to achieve particular thermal management goals for heat transfer between components. Heat transfer in a microelectronic assembly 100 may be further engineered in a DB region 130 by the selection of a DB dielectric 108, the selection of a density of DB contacts 110, etc., as discussed above, and heat transfer in a microelectronic assembly 100 may be further engineered in a solder attach region by the choice of underfill material 138, the choice of solder 120, and the choice of density of solder contacts 140. Further, the use of "heterogeneous" attach technologies in a single microelectronic assembly 100 may enable the integration of components that were designed with different attach mechanisms. For example, some microelectronic components 102 (e.g., some solar cells, optical sensors, mechanical sensors, electrostatic sensors, etc.) are constructed to be attached to other components by wirebonds (e.g., in order to achieve desired isolation); the microelectronic assemblies 100 disclosed herein may accommodate such microelectronic components 102 while also achieving the benefits of coupling other microelectronic components 102 by direct bonding. FIGS. 37-43 depict various examples of microelectronic assemblies 100 including direct bonding in combination with other attach technologies; the particular microelectronic assemblies 100 depicted in FIGS. 37-43 are simply illustrative, and other variations will be apparent based on the present disclosure. In the embodiments of FIGS. 37-43, the interposers 150 may be organic interposers or inorganic interposers. The microelectronic assemblies 100 of FIGS. 37-43 may be manufactured using any suitable techniques; for example, DB regions 130 may be formed and then the solder-based and/or wirebond-based attachments may be made (e.g., by defining the locations for the solder contacts 140 or the wirebond contacts 144 by patterning of a photoresist, and then plating copper pillars).

Figure 37:
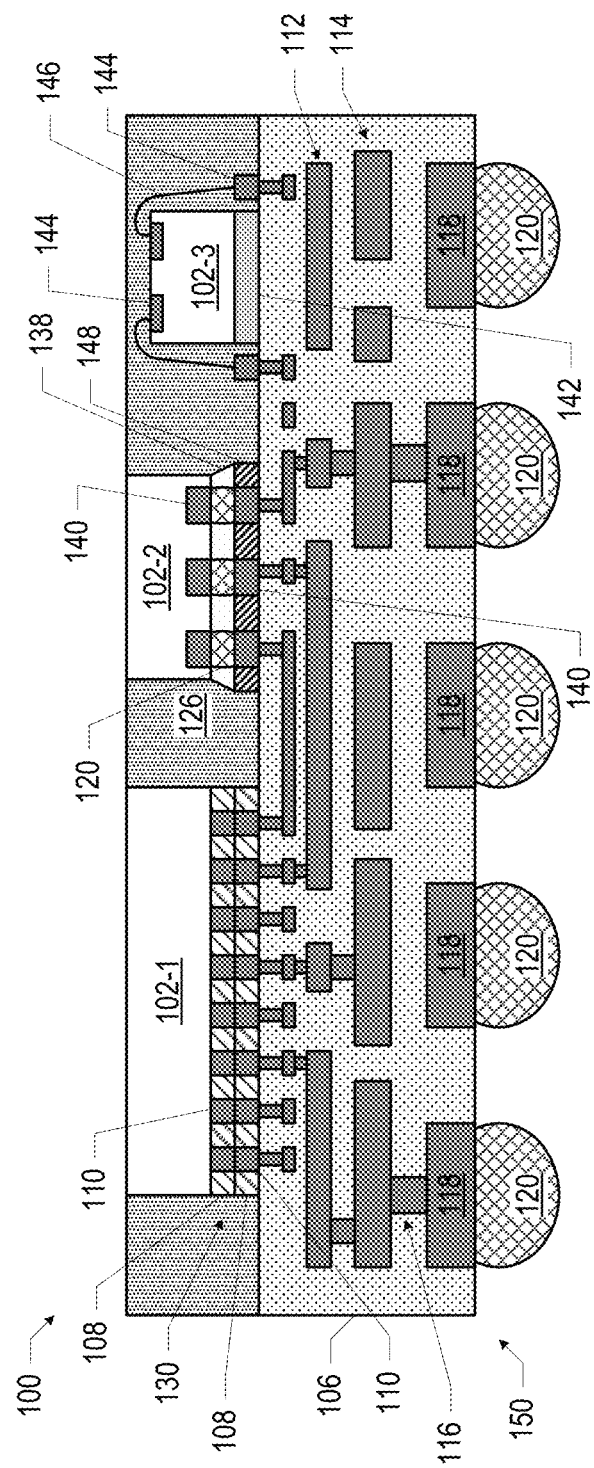
FIGS. 37-44 are side, cross-sectional views of example microelectronic assemblies including direct bonding, in accordance with various embodiments.

FIG. 37 illustrates a microelectronic assembly 100 in which a microelectronic component 102-1 is coupled to the top surface of an interposer 150 via a DB region 130, while a microelectronic component 102-2 is coupled to the top surface of the interposer 150 via solder 120, and a microelectronic component 102-3 is coupled to the top surface of the interposer 150 via wirebonds 146. In particular, the top surface of the interposer 150 may include solder contacts 140 laterally surrounded by solder resist 148, and the solder contacts 140 may be coupled by solder 120 to solder contacts 140 of the microelectronic component 102-2. An underfill material 138 may surround the solder 120 between the microelectronic component 102-2 and the interposer 150, and the interposer 150 may include conductive pathways 112 between the microelectronic component 102-2 and the other microelectronic components 102 (and/or between the microelectronic component 102-2 and the conductive contacts 118). The top surface of the interposer 150 may also include wirebond contacts 144, which may be coupled to wirebond contacts 144 at the top surface of the microelectronic component 102-3 via wirebonds 146. In some embodiments, the wirebonds 146 may include copper or gold, and may be attached to the wirebond contacts 144 using any suitable techniques known in the art. The microelectronic component 102-3 may also be mechanically coupled to the interposer 150 by an electrically non-conductive die attach film (DAF) 142. As discussed previously, a mold material 126 may extend around the microelectronic components 102.

Figure 38:
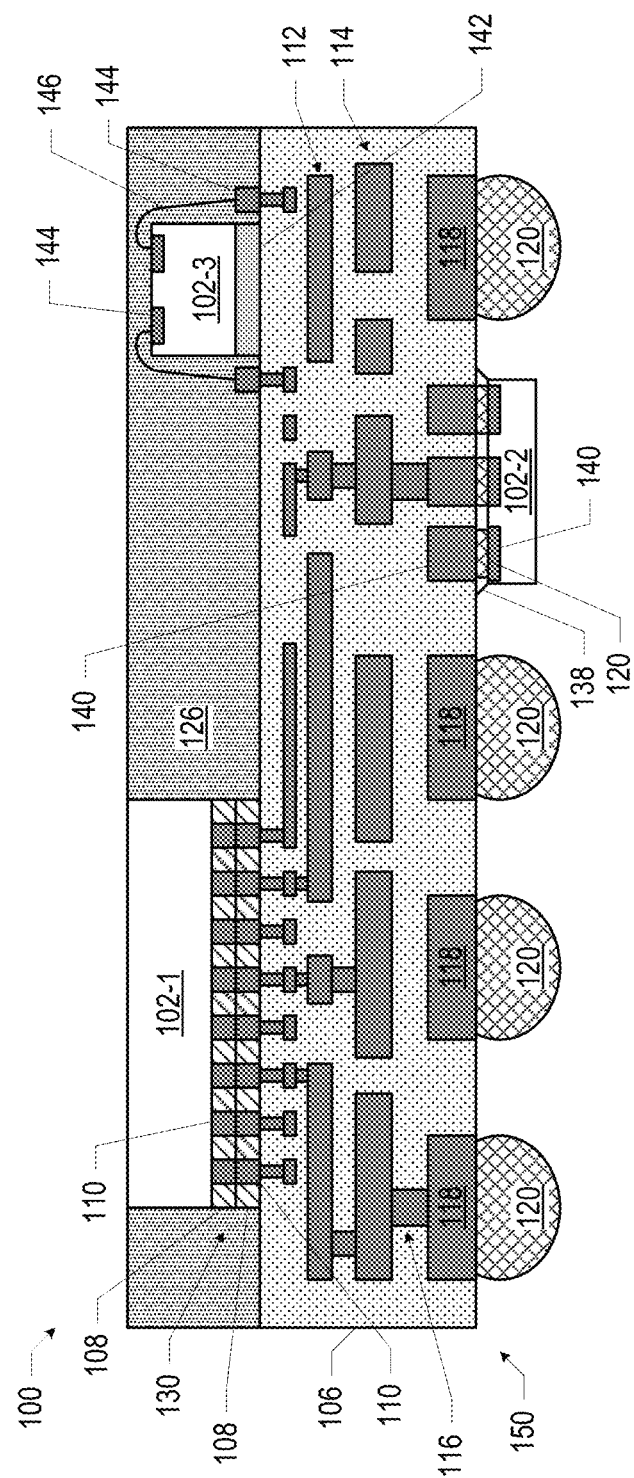

Microelectronic components 102 may be coupled to more than one face of an interposer 150 by attach technologies other than direct bonding. For example, FIG. 38 illustrates a microelectronic assembly 100 similar to that of FIG. 37, but in which the microelectronic component 102-2 is coupled to the bottom surface of the interposer 150 by solder bonds. Microelectronic components 102 may be coupled to the top and bottom surfaces of an interposer 150 by solder bonds and/or wirebonds, as desired.

Figure 39:
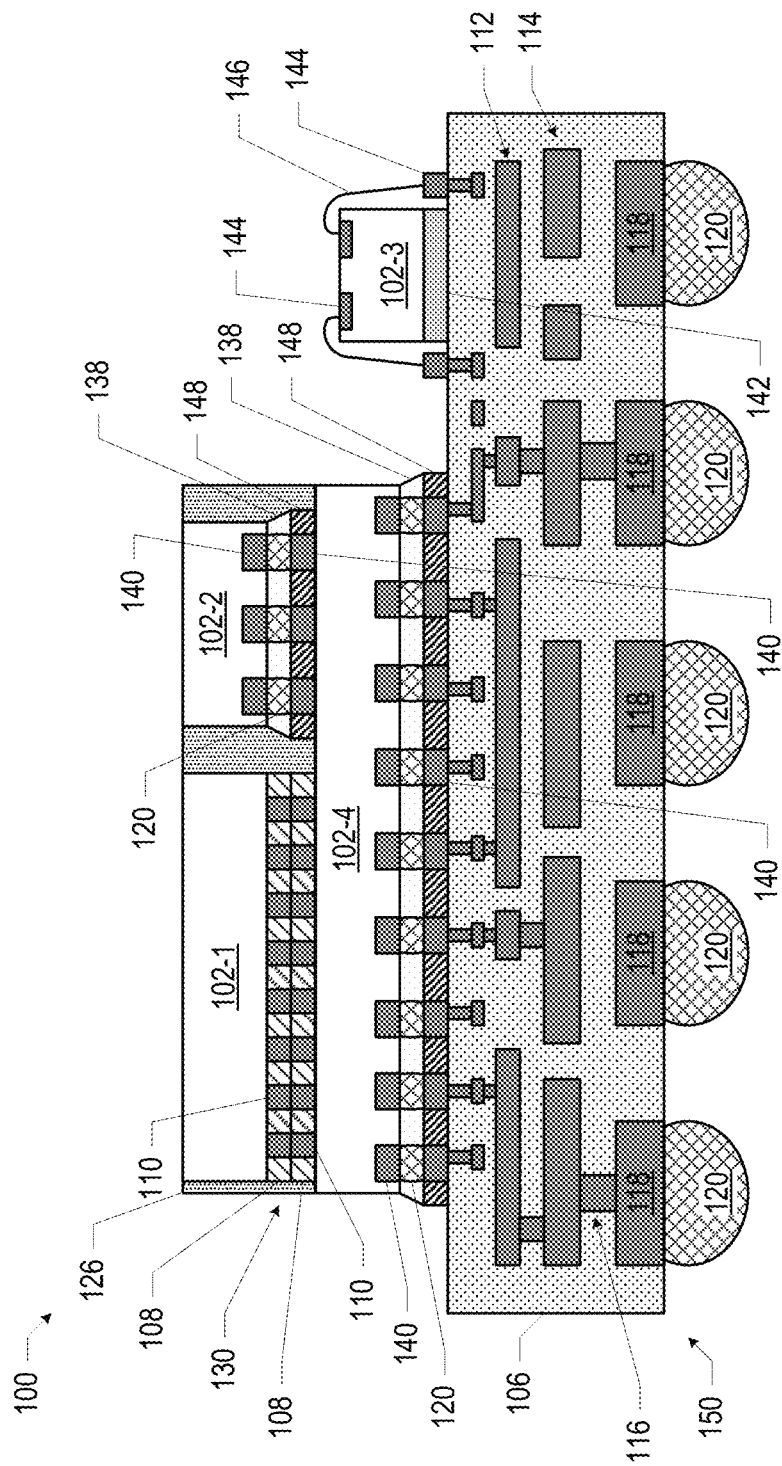
Figure 42:
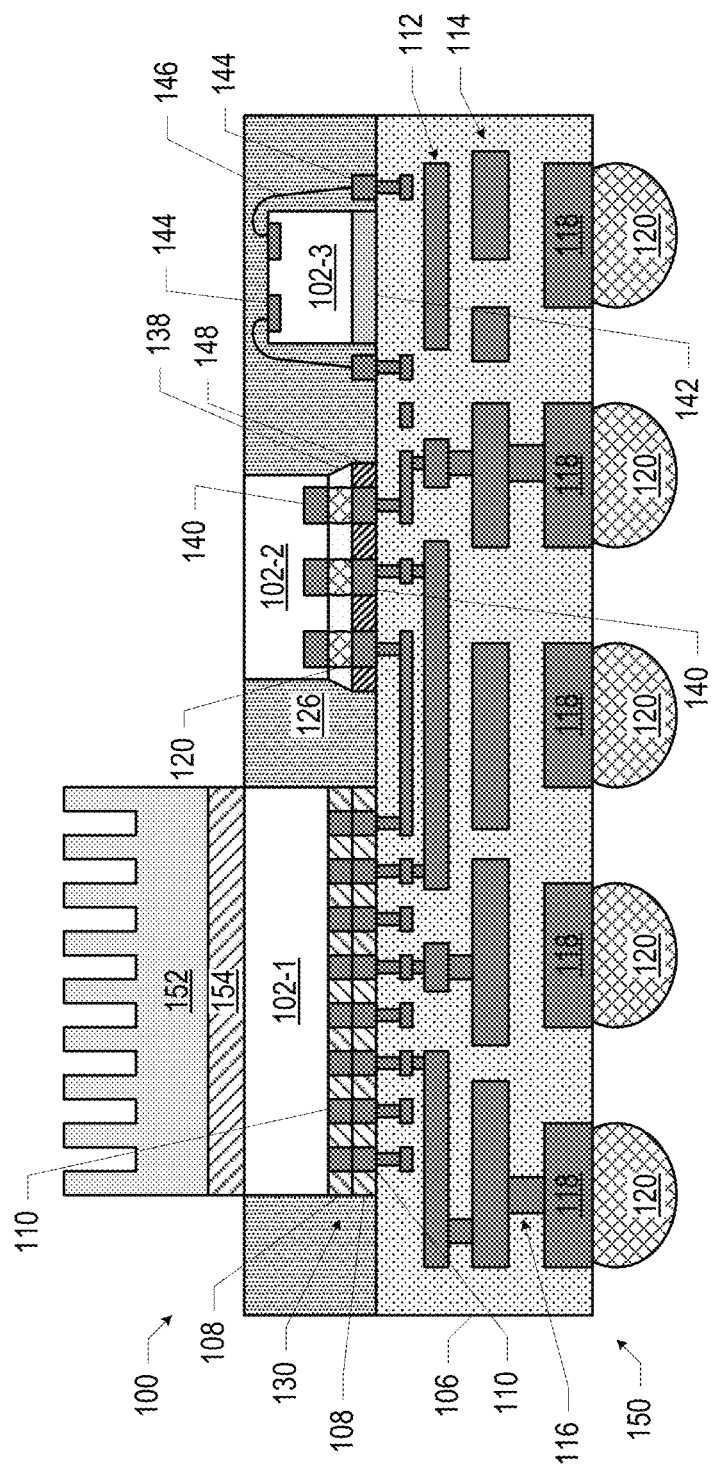

In some embodiments, a microelectronic assembly 100 may include one or more DB regions 130 between different microelectronic components 102, instead of or in addition to DB regions 130 between a microelectronic component 102 and an interposer 150. For example, FIG. 39 illustrates a microelectronic assembly 100 in which a microelectronic component 102-1 is coupled to a top surface of a microelectronic component 102-4 via a DB region 130, and the microelectronic component 102-4 is coupled to the top surface of an interposer 150 by solder bonds. The microelectronic component 102-4 may include conductive pathways (not shown) between the microelectronic component 102-1 and the interposer 150, and/or conductive pathways (not shown) between the microelectronic component 102-1 and a microelectronic component 102-2 coupled to the top surface of the microelectronic component 102-4 by solder bonds (or by wirebonding, or by another attach technology). Additional microelectronic components 102, such as the microelectronic component 102-3, may be coupled to the top surface of the interposer 150 (e.g., by wirebonding, as shown, or another attach technology). As discussed above, the elements of the microelectronic assembly 100 of FIG. 39 (and others of the microelectronic assemblies 100 disclosed herein) may be selected to achieve particular thermal goals. For example, if the microelectronic component 102-2 is thermally sensitive and thus cannot withstand very high temperatures (which may occur, for example, when the microelectronic component 102-2 includes one or more memory dies), the solder attachment between the microelectronic component 102-2 and the microelectronic component 102-4 may be selected to have low thermal conductivity (e.g., by the choice of underfill material 138 and the density of solder contacts 140). If the microelectronic components 102-1 and 102-4 are high power components (e.g., including one or more logic dies), the DB region 130 between the microelectronic components 102-1 and 102-4 may be selected to have high thermal conductivity to maximize heat removal from the microelectronic component 102-4 through the microelectronic component 102-1 to a cooling solution (e.g., a TIM 154 and a heat transfer structure 152, not shown) on the top surface of the microelectronic component 102-1 (e.g., as illustrated in FIG. 42).

Figure 40:
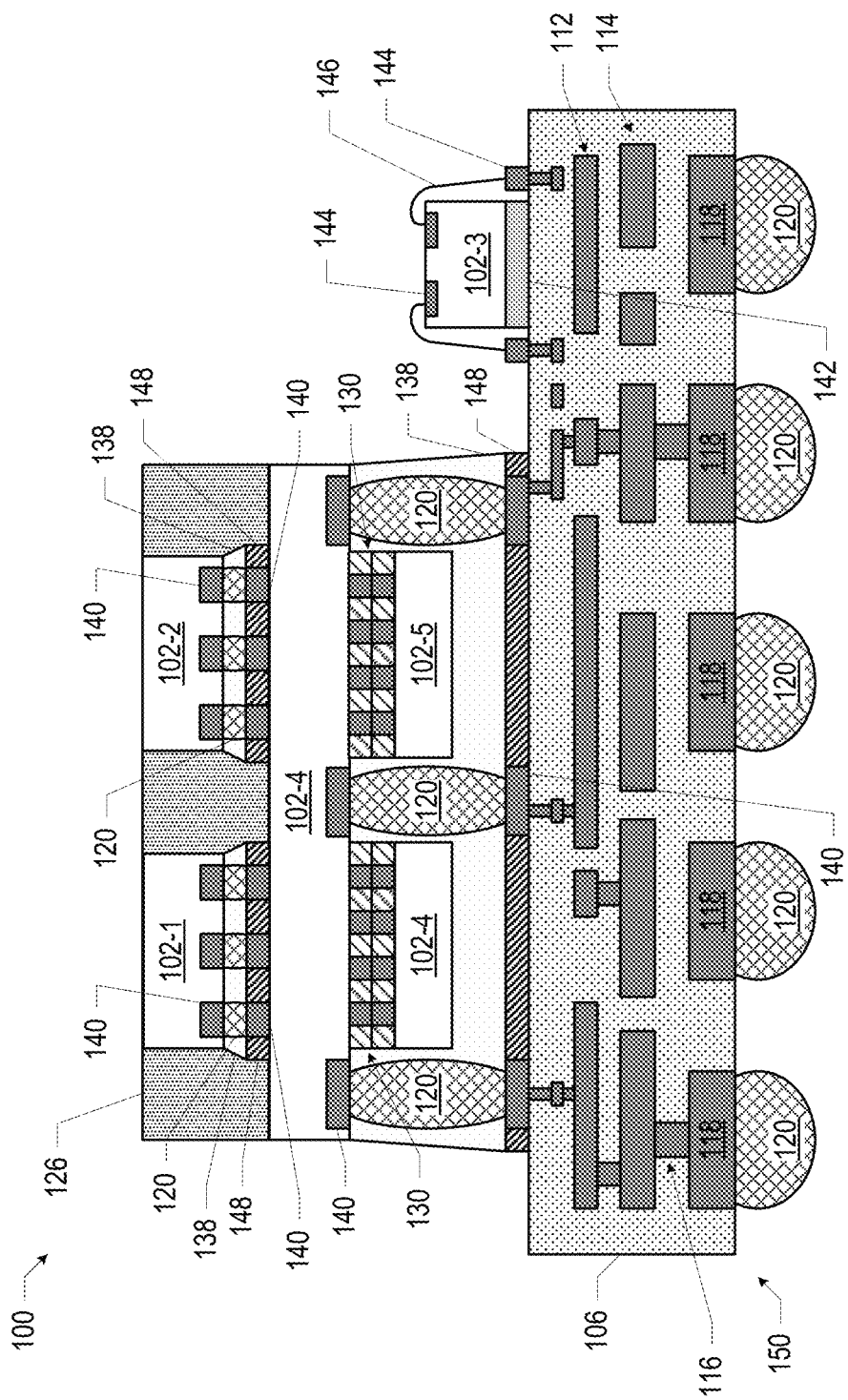

FIG. 40 illustrates another embodiment of a microelectronic assembly 100 including direct bonding between different microelectronic components 102. In particular, FIG. 40 illustrates two microelectronic components 102-4 and 102-5 coupled to a bottom surface of a microelectronic component 102-4 by DB regions 130. Microelectronic components 102-1 and 102-2 may be coupled to the top surface of the microelectronic component 102-4 by solder bonds (or by wirebonding, or by another attach technology), and the microelectronic component 102-4 may be itself coupled to the interposer 150 by solder bonds. As shown in FIG. 40, the microelectronic components 102-4 and 102-5 may be but at least partially between portions of the solder 120 coupling the microelectronic component 102-4 to the interposer 150. Additional microelectronic components 102, such as the microelectronic component 102-3, may be coupled to the top surface of the interposer 150 (e.g., by wirebonding as shown, or another attach technology).

FIGS. 39 and 40 also illustrate embodiments of microelectronic assemblies 100 in which a mold compound does not extend over all of the microelectronic components 102 coupled to an interposer 150. Such embodiments may be useful when some of the microelectronic components 102 in a microelectronic assembly 100 are to be attached to an interposer 150 by a first manufacturer, and additional microelectronic components 102 are to be attached to the interposer 150 by a second, different manufacturer. In such situations, the microelectronic components 102 of the microelectronic assembly 100 that are attached by the first manufacturer may be "over molded" by the first manufacturer, and areas may be left unmolded to allow access for the second manufacturer to attach the additional microelectronic components 102 (e.g., by solder bonding or wirebonding).

Figure 41:
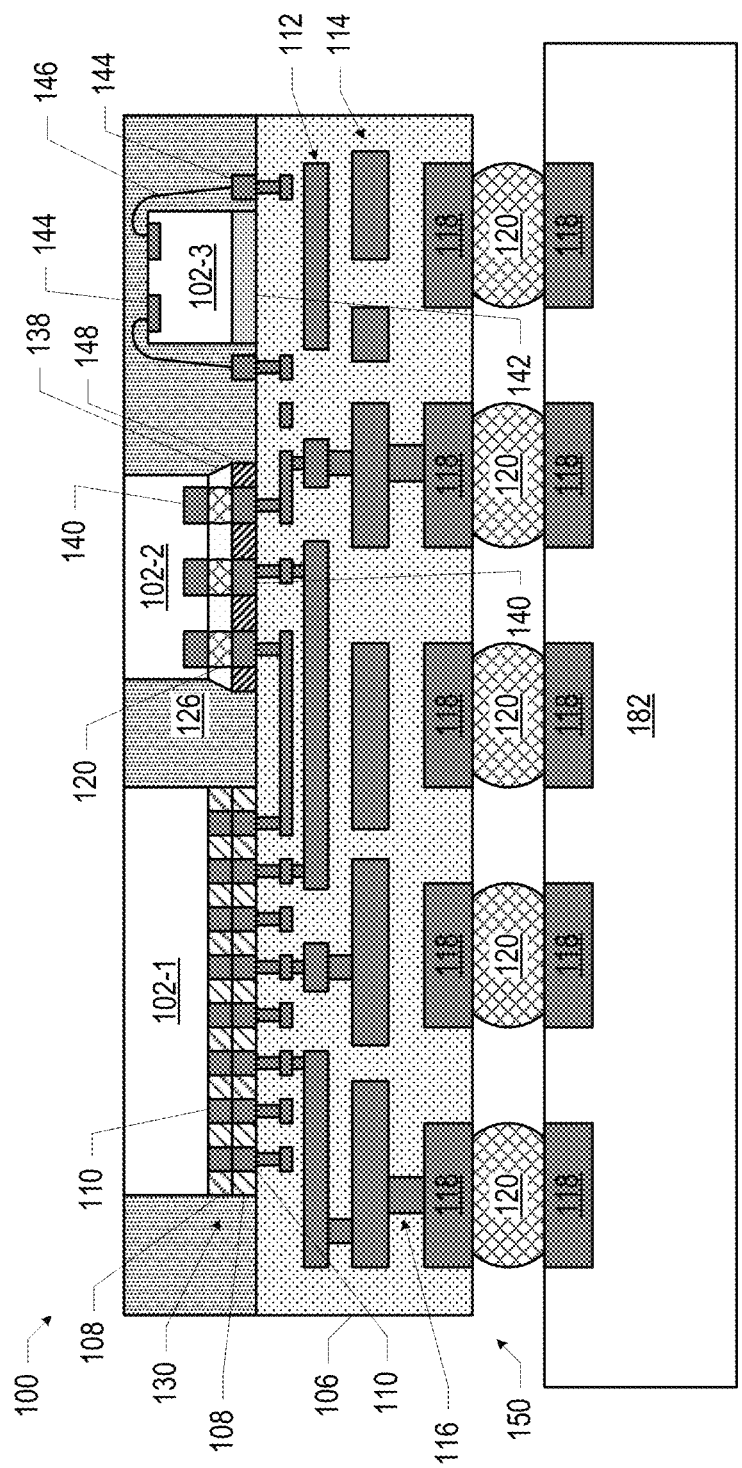

A microelectronic assembly 100 including direct bonding and other attach technologies may be coupled to a support component 182; for example, FIG. 41 illustrates the microelectronic assembly 100 of FIG. 37 with a support component 182 coupled to the interposer 150 by solder 120, as previously discussed. In some embodiments, different attach technologies may be selected for use in a single microelectronic assembly 100 in order to achieve particular thermal goals. For example, the materials used in a DB region 130 may be selected so as to achieve greater heat transfer than may be achieved using solder bonds or wirebonds, and thus direct bonding may be used when increased heat transfer is particularly desired. FIG. 42 illustrates a microelectronic assembly 100 like that of FIG. 37, and further including a TIM 154 between the microelectronic component 102-1 and a heat transfer structure 152. During operation, heat generated by the microelectronic component 102-1 (which may, for example, generate more heat than the microelectronic components 102-2 or 102-3 of FIG. 42) may be effectively transferred into the interposer 150 (where it may be distributed) via the DB region 130, and also into the heat transfer structure 152 via the TIM 154.

Other attach technologies may also be included with direct bonding in a microelectronic assembly 100, in addition to or instead of solder bonding or wirebonding. For example, one or more microelectronic components 102 may be coupled to an interposer 150 by an anisotropic conductive material, such as an anisotropic conductive film or an anisotropic conductive paste. An anisotropic conductive material may include conductive materials dispersed in a non-conductive material. In some embodiments, an anisotropic conductive material may include microscopic conductive particles embedded in a binder or a thermoset adhesive film (e.g., a thermoset biphenyl-type epoxy resin, or an acrylic-based material). In some embodiments, the conductive particles may include a polymer and/or one or more metals (e.g., nickel or gold). For example, the conductive particles may include nickel-coated gold or silver-coated copper that is in turn coated with a polymer. In another example, the conductive particles may include nickel. When an anisotropic conductive material is uncompressed, there may be no conductive pathway from one side of the material to the other. However, when the anisotropic conductive material is adequately compressed (e.g., by conductive contacts on either side of the anisotropic conductive material), the conductive materials near the region of compression may contact each other so as to form a conductive pathway from one side of the film to the other in the region of compression.

Figure 43:
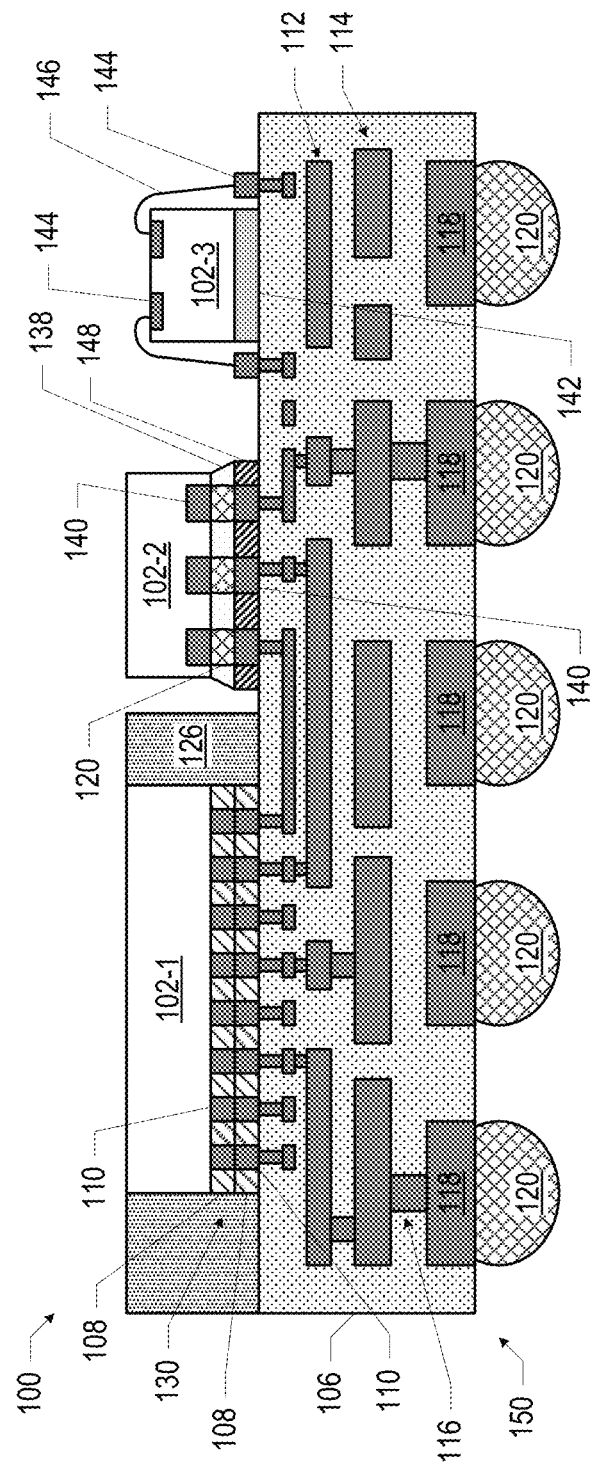

As noted above, although various ones of the microelectronic assemblies 100 depicted in the accompanying drawings are shown as including a mold material 126 around the microelectronic components 102, any of the microelectronic assemblies 100 disclosed herein may include mold material 126 around some but not all of the microelectronic components 102, or may include no mold material 126. For example, FIG. 43 depicts a microelectronic assembly 100 similar to that of FIG. 37, but in which the mold material is only disposed around the microelectronic component 102-1, but not around the microelectronic components 102-2 or 102-3. Such embodiments may be particularly useful when additional components (e.g., the microelectronic components 102-2 and 102-3 of the microelectronic assembly 100 of FIG. 43) are to be attached by a manufacturer different than a manufacturer of the remainder of the microelectronic assembly 100, as noted above.

Figure 44:
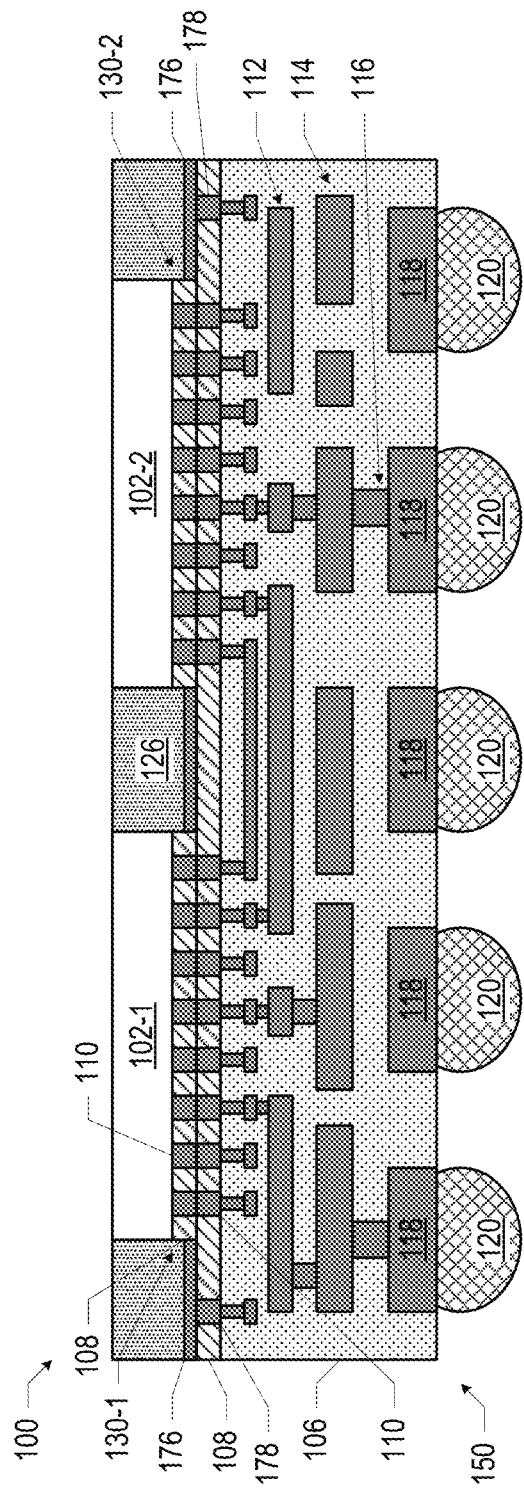

In some embodiments, a surface of an interposer 150 may include a metal plane that may perform electrical and/or thermal functions. For example, FIG. 44 illustrates a microelectronic assembly 100 having features like that of FIGS. 1 and 2, but including one or more metal planes 176 on the DB dielectric 108 outside of the DB regions 130. The metal planes 176 may be in contact with a conductive via 178 through the DB dielectric 108, and the conductive via 178 may be further in contact with conductive pathways 112 in the interposer 150 (which may themselves be in electrical contact with the conductive contacts 118 and/or one or more of the microelectronic components 102). In some embodiments, a metal plane 176 may be coupled to a power pathway or a ground pathway in the interposer 150 through the conductive via 178, and thus the metal plane 176 may be a power plane or a ground plane, respectively. By using a metal plane 176 at the surface of the interposer 150 as a power or ground plane, such planes may be brought closer to the microelectronic components 102 (reducing losses when providing power/ground to the microelectronic components 102), and valuable layers in the interposer 150 may be utilized for other purposes. Further, the surface metal planes 176 may be made thicker than the maximum metal thickness achievable within the interposer 150, reducing resistance and thereby improving power delivery efficiency. In some embodiments, a surface metal plane 176 may have a thickness that is greater than 4 microns (e.g., greater than 5 microns, greater than 10 microns, or greater than 25 microns). A metal plane 176 may include any suitable material, such as copper. A metal plane 176 acting as a ground plane may not act only as a return path for power, but may also provide electromagnetic shielding for signaling (and thus may contribute to improved signal integrity).

Figure 45:
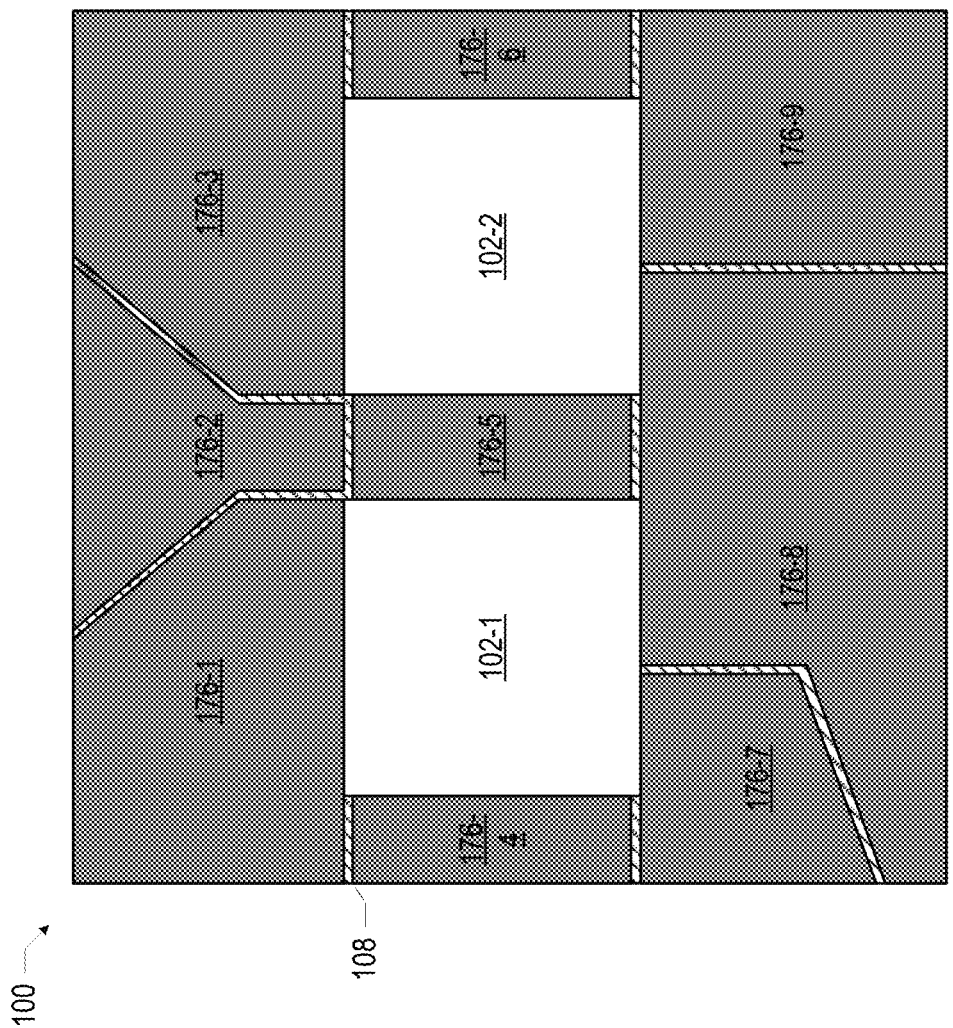
FIG. 45 is a top view of an example microelectronic assembly including surface metal planes, in accordance with various embodiments.

FIG. 45 is a top view of a microelectronic assembly 100 including multiple metal planes 176 on a surface of an interposer 150 in a microelectronic assembly 100. The particular number and arrangement of metal planes 176 in the embodiment of FIG. 45 is simply illustrative, and is intended to show that the footprints and/or number of metal planes 176 may be configured in any of a number of ways. In some embodiments, the footprint of a metal plane 176 may be between the footprints of the microelectronic components 102 (e.g., as shown in FIG. 45 with reference to the metal plane 176-5).

Figure 46:
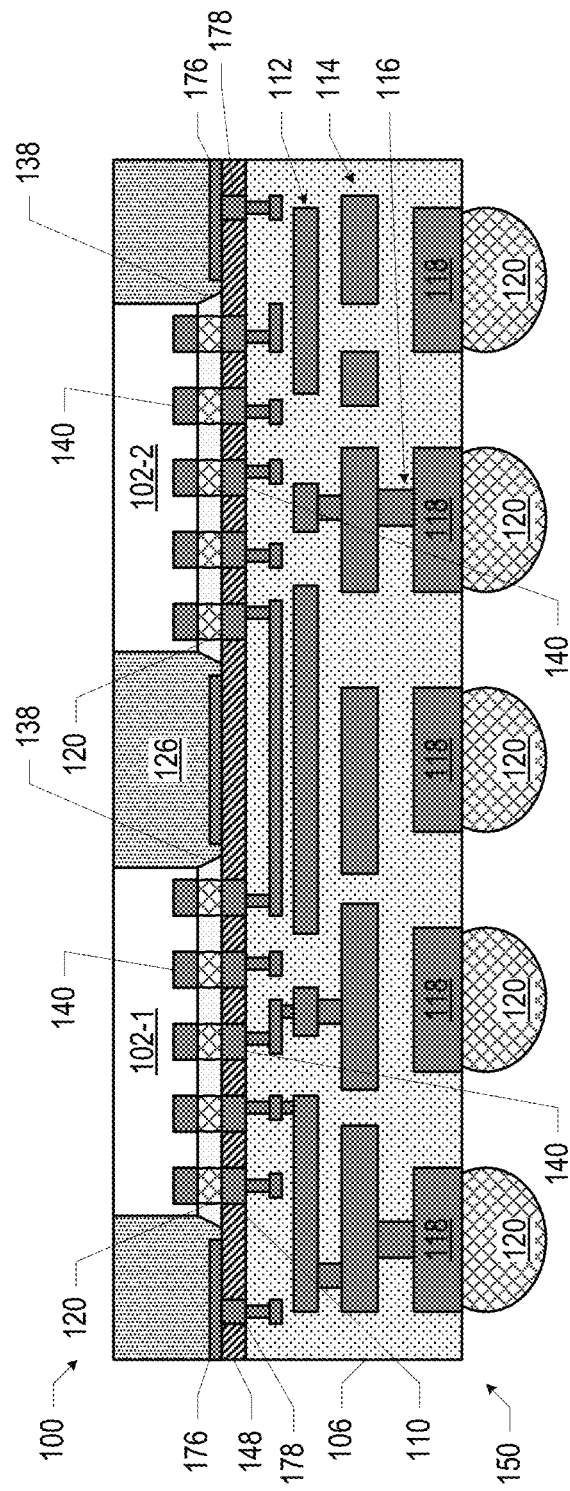
FIG. 46 is a side, cross-sectional view of an example microelectronic assembly including surface metal planes and solder-based bonding between microelectronic components, in accordance with various embodiments.

In some embodiments, the material underlying a metal plane 176 in a microelectronic assembly 100 may not be a DB dielectric 108, but may be another dielectric material (e.g., as discussed above with reference to FIG. 20). In some embodiments, metal planes 176 at a surface of an interposer 150 may be used when microelectronic components 102 are coupled to that surface by attach technologies other than direct bonding. For example, FIG. 46 illustrates a microelectronic assembly 100 in which the microelectronic components 102 are coupled to the top surface of an interposer 150 by solder bonding, and one or more metal planes 176 are disposed on the solder resist 148. Further, although various ones of the accompanying drawings illustrate metal planes 176 at a top surface of an interposer 150, one or more metal planes 176 may be disposed at a bottom surface of an interposer 150 instead of or in addition to metal planes 176 at the top surface of an interposer 150.

In some embodiments, surface metal planes 176 may be fabricated using a cold spray technique. In a cold spray technique, solid powders of a desired material or material mixture are accelerated in a carrier gas jet (e.g., compressed air or nitrogen) by passing the jet through a converging-diverging nozzle. The jet may exit the nozzle at a high velocity and impact a target surface (e.g., a surface of an interposer 150), causing the solid particles in the jet to plastically deform and bond to the target surface. Subsequent layers of the material may similarly adhere to each underlying layer upon continued impact, resulting in fast buildup. For example, metal planes 176 having a thickness between 100 microns and 500 microns may be deposited over an area of 1000 square millimeters in seconds. In other embodiments, thermal spraying techniques may be used in which the particles are melted before spraying. Additive techniques such as spraying may not require the use of lithography, and its attendant cost and complexity, unlike many subtractive or semi-additive methods (e.g., plating, sputtering, etc.), although such subtractive or semi-additive methods may be used in various embodiments. In some embodiments in which a cold spray technique is used to fabricate a metal plane 176, the material on which the metal plane 176 is formed may need to be sufficiently "hard" so as not to be ablated during deposition. An inorganic material, such as any of the inorganic DB dielectrics 108 disclosed herein, may provide sufficient hardness, and in some embodiments, a layer of (typically organic) solder resist 148 may include a thin layer of an inorganic dielectric (or metal) to protect the underlying organic material during deposition of a metal plane 176.

The microelectronic components 102 and microelectronic assemblies 100 disclosed herein may be included in any suitable electronic component. FIGS. 47-50 illustrate various examples of apparatuses that may include, or be included in, as suitable, any of the microelectronic components 102 and microelectronic assemblies 100 disclosed herein.

Figure 47:
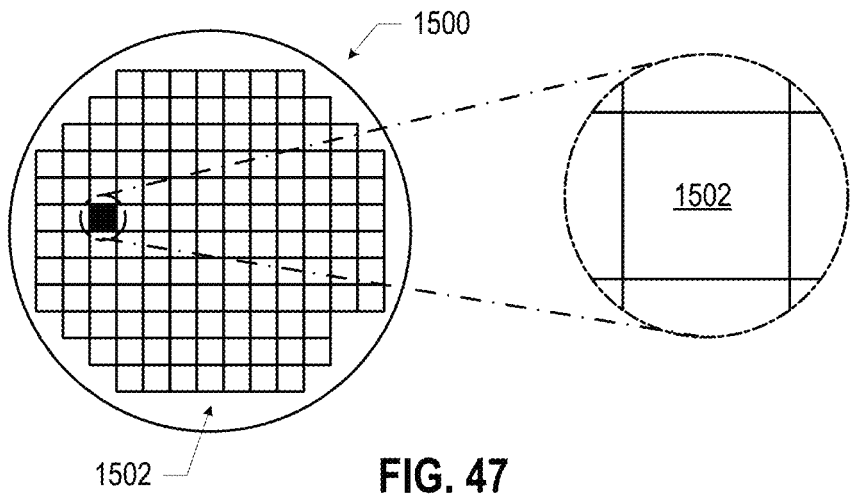
FIG. 47 is a top view of a wafer and dies that may be included in a microelectronic component in accordance with any of the embodiments disclosed herein.

FIG. 47 is a top view of a wafer 1500 and dies 1502 that may be included in any of the microelectronic components 102 disclosed herein. For example, a die 1502 may serve as a microelectronic component 102, or may be included in a microelectronic component 102. The wafer 1500 may be composed of semiconductor material and may include one or more dies 1502 having IC structures formed on a surface of the wafer 1500. Each of the dies 1502 may be a repeating unit of a semiconductor product that includes any suitable IC. After the fabrication of the semiconductor product is complete, the wafer 1500 may undergo a singulation process in which the dies 1502 are separated from one another to provide discrete "chips" of the semiconductor product. The die 1502 may include one or more transistors (e.g., some of the transistors 1640 of FIG. 48, discussed below) and/or supporting circuitry to route electrical signals to the transistors, as well as any other IC components. In some embodiments, the wafer 1500 or the die 1502 may include a memory device (e.g., a random access memory (RAM) device, such as a static RAM (SRAM) device, a magnetic RAM (MRAM) device, a resistive RAM (RRAM) device, a conductive-bridging RAM (CBRAM) device, etc.), a logic device (e.g., an AND, OR, NAND, or NOR gate), or any other suitable circuit element. Multiple ones of these devices may be combined on a single die 1502. For example, a memory array formed by multiple memory devices may be formed on a same die 1502 as a processing device (e.g., the processing device 1802 of FIG. 50) or other logic that is configured to store information in the memory devices or execute instructions stored in the memory array.

Figure 48:
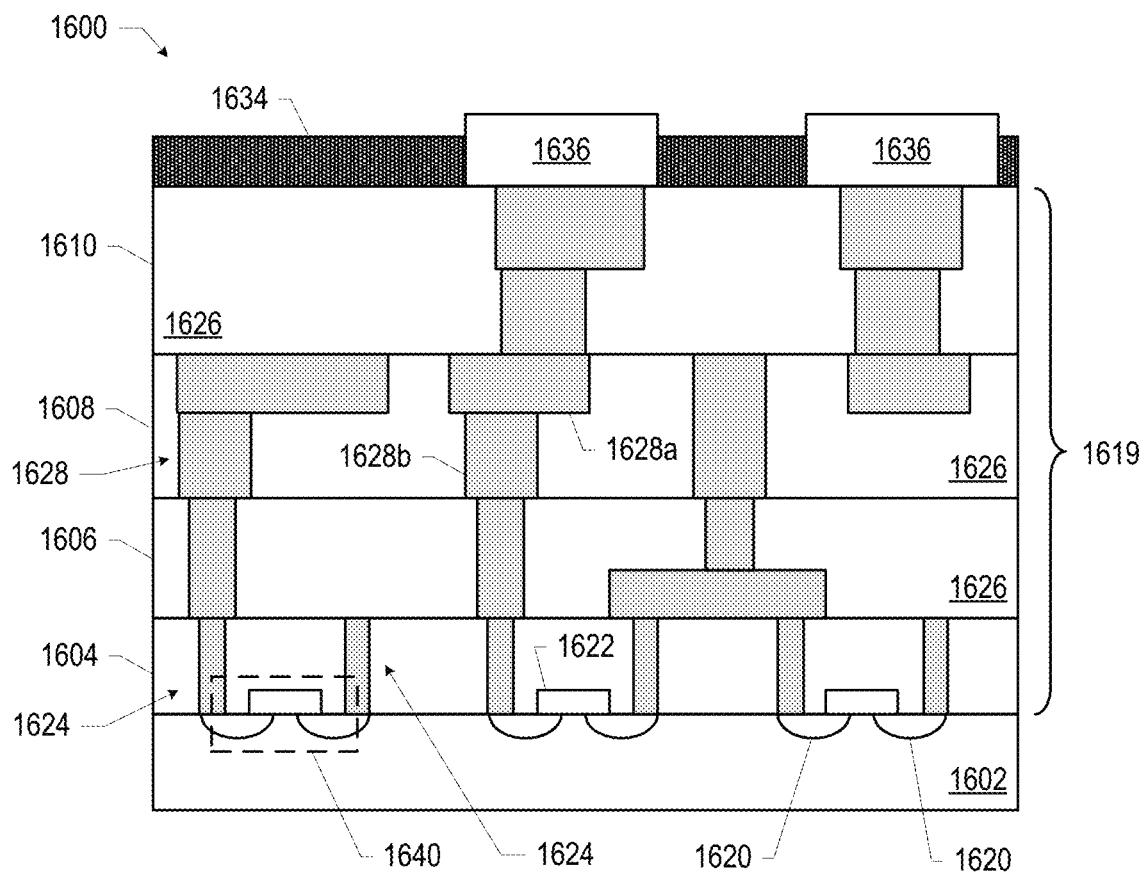
FIG. 48 is a side, cross-sectional view of an integrated circuit (IC) device that may be included in a microelectronic component in accordance with any of the embodiments disclosed herein.

FIG. 48 is a side, cross-sectional view of an IC device 1600 that may be included in any of the microelectronic components 102 disclosed herein. For example, an IC device 1600 (e.g., as part of a die 1502, as discussed above with reference to FIG. 47) may serve as a microelectronic component 102, or may be included in a microelectronic component 102. One or more of the IC devices 1600 may be included in one or more dies 1502 (FIG. 47). The IC device 1600 may be formed on a substrate 1602 (e.g., the wafer 1500 of FIG. 47) and may be included in a die (e.g., the die 1502 of FIG. 47). The substrate 1602 may be a semiconductor substrate composed of semiconductor material systems including, for example, n-type or p-type materials systems (or a combination of both). The substrate 1602 may include, for example, a crystalline substrate formed using a bulk silicon or a silicon-on-insulator (SOI) substructure. In some embodiments, the substrate 1602 may be formed using alternative materials, which may or may not be combined with silicon, that include but are not limited to germanium, indium antimonide, lead telluride, indium arsenide, indium phosphide, gallium arsenide, or gallium antimonide. Further materials classified as group II-VI, III-V, or IV may also be used to form the substrate 1602. Although a few examples of materials from which the substrate 1602 may be formed are described here, any material that may serve as a foundation for an IC device 1600 may be used. The substrate 1602 may be part of a singulated die (e.g., the dies 1502 of FIG. 47) or a wafer (e.g., the wafer 1500 of FIG. 47).

The IC device 1600 may include one or more device layers 1604 disposed on the substrate 1602. The device layer 1604 may include features of one or more transistors 1640 (e.g., metal oxide semiconductor field-effect transistors (MOSFETs)) formed on the substrate 1602. The device layer 1604 may include, for example, one or more source and/or drain (S/D) regions 1620, a gate 1622 to control current flow in the transistors 1640 between the S/D regions 1620, and one or more S/D contacts 1624 to route electrical signals to/from the S/D regions 1620. The transistors 1640 may include additional features not depicted for the sake of clarity, such as device isolation regions, gate contacts, and the like. The transistors 1640 are not limited to the type and configuration depicted in FIG. 48 and may include a wide variety of other types and configurations such as, for example, planar transistors, non-planar transistors, or a combination of both. Planar transistors may include bipolar junction transistors (BJT), heterojunction bipolar transistors (HBT), or high-electron-mobility transistors (HEMT). Non-planar transistors may include FinFET transistors, such as double-gate transistors or tri-gate transistors, and wrap-around or all-around gate transistors, such as nanoribbon and nanowire transistors.

Each transistor 1640 may include a gate 1622 formed of at least two layers, a gate dielectric and a gate electrode. The gate dielectric may include one layer or a stack of layers. The one or more layers may include silicon oxide, silicon dioxide, silicon carbide, and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric to improve its quality when a high-k material is used.

The gate electrode may be formed on the gate dielectric and may include at least one p-type work function metal or n-type work function metal, depending on whether the transistor 1640 is to be a p-type metal oxide semiconductor (PMOS) or an n-type metal oxide semiconductor (NMOS) transistor. In some implementations, the gate electrode may consist of a stack of two or more metal layers, where one or more metal layers are work function metal layers and at least one metal layer is a fill metal layer. Further metal layers may be included for other purposes, such as a barrier layer. For a PMOS transistor, metals that may be used for the gate electrode include, but are not limited to, ruthenium, palladium, platinum, cobalt, nickel, conductive metal oxides (e.g., ruthenium oxide), and any of the metals discussed below with reference to an NMOS transistor (e.g., for work function tuning). For an NMOS transistor, metals that may be used for the gate electrode include, but are not limited to, hafnium, zirconium, titanium, tantalum, aluminum, alloys of these metals, carbides of these metals (e.g., hafnium carbide, zirconium carbide, titanium carbide, tantalum carbide, and aluminum carbide), and any of the metals discussed above with reference to a PMOS transistor (e.g., for work function tuning).

In some embodiments, when viewed as a cross-section of the transistor 1640 along the source-channel-drain direction, the gate electrode may consist of a U-shaped structure that includes a bottom portion substantially parallel to the surface of the substrate and two sidewall portions that are substantially perpendicular to the top surface of the substrate. In other embodiments, at least one of the metal layers that form the gate electrode may simply be a planar layer that is substantially parallel to the top surface of the substrate and does not include sidewall portions substantially perpendicular to the top surface of the substrate. In other embodiments, the gate electrode may consist of a combination of U-shaped structures and planar, non-U-shaped structures. For example, the gate electrode may consist of one or more U-shaped metal layers formed atop one or more planar, non-U-shaped layers.

In some embodiments, a pair of sidewall spacers may be formed on opposing sides of the gate stack to bracket the gate stack. The sidewall spacers may be formed from materials such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

The S/D regions 1620 may be formed within the substrate 1602 adjacent to the gate 1622 of each transistor 1640. The S/D regions 1620 may be formed using an implantation/diffusion process or an etching/deposition process, for example. In the former process, dopants such as boron, aluminum, antimony, phosphorous, or arsenic may be ion-implanted into the substrate 1602 to form the S/D regions 1620. An annealing process that activates the dopants and causes them to diffuse farther into the substrate 1602 may follow the ion-implantation process. In the latter process, the substrate 1602 may first be etched to form recesses at the locations of the S/D regions 1620. An epitaxial deposition process may then be carried out to fill the recesses with material that is used to fabricate the S/D regions 1620. In some implementations, the S/D regions 1620 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 1620 may be formed using one or more alternate semiconductor materials such as germanium or a group III-V material or alloy. In further embodiments, one or more layers of metal and/or metal alloys may be used to form the S/D regions 1620.

Electrical signals, such as power and/or input/output (I/O) signals, may be routed to and/or from the devices (e.g., the transistors 1640) of the device layer 1604 through one or more interconnect layers disposed on the device layer 1604 (illustrated in FIG. 48 as interconnect layers 1606-1610). For example, electrically conductive features of the device layer 1604 (e.g., the gate 1622 and the S/D contacts 1624) may be electrically coupled with the interconnect structures 1628 of the interconnect layers 1606-1610. The one or more interconnect layers 1606-1610 may form a metallization stack (also referred to as an "ILD stack") 1619 of the IC device 1600.

The interconnect structures 1628 may be arranged within the interconnect layers 1606-1610 to route electrical signals according to a wide variety of designs (in particular, the arrangement is not limited to the particular configuration of interconnect structures 1628 depicted in FIG. 48). Although a particular number of interconnect layers 1606-1610 is depicted in FIG. 48, embodiments of the present disclosure include IC devices having more or fewer interconnect layers than depicted.

In some embodiments, the interconnect structures 1628 may include lines 1628*a* and/or vias 1628*b* filled with an electrically conductive material such as a metal. The lines 1628*a* may be arranged to route electrical signals in a direction of a plane that is substantially parallel with a surface of the substrate 1602 upon which the device layer 1604 is formed. For example, the lines 1628*a* may route electrical signals in a direction in and out of the page from the perspective of FIG. 48. The vias 1628*b* may be arranged to route electrical signals in a direction of a plane that is substantially perpendicular to the surface of the substrate 1602 upon which the device layer 1604 is formed. In some embodiments, the vias 1628*b* may electrically couple lines 1628*a* of different interconnect layers 1606-1610 together.

The interconnect layers 1606-1610 may include a dielectric material 1626 disposed between the interconnect structures 1628, as shown in FIG. 48. In some embodiments, the dielectric material 1626 disposed between the interconnect structures 1628 in different ones of the interconnect layers 1606-1610 may have different compositions; in other embodiments, the composition of the dielectric material 1626 between different interconnect layers 1606-1610 may be the same.

A first interconnect layer 1606 may be formed above the device layer 1604. In some embodiments, the first interconnect layer 1606 may include lines 1628*a* and/or vias 1628*b*, as shown. The lines 1628*a* of the first interconnect layer 1606 may be coupled with contacts (e.g., the S/D contacts 1624) of the device layer 1604.

A second interconnect layer 1608 may be formed above the first interconnect layer 1606. In some embodiments, the second interconnect layer 1608 may include vias 1628*b* to couple the lines 1628*a* of the second interconnect layer 1608 with the lines 1628*a* of the first interconnect layer 1606. Although the lines 1628*a* and the vias 1628*b* are structurally delineated with a line within each interconnect layer (e.g., within the second interconnect layer 1608) for the sake of clarity, the lines 1628*a* and the vias 1628*b* may be structurally and/or materially contiguous (e.g., simultaneously filled during a dual-damascene process) in some embodiments.

A third interconnect layer 1610 (and additional interconnect layers, as desired) may be formed in succession on the second interconnect layer 1608 according to similar techniques and configurations described in connection with the second interconnect layer 1608 or the first interconnect layer 1606. In some embodiments, the interconnect layers that are "higher up" in the metallization stack 1619 in the IC device 1600 (i.e., farther away from the device layer 1604) may be thicker.

The IC device 1600 may include a solder resist material 1634 (e.g., polyimide or similar material) and one or more conductive contacts 1636 formed on the interconnect layers 1606-1610. In FIG. 48, the conductive contacts 1636 are illustrated as taking the form of bond pads. The conductive contacts 1636 may be electrically coupled with the interconnect structures 1628 and configured to route the electrical signals of the transistor(s) 1640 to other external devices. For example, solder bonds may be formed on the one or more conductive contacts 1636 to mechanically and/or electrically couple a chip including the IC device 1600 with another component (e.g., a circuit board). The IC device 1600 may include additional or alternate structures to route the electrical signals from the interconnect layers 1606-1610; for example, the conductive contacts 1636 may include other analogous features (e.g., posts) that route the electrical signals to external components.

Figure 49:
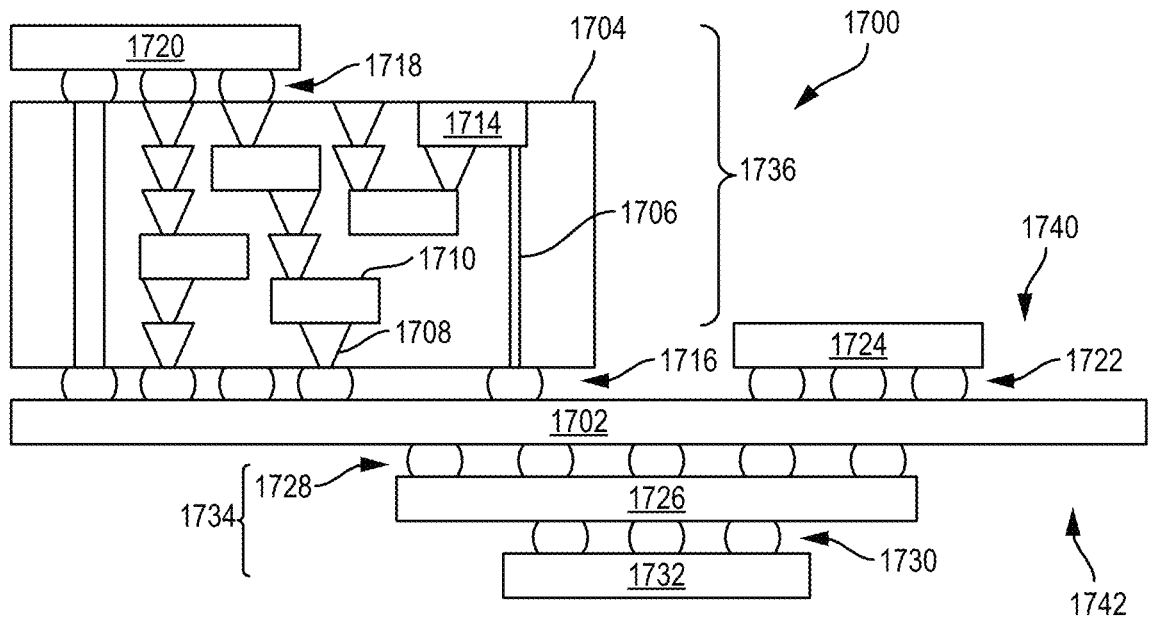
FIG. 49 is a side, cross-sectional view of an IC device assembly that may include a microelectronic assembly in accordance with any of the embodiments disclosed herein.

FIG. 49 is a side, cross-sectional view of an IC device assembly 1700 that may include any of the microelectronic components 102 and/or microelectronic assemblies 100 disclosed herein. The IC device assembly 1700 includes a number of components disposed on a circuit board 1702 (which may be, e.g., a motherboard). The IC device assembly 1700 includes components disposed on a first face 1740 of the circuit board 1702 and an opposing second face 1742 of the circuit board 1702; generally, components may be disposed on one or both faces 1740 and 1742. Any of the IC packages discussed below with reference to the IC device assembly 1700 may include any of the embodiments of the microelectronic assemblies 100 disclosed herein (e.g., may include multiple microelectronic components 102 coupled together by direct bonding).

In some embodiments, the circuit board 1702 may be a PCB including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 1702. In other embodiments, the circuit board 1702 may be a non-PCB substrate.

The IC device assembly 1700 illustrated in FIG. 49 includes a package-on-interposer structure 1736 coupled to the first face 1740 of the circuit board 1702 by coupling components 1716. The coupling components 1716 may electrically and mechanically couple the package-on-interposer structure 1736 to the circuit board 1702, and may include solder balls (as shown in FIG. 49), male and female portions of a socket, an adhesive, an underfill material, and/or any other suitable electrical and/or mechanical coupling structure.

The package-on-interposer structure 1736 may include an IC package 1720 coupled to a package interposer 1704 by coupling components 1718. The coupling components 1718 may take any suitable form for the application, such as the forms discussed above with reference to the coupling components 1716. Although a single IC package 1720 is shown in FIG. 49, multiple IC packages may be coupled to the package interposer 1704; indeed, additional interposers may be coupled to the package interposer 1704. The package interposer 1704 may provide an intervening substrate used to bridge the circuit board 1702 and the IC package 1720. The IC package 1720 may be or include, for example, a die (the die 1502 of FIG. 47), an IC device (e.g., the IC device 1600 of FIG. 48), or any other suitable component. Generally, the package interposer 1704 may spread a connection to a wider pitch or reroute a connection to a different connection. For example, the package interposer 1704 may couple the IC package 1720 (e.g., a die) to a set of BGA conductive contacts of the coupling components 1716 for coupling to the circuit board 1702. In the embodiment illustrated in FIG. 49, the IC package 1720 and the circuit board 1702 are attached to opposing sides of the package interposer 1704; in other embodiments, the IC package 1720 and the circuit board 1702 may be attached to a same side of the package interposer 1704. In some embodiments, three or more components may be interconnected by way of the package interposer 1704.

In some embodiments, the package interposer 1704 may be formed as a PCB, including multiple metal layers separated from one another by layers of dielectric material and interconnected by electrically conductive vias. In some embodiments, the package interposer 1704 may be formed of an epoxy resin, a fiberglass-reinforced epoxy resin, an epoxy resin with inorganic fillers, a ceramic material, or a polymer material such as polyimide. In some embodiments, the package interposer 1704 may be formed of alternate rigid or flexible materials that may include the same materials described above for use in a semiconductor substrate, such as silicon, germanium, and other group III-V and group IV materials. The package interposer 1704 may include metal lines 1710 and vias 1708, including but not limited to TSVs 1706. The package interposer 1704 may further include embedded devices 1714, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency devices, power amplifiers, power management devices, antennas, arrays, sensors, and microelectromechanical systems (MEMS) devices may also be formed on the package interposer 1704. The package-on-interposer structure 1736 may take the form of any of the package-on-interposer structures known in the art.

The IC device assembly 1700 may include an IC package 1724 coupled to the first face 1740 of the circuit board 1702 by coupling components 1722. The coupling components 1722 may take the form of any of the embodiments discussed above with reference to the coupling components 1716, and the IC package 1724 may take the form of any of the embodiments discussed above with reference to the IC package 1720.

The IC device assembly 1700 illustrated in FIG. 49 includes a package-on-package structure 1734 coupled to the second face 1742 of the circuit board 1702 by coupling components 1728. The package-on-package structure 1734 may include an IC package 1726 and an IC package 1732 coupled together by coupling components 1730 such that the IC package 1726 is disposed between the circuit board 1702 and the IC package 1732. The coupling components 1728 and 1730 may take the form of any of the embodiments of the coupling components 1716 discussed above, and the IC packages 1726 and 1732 may take the form of any of the embodiments of the IC package 1720 discussed above. The package-on-package structure 1734 may be configured in accordance with any of the package-on-package structures known in the art.

Figure 50:
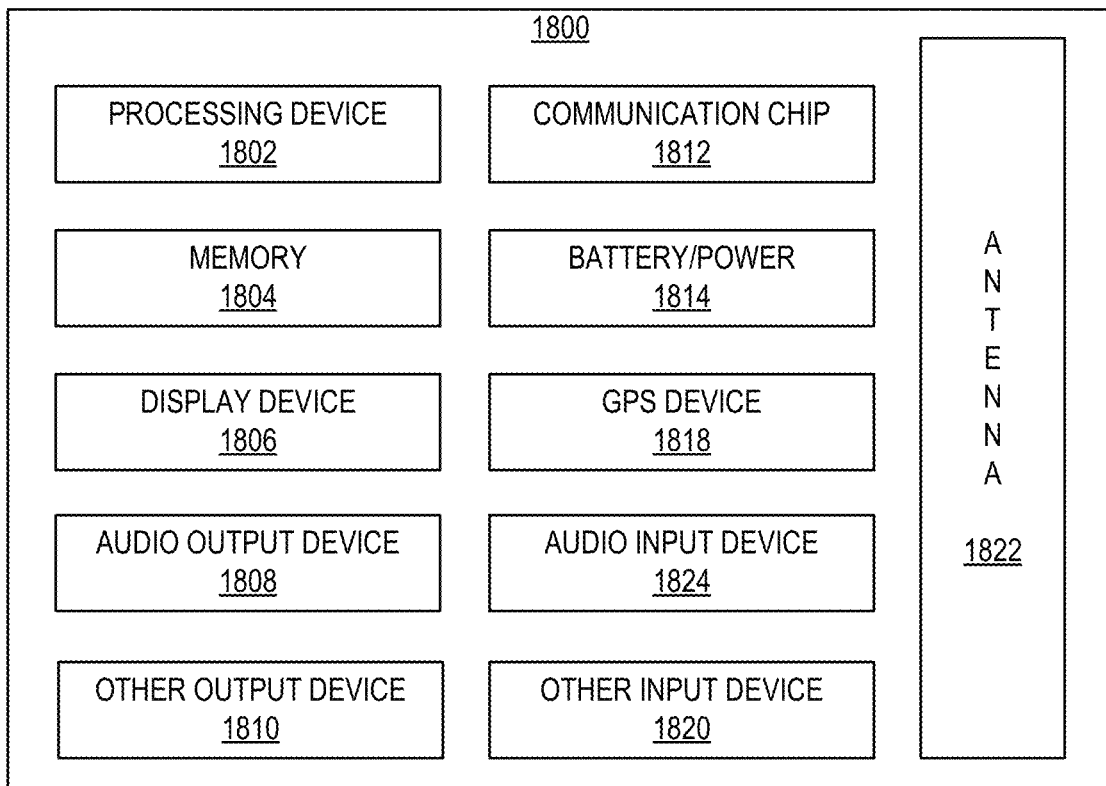
FIG. 50 is a block diagram of an example electrical device that may include a microelectronic assembly in accordance with any of the embodiments disclosed herein.

FIG. 50 is a block diagram of an example electrical device 1800 that may include any of the microelectronic components 102 and/or microelectronic assemblies 100 disclosed herein. For example, any suitable ones of the components of the electrical device 1800 may include one or more of the IC device assemblies 1700, IC devices 1600, or dies 1502 disclosed herein. A number of components are illustrated in FIG. 50 as included in the electrical device 1800, but any one or more of these components may be omitted or duplicated, as suitable for the application. In some embodiments, some or all of the components included in the electrical device 1800 may be attached to one or more motherboards. In some embodiments, some or all of these components are fabricated onto a single system-on-a-chip (SoC) die.

Additionally, in various embodiments, the electrical device 1800 may not include one or more of the components illustrated in FIG. 50, but the electrical device 1800 may include interface circuitry for coupling to the one or more components. For example, the electrical device 1800 may not include a display device 1806, but may include display device interface circuitry (e.g., a connector and driver circuitry) to which a display device 1806 may be coupled. In another set of examples, the electrical device 1800 may not include an audio input device 1824 or an audio output device 1808, but may include audio input or output device interface circuitry (e.g., connectors and supporting circuitry) to which an audio input device 1824 or audio output device 1808 may be coupled.

The electrical device 1800 may include a processing device 1802 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 1802 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. The electrical device 1800 may include a memory 1804, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, the memory 1804 may include memory that shares a die with the processing device 1802. This memory may be used as cache memory and may include embedded dynamic random access memory (eDRAM) or spin transfer torque magnetic random access memory (STT-MRAM).

In some embodiments, the electrical device 1800 may include a communication chip 1812 (e.g., one or more communication chips). For example, the communication chip 1812 may be configured for managing wireless communications for the transfer of data to and from the electrical device 1800. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 1812 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1812 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 1812 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1812 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 1812 may operate in accordance with other wireless protocols in other embodiments. The electrical device 1800 may include an antenna 1822 to facilitate wireless communications and/or to receive other wireless communications (such as AM or FM radio transmissions).

In some embodiments, the communication chip 1812 may manage wired communications, such as electrical, optical, or any other suitable communication protocols (e.g., the Ethernet). As noted above, the communication chip 1812 may include multiple communication chips. For instance, a first communication chip 1812 may be dedicated to shorter-range wireless communications such as Wi-Fi or Bluetooth, and a second communication chip 1812 may be dedicated to longer-range wireless communications such as global positioning system (GPS), EDGE, GPRS, CDMA, WiMAX, LTE, EV-DO, or others. In some embodiments, a first communication chip 1812 may be dedicated to wireless communications, and a second communication chip 1812 may be dedicated to wired communications.

The electrical device 1800 may include battery/power circuitry 1814. The battery/power circuitry 1814 may include one or more energy storage devices (e.g., batteries or capacitors) and/or circuitry for coupling components of the electrical device 1800 to an energy source separate from the electrical device 1800 (e.g., AC line power).

The electrical device 1800 may include a display device 1806 (or corresponding interface circuitry, as discussed above). The display device 1806 may include any visual indicators, such as a heads-up display, a computer monitor, a projector, a touchscreen display, a liquid crystal display (LCD), a light-emitting diode display, or a flat panel display.

The electrical device 1800 may include an audio output device 1808 (or corresponding interface circuitry, as discussed above). The audio output device 1808 may include any device that generates an audible indicator, such as speakers, headsets, or earbuds.

The electrical device 1800 may include an audio input device 1824 (or corresponding interface circuitry, as discussed above). The audio input device 1824 may include any device that generates a signal representative of a sound, such as microphones, microphone arrays, or digital instruments (e.g., instruments having a musical instrument digital interface (MIDI) output).

The electrical device 1800 may include a GPS device 1818 (or corresponding interface circuitry, as discussed above). The GPS device 1818 may be in communication with a satellite-based system and may receive a location of the electrical device 1800, as known in the art.

The electrical device 1800 may include an other output device 1810 (or corresponding interface circuitry, as discussed above). Examples of the other output device 1810 may include an audio codec, a video codec, a printer, a wired or wireless transmitter for providing information to other devices, or an additional storage device.

The electrical device 1800 may include an other input device 1820 (or corresponding interface circuitry, as discussed above). Examples of the other input device 1820 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The electrical device 1800 may have any desired form factor, such as a handheld or mobile electrical device (e.g., a cell phone, a smart phone, a mobile internet device, a music player, a tablet computer, a laptop computer, a netbook computer, an ultrabook computer, a personal digital assistant (PDA), an ultra mobile personal computer, etc.), a desktop electrical device, a server device or other networked computing component, a printer, a scanner, a monitor, a set-top box, an entertainment control unit, a vehicle control unit, a digital camera, a digital video recorder, or a wearable electrical device. In some embodiments, the electrical device 1800 may be any other electronic device that processes data.

The following paragraphs provide various examples of the embodiments disclosed herein.

Example 1 is a microelectronic assembly, including: an interposer including an organic dielectric material; and a microelectronic component coupled to the interposer by a direct bonding region.

Example 2 includes the subject matter of Example 1, and further specifies that the interposer includes non-Manhattan routing of vias and lines.

Example 3 includes the subject matter of any of Examples 1-2, and further specifies that the interposer does not include any through-substrate vias.

Example 4 includes the subject matter of any of Examples 1-3, and further specifies that the organic dielectric material includes a buildup film.

Example 5 includes the subject matter of any of Examples 1-4, and further specifies that the organic dielectric material includes a polyimide, a polybenzoxazole, or an epoxide.

Example 5A includes the subject matter of Example 5, and further specifies that the organic dielectric material includes an epoxide matrix with inorganic filler particles.

Example 5B includes the subject matter of Example 5A, wherein the inorganic filler particles include silicon and oxygen, aluminum and oxygen, or silicon and nitrogen.

Example 6 includes the subject matter of any of Examples 1-5, and further specifies that the interposer includes at least one via with a non-circular footprint.

Example 7 includes the subject matter of any of Examples 1-6, and further specifies that the interposer includes a via in contact with a line, and a side face of the via coplanar with a side face of the line.

Example 8 includes the subject matter of any of Examples 1-7, and further specifies that a direct bonding interface of the interposer includes first metal contacts and a first dielectric material between adjacent ones of the first metal contacts.

Example 9 includes the subject matter of Example 8, and further specifies that a pitch of the first metal contacts is less than 20 microns.

Example 10 includes the subject matter of any of Examples 8-9, and further specifies that the first metal contacts include copper.

Example 11 includes the subject matter of Example 10, and further specifies that the first metal contacts also include manganese and nickel.

Example 12 includes the subject matter of any of Examples 8-11, and further specifies that the first metal contacts include manganese, titanium, gold, silver, palladium, nickel, aluminum, tantalum, or cobalt.

Example 13 includes the subject matter of Example 12, and further specifies that the first metal contacts include tantalum and nitrogen.

Example 14 includes the subject matter of any of Examples 12-13, and further specifies that the first metal contacts include cobalt and iron.

Example 15 includes the subject matter of any of Examples 8-14, and further specifies that the first metal contacts include a bulk metal region and an interface metal region, and a material composition of the interface metal region is different from a material composition of the bulk metal region.

Example 16 includes the subject matter of any of Examples 8-15, and further specifies that the first metal contacts include metal pads.

Example 17 includes the subject matter of Example 16, and further specifies that the metal pads are in contact with vias, and the vias are in the organic dielectric material.

Example 18 includes the subject matter of any of Examples 8-17, and further specifies that the first metal contacts include metal vias.

Example 19 includes the subject matter of Example 18, and further specifies that the metal vias are in the first dielectric material.

Example 20 includes the subject matter of any of Examples 18-19, and further specifies that the metal vias have a non-circular footprint.

Example 21 includes the subject matter of any of Examples 18-20, and further specifies that the metal vias are in contact with metal lines in the interposer, and at least one side face of an individual metal via is aligned with a side face of an associated individual metal line.

Example 22 includes the subject matter of any of Examples 8-21, and further specifies that the direct bonding region includes a liner material between the first metal contacts and the first dielectric material.

Example 23 includes the subject matter of Example 22, and further specifies that the liner material includes silicon and nitrogen.

Example 24 includes the subject matter of any of Examples 22-23, and further specifies that the interposer includes the liner material between the organic dielectric material and a via therein.

Example 25 includes the subject matter of any of Examples 8-24, and further specifies that the first dielectric material includes an inorganic dielectric material.

Example 26 includes the subject matter of Example 25, and further specifies that the inorganic dielectric material includes silicon and oxygen; silicon and nitrogen; silicon, oxygen, and nitrogen; silicon, carbon, and nitrogen; or silicon, oxygen, carbon, and nitrogen.

Example 27 includes the subject matter of any of Examples 25-26, and further specifies that the first dielectric material includes multiple inorganic dielectric materials.

Example 28 includes the subject matter of Example 27, and further specifies that the first dielectric material includes a first inorganic dielectric material and a second inorganic dielectric material different from the first inorganic dielectric material.

Example 29 includes the subject matter of Example 28, and further specifies that the first inorganic dielectric material includes silicon and oxygen, and the second inorganic dielectric material includes silicon, oxygen, carbon, and nitrogen.

Example 30 includes the subject matter of any of Examples 28-29, and further specifies that the first dielectric material includes more of the first inorganic dielectric material than the second inorganic dielectric material.

Example 31 includes the subject matter of any of Examples 25-30, and further specifies that the direct bonding region is at a face of the interposer, and an organic dielectric material region is also at the face of the interposer.

Example 32 includes the subject matter of any of Examples 25-31, and further specifies that the direct bonding region is a first direct bonding region, the interposer includes a second direct bonding region different from the first direct bonding region, the second direct bonding region includes second metal contacts and a second dielectric material between adjacent ones of the second metal contacts.

Example 33 includes the subject matter of Example 32, and further specifies that the second dielectric material has a different material composition than the first dielectric material.

Example 34 includes the subject matter of Example 33, and further specifies that the second dielectric material has a different thermal conductivity than the first dielectric material.

Example 35 includes the subject matter of any of Examples 32-34, and further specifies that the second dielectric material includes silicon and nitrogen, and the first dielectric material includes silicon and oxygen.

Example 36 includes the subject matter of Example 35, and further specifies that a metal density of the first direct bonding region is less than a metal density of the second direct bonding region.

Example 37 includes the subject matter of any of Examples 32-36, and further specifies that a pitch of the second metal contacts is less than 20 microns.

Example 38 includes the subject matter of any of Examples 32-37, and further specifies that the second metal contacts include copper.

Example 39 includes the subject matter of Example 38, and further specifies that the second metal contacts also include manganese and nickel.

Example 40 includes the subject matter of any of Examples 32-39, and further specifies that the second metal contacts include manganese, titanium, gold, silver, palladium, nickel, aluminum, tantalum, or cobalt.

Example 41 includes the subject matter of Example 40, and further specifies that the second metal contacts include tantalum and nitrogen.

Example 42 includes the subject matter of Example 41, and further specifies that the second metal contacts include cobalt and iron.

Example 43 includes the subject matter of any of Examples 32-42, and further specifies that the second metal contacts include a bulk metal region and an interface metal region, and a material composition of the interface metal region is different from a material composition of the bulk metal region.

Example 44 includes the subject matter of any of Examples 32-43, and further specifies that the second metal contacts include metal pads.

Example 45 includes the subject matter of Example 44, and further specifies that the metal pads are in contact with vias, and the vias are in the organic dielectric material.

Example 46 includes the subject matter of any of Examples 32-45, and further specifies that the second metal contacts include metal vias.

Example 47 includes the subject matter of Example 46, and further specifies that the metal vias are in the second dielectric material.

Example 48 includes the subject matter of any of Examples 46-47, and further specifies that the metal vias have a non-circular footprint.

Example 49 includes the subject matter of any of Examples 46-48, and further specifies that the metal vias are in contact with metal lines in the interposer, and at least one side face of an individual metal via is aligned with a side face of an associated individual metal line.

Example 50 includes the subject matter of any of Examples 32-49, and further specifies that the second direct bonding region includes a liner material between the second metal contacts and the second dielectric material.

Example 51 includes the subject matter of Example 50, and further specifies that the liner material includes silicon and nitrogen.

Example 52 includes the subject matter of any of Examples 32-51, and further specifies that the second dielectric material includes an inorganic dielectric material.

Example 53 includes the subject matter of Example 52, and further specifies that the inorganic dielectric material includes silicon and oxygen; silicon and nitrogen; silicon, oxygen, and nitrogen; silicon, carbon, and nitrogen; or silicon, oxygen, carbon, and nitrogen.

Example 54 includes the subject matter of any of Examples 52-53, and further specifies that the second dielectric material includes multiple inorganic dielectric materials.

Example 55 includes the subject matter of Example 54, and further specifies that the second dielectric material includes a first inorganic dielectric material and a second inorganic dielectric material different from the first inorganic dielectric material.

Example 56 includes the subject matter of Example 55, and further specifies that the first inorganic dielectric material includes silicon and oxygen, and the second inorganic dielectric material includes silicon, oxygen, carbon, and nitrogen.

Example 57 includes the subject matter of any of Examples 52-56, and further specifies that the second dielectric material includes more of the first inorganic dielectric material than the second inorganic dielectric material.

Example 57A includes the subject matter of any of Examples 1-57, and further specifies that the microelectronic assembly further includes an inorganic fill material around the microelectronic component.

Example 57B includes the subject matter of Example 57A, and further specifies that the fill material includes silicon and oxygen or silicon and carbon and nitrogen.

Example 58 includes the subject matter of any of Examples 1-57, and further specifies that the microelectronic assembly further includes a mold material around the microelectronic component.

Example 59 includes the subject matter of Example 58, and further specifies that the mold material does not extend between the microelectronic component and the interposer.

Example 60 includes the subject matter of any of Examples 58-59, and further specifies that the mold material includes a glass material or an oxide material or a filler material.

Example 61 includes the subject matter of any of Examples 1-60, and further specifies that the interposer includes second-level interconnects at a face of the interposer.

Example 62 includes the subject matter of Example 61, and further specifies that the second-level interconnects include metal pads, metal pillars, or solder.

Example 63 includes the subject matter of any of Examples 61-62, and further specifies that the microelectronic component is coupled to the face.

Example 64 includes the subject matter of any of Examples 61-63, and further specifies that the face is a first face, the interposer includes a second face opposite to the first face, and the microelectronic component is coupled to the second face.

Example 65 includes the subject matter of any of Examples 1-64, and further specifies that the microelectronic component includes a semiconductor die.

Example 66 includes the subject matter of any of Examples 1-65, and further specifies that the microelectronic component includes a stack of dies.

Example 67 includes the subject matter of Example 66, and further specifies that the stack of dies is a high-bandwidth memory stack.

Example 68 includes the subject matter of any of Examples 1-67, and further specifies that the microelectronic component is a first microelectronic component, the microelectronic assembly includes a second microelectronic component, and the first microelectronic component is coupled between the second microelectronic component and the interposer.

Example 69 includes the subject matter of Example 68, and further specifies that the first microelectronic component includes a through-substrate via.

Example 70 includes the subject matter of any of Examples 68-69, and further specifies that the first microelectronic component does not include transistors or diodes.

Example 71 includes the subject matter of any of Examples 68-69, and further specifies that the first microelectronic component includes active circuitry.

Example 72 includes the subject matter of Example 71, and further specifies that the active circuitry includes memory circuitry or power delivery circuitry.

Example 73 includes the subject matter of any of Examples 68-72, and further specifies that the first microelectronic component is coupled to the second microelectronic component by direct bonding.

Example 74 includes the subject matter of any of Examples 1-73, and further specifies that the microelectronic component is a first microelectronic component, and the microelectronic assembly includes a second microelectronic component coupled to the interposer by direct bonding.

Example 75 includes the subject matter of Example 74, and further specifies that the interposer includes a conductive pathway between the first microelectronic component and the second microelectronic component.

Example 76 includes the subject matter of any of Examples 74-75, and further specifies that the first microelectronic component and the second microelectronic component are coupled to a same face of the interposer.

Example 77 includes the subject matter of any of Examples 74-75, and further specifies that the interposer includes a first face and an opposing second face, the first microelectronic component is coupled to the first face, and the second microelectronic component is coupled to the second face.

Example 78 includes the subject matter of any of Examples 1-77, and further specifies that the interposer includes a first face and an opposing second face, the microelectronic component is a first microelectronic component, the microelectronic assembly includes a second microelectronic component the first microelectronic component is coupled to the first face, and the second microelectronic component is coupled to the second face.

Example 79 includes the subject matter of Example 78, and further specifies that the second microelectronic component is coupled to the second face by solder or die attach adhesive.

Example 80 includes the subject matter of any of Examples 78-79, and further specifies that the second face includes a recess, and the second microelectronic component is at least partially in the recess.

Example 81 includes the subject matter of any of Examples 78-80, and further specifies that the interposer includes second-level interconnects at the second face.

Example 82 includes the subject matter of any of Examples 1-81, and further specifies that the microelectronic assembly further includes a heat spreader.

Example 83 includes the subject matter of Example 82, and further specifies that the microelectronic assembly further includes a thermal interface material between the microelectronic component and the heat spreader.

Example 84 is a microelectronic assembly, including: a first microelectronic component; a second microelectronic component coupled to the first microelectronic component by a direct bonding region; and a third microelectronic component coupled to the first microelectronic component by wire bonding or solder.

Example 85 includes the subject matter of Example 84, and further specifies that the second microelectronic component and the third microelectronic component are coupled to a same face of the first microelectronic component.

Example 86 includes the subject matter of Example 84, and further specifies that the first microelectronic component has a first face and an opposing second face, the second microelectronic component is coupled to the first face, and the third microelectronic component is coupled to the second face.

Example 87 includes the subject matter of Example 86, and further specifies that solder is coupled to the first face, and a height of the solder is greater than a height of the second microelectronic component.

Example 88 includes the subject matter of any of Examples 86-87, and further specifies that solder is coupled to the second face, and a height of the solder is greater than a height of the third microelectronic component.

Example 89 includes the subject matter of any of Examples 84-88, and further specifies that the microelectronic assembly further includes a mold material around the second microelectronic component and the third microelectronic component.

Example 90 includes the subject matter of Example 89, and further specifies that the mold material does not extend between the first microelectronic component and the second microelectronic component.

Example 91 includes the subject matter of any of Examples 89-90, and further specifies that the mold material includes a glass material or an oxide material or a filler material.

Example 92 includes the subject matter of any of Examples 84-91, and further specifies that the microelectronic assembly further includes a fourth microelectronic component coupled to the first microelectronic component, the third microelectronic component is coupled to the first microelectronic component by one of wire bonding and solder, and the fourth microelectronic component is coupled to the first microelectronic component by an other of wire bonding and solder.

Example 93 includes the subject matter of Example 92, and further specifies that the second microelectronic component, the third microelectronic component, and the fourth microelectronic component are coupled to a same face of the first microelectronic component.

Example 94 includes the subject matter of any of Examples 84-93, and further specifies that the microelectronic assembly further includes a package substrate coupled to the first microelectronic component.

Example 95 includes the subject matter of Example 94, and further specifies that the package substrate includes an organic dielectric material.

Example 96 includes the subject matter of any of Examples 94-95, and further specifies that the package substrate is coupled to the first microelectronic component by solder.

Example 97 includes the subject matter of Example 96, and further specifies that the microelectronic assembly further includes an underfill material around the solder.

Example 98 includes the subject matter of any of Examples 94-97, and further specifies that the microelectronic assembly further includes a fifth microelectronic component coupled to the package substrate by wire bonding or solder.

Example 99 includes the subject matter of any of Examples 84-98, and further specifies that the second microelectronic component is a memory component and the third microelectronic component is a logic component.

Example 100 includes the subject matter of any of Examples 84-98, and further specifies that the third microelectronic component is coupled to the first microelectronic component by wire bonding, and the third microelectronic component includes a solar cell, an optical sensor, a mechanical sensor, or an electromagnetic sensor.

Example 101 includes the subject matter of any of Examples 84-100, and further specifies that the first microelectronic component includes an interposer, and the interposer includes an organic dielectric material.

Example 102 includes the subject matter of Example 101, and further specifies that the interposer includes non-Manhattan routing of vias and lines.

Example 103 includes the subject matter of any of Examples 101-102, and further specifies that the interposer does not include any through-substrate vias.

Example 104 includes the subject matter of any of Examples 101-103, and further specifies that the organic dielectric material includes a buildup film.

Example 105 includes the subject matter of any of Examples 101-104, and further specifies that the organic dielectric material includes a polyimide, a polybenzoxazole, or an epoxide.

Example 105A includes the subject matter of Example 105, and further specifies that the organic dielectric material includes an epoxide matrix with inorganic filler particles.

Example 105B includes the subject matter of Example 105A, and further specifies that the inorganic filler particles include silicon and oxygen, aluminum and oxygen, or silicon and nitrogen.

Example 106 includes the subject matter of any of Examples 101-105, and further specifies that the interposer includes at least one via with a non-circular footprint.

Example 107 includes the subject matter of any of Examples 101-106, and further specifies that the interposer includes a via in contact with a line, and a side face of the via coplanar with a side face of the line.

Example 108 includes the subject matter of any of Examples 101-107, and further specifies that a direct bonding interface of the interposer includes first metal contacts and a first dielectric material between adjacent ones of the first metal contacts.

Example 109 includes the subject matter of Example 108, and further specifies that a pitch of the first metal contacts is less than 20 microns.

Example 110 includes the subject matter of any of Examples 108-109, and further specifies that the first metal contacts include copper.

Example 111 includes the subject matter of Example 110, and further specifies that the first metal contacts also include manganese and nickel.

Example 112 includes the subject matter of any of Examples 108-111, and further specifies that the first metal contacts include manganese, titanium, gold, silver, palladium, nickel, aluminum, tantalum, or cobalt.

Example 113 includes the subject matter of Example 112, and further specifies that the first metal contacts include tantalum and nitrogen.

Example 114 includes the subject matter of any of Examples 112-113, and further specifies that the first metal contacts include cobalt and iron.

Example 115 includes the subject matter of any of Examples 108-114, and further specifies that the first metal contacts include a bulk metal region and an interface metal region, and a material composition of the interface metal region is different from a material composition of the bulk metal region.

Example 116 includes the subject matter of any of Examples 108-115, and further specifies that the first metal contacts include metal pads.

Example 117 includes the subject matter of Example 116, and further specifies that the metal pads are in contact with vias, and the vias are in the organic dielectric material.

Example 118 includes the subject matter of any of Examples 108-117, and further specifies that the first metal contacts include metal vias.

Example 119 includes the subject matter of Example 118, and further specifies that the metal vias are in the first dielectric material.

Example 120 includes the subject matter of any of Examples 118-119, and further specifies that the metal vias have a non-circular footprint.

Example 121 includes the subject matter of any of Examples 118-120, and further specifies that the metal vias are in contact with metal lines in the interposer, and at least one side face of an individual metal via is aligned with a side face of an associated individual metal line.

Example 122 includes the subject matter of Example 121, and further specifies that the direct bonding region includes a liner material between the first metal contacts and the first dielectric material.

Example 123 includes the subject matter of any of Examples 122, and further specifies that the liner material includes silicon and nitrogen.

Example 124 includes the subject matter of any of Examples 122-123, and further specifies that the interposer includes the liner material between the organic dielectric material and a via therein.

Example 125 includes the subject matter of any of Examples 108-124, and further specifies that the first dielectric material includes an inorganic dielectric material.

Example 126 includes the subject matter of Example 125, and further specifies that the inorganic dielectric material includes silicon and oxygen; silicon and nitrogen; silicon, oxygen, and nitrogen; silicon, carbon, and nitrogen; or silicon, oxygen, carbon, and nitrogen.

Example 127 includes the subject matter of any of Examples 125-126, and further specifies that the first dielectric material includes multiple inorganic dielectric materials.

Example 128 includes the subject matter of any of Examples 125-127, and further specifies that the first dielectric material includes a first inorganic dielectric material and a second inorganic dielectric material different from the first inorganic dielectric material.

Example 129 includes the subject matter of Example 128, and further specifies that the first inorganic dielectric material includes silicon and oxygen, and the second inorganic dielectric material includes silicon, oxygen, carbon, and nitrogen.

Example 130 includes the subject matter of any of Examples 128-129, and further specifies that the first dielectric material includes more of the first inorganic dielectric material than the second inorganic dielectric material.

Example 131 includes the subject matter of any of Examples 108-130, and further specifies that the direct bonding region is at a face of the interposer, and an organic dielectric material region is also at the face of the interposer.

Example 132 includes the subject matter of any of Examples 108-131, and further specifies that the direct bonding region is a first direct bonding region, the interposer includes a second direct bonding region different from the first direct bonding region, the second direct bonding region includes second metal contacts and a second dielectric material between adjacent ones of the second metal contacts.

Example 133 includes the subject matter of Example 132, and further specifies that the second dielectric material has a different material composition than the first dielectric material.

Example 134 includes the subject matter of Example 133, and further specifies that the second dielectric material has a different thermal conductivity than the first dielectric material.

Example 135 includes the subject matter of any of Examples 132-134, and further specifies that the second dielectric material includes silicon and nitrogen, and the first dielectric material includes silicon and oxygen.

Example 136 includes the subject matter of Example 135, and further specifies that a metal density of the first direct bonding region is less than a metal density of the second direct bonding region.

Example 137 includes the subject matter of any of Examples 132-136, and further specifies that a pitch of the second metal contacts is less than 20 microns.

Example 138 includes the subject matter of any of Examples 132-137, and further specifies that the second metal contacts include copper.

Example 139 includes the subject matter of Example 138, and further specifies that the second metal contacts also include manganese and nickel.

Example 140 includes the subject matter of any of Examples 132-139, and further specifies that the second metal contacts include manganese, titanium, gold, silver, palladium, nickel, aluminum, tantalum, or cobalt.

Example 141 includes the subject matter of Example 140, and further specifies that the second metal contacts include tantalum and nitrogen.

Example 142 includes the subject matter of any of Examples 140-141, and further specifies that the second metal contacts include cobalt and iron.

Example 143 includes the subject matter of any of Examples 132-142, and further specifies that the second metal contacts include a bulk metal region and an interface metal region, and a material composition of the interface metal region is different from a material composition of the bulk metal region.

Example 144 includes the subject matter of any of Examples 132-143, and further specifies that the second metal contacts include metal pads.

Example 145 includes the subject matter of Example 144, and further specifies that the metal pads are in contact with vias, and the vias are in the organic dielectric material.

Example 146 includes the subject matter of any of Examples 132-145, and further specifies that the second metal contacts include metal vias.

Example 147 includes the subject matter of Example 146, and further specifies that the metal vias are in the second dielectric material.

Example 148 includes the subject matter of any of Examples 146-147, and further specifies that the metal vias have a non-circular footprint.

Example 149 includes the subject matter of any of Examples 146-148, and further specifies that the metal vias are in contact with metal lines in the interposer, and at least one side face of an individual metal via is aligned with a side face of an associated individual metal line.

Example 150 includes the subject matter of any of Examples 132-149, and further specifies that the second direct bonding region includes a liner material between the second metal contacts and the second dielectric material.

Example 151 includes the subject matter of Example 150, and further specifies that the liner material includes silicon and nitrogen.

Example 152 includes the subject matter of any of Examples 132-151, and further specifies that the second dielectric material includes an inorganic dielectric material.

Example 153 includes the subject matter of Example 152, and further specifies that the inorganic dielectric material includes silicon and oxygen; silicon and nitrogen; silicon, oxygen, and nitrogen; silicon, carbon, and nitrogen; or silicon, oxygen, carbon, and nitrogen.

Example 154 includes the subject matter of any of Examples 152-153, and further specifies that the second dielectric material includes multiple inorganic dielectric materials.

Example 155 includes the subject matter of Example 154, and further specifies that the second dielectric material includes a first inorganic dielectric material and a second inorganic dielectric material different from the first inorganic dielectric material.

Example 156 includes the subject matter of Example 155, and further specifies that the first inorganic dielectric material includes silicon and oxygen, and the second inorganic dielectric material includes silicon, oxygen, carbon, and nitrogen.

Example 157 includes the subject matter of any of Examples 152-156, and further specifies that the second dielectric material includes more of the first inorganic dielectric material than the second inorganic dielectric material.

Example 158 includes the subject matter of any of Examples 84-157, and further specifies that the first microelectronic component includes a semiconductor die.

Example 159 includes the subject matter of any of Examples 84-158, and further specifies that the first microelectronic component includes a stack of dies.

Example 160 includes the subject matter of Example 159, and further specifies that the stack of dies is a high-bandwidth memory stack.

Example 161 includes the subject matter of any of Examples 84-160, and further specifies that the microelectronic assembly includes a fourth microelectronic component, and the fourth microelectronic component is coupled between the second microelectronic component and the interposer.

Example 162 includes the subject matter of Example 161, and further specifies that the first microelectronic component includes a through-substrate via.

Example 163 includes the subject matter of any of Examples 161-162, and further specifies that the first microelectronic component does not include transistors or diodes.

Example 164 includes the subject matter of any of Examples 161-162, and further specifies that the first microelectronic component includes active circuitry.

Example 165 includes the subject matter of Example 164, and further specifies that the active circuitry includes memory circuitry or power delivery circuitry.

Example 166 includes the subject matter of any of Examples 161-165, and further specifies that the first microelectronic component is coupled to the fourth microelectronic component by direct bonding.

Example 167 includes the subject matter of any of Examples 161-166, and further specifies that the first microelectronic component includes a conductive pathway between the second microelectronic component and the third microelectronic component.

Example 168 is a microelectronic assembly, including: a first microelectronic component having a first face and an opposing second face; a second microelectronic component coupled to the first face by direct bonding; and a third microelectronic component coupled to the second face by a direct bonding region.

Example 169 includes the subject matter of Example 168, and further specifies that the first microelectronic component includes a first metallization stack, a second metallization stack, and through-via region between the first metallization stack and the second metallization stack.

Example 170 includes the subject matter of Example 169, and further specifies that the through-via region includes a first via region, a second via region, and a pad region between the first via region and the second via region.

Example 171 includes the subject matter of any of Examples 169-170, and further specifies that the first microelectronic component includes a device layer between the first metallization stack and the through-via region.

Example 172 includes the subject matter of any of Examples 169-171, and further specifies that the first microelectronic component includes a device layer embedded in the first metallization stack.

Example 173 includes the subject matter of any of Examples 169-172, and further specifies that the first metallization stack includes a thicker metal layer between a thinner metal layer and the through-via region.

Example 174 includes the subject matter of Example 173, and further specifies that the first microelectronic component includes a through-via component that is at least partially coplanar with the thicker metal layer.

Example 175 includes the subject matter of any of Examples 173-174 wherein the first microelectronic component includes a multi-layer via that is at least partially coplanar with the thicker metal layer.

Example 176 includes the subject matter of any of Examples 173-175, and further specifies that the second metallization stack includes a thicker metal layer between a thinner metal layer and the through-via region.

Example 177 includes the subject matter of any of Examples 169-176, and further specifies that the first microelectronic component includes a through-via component between the through-via region and the first metallization stack.

Example 178 includes the subject matter of any of Examples 169-177, and further specifies that the first microelectronic component includes a multi-layer via between the through-via region and the first metallization stack.

Example 179 includes the subject matter of any of Examples 168-178, and further specifies that the first microelectronic component includes a first through-via region, a second through-via region, and a metallization stack between the first through-via region and the second through-via region.

Example 180 includes the subject matter of Example 179, and further specifies that the first microelectronic component includes a device layer between the metallization stack and the first through-via region.

Example 181 includes the subject matter of any of Examples 179-180, and further specifies that the first microelectronic component includes a device layer embedded in the metallization stack.

Example 182 includes the subject matter of any of Examples 168-181, and further specifies that the first microelectronic component includes an inductor.

Example 183 includes the subject matter of any of Examples 168-182, and further specifies that the first microelectronic component includes a through-substrate via.

Example 184 includes the subject matter of any of Examples 168-183, and further specifies that the first microelectronic component does not include transistors or diodes.

Example 185 includes the subject matter of any of Examples 168-183, and further specifies that the first microelectronic component includes active circuitry.

Example 186 includes the subject matter of Example 185, and further specifies that the active circuitry includes memory circuitry or power delivery circuitry.

Example 187 includes the subject matter of any of Examples 168-186, and further specifies that the first microelectronic component includes a thermal slug.

Example 188 includes the subject matter of any of Examples 168-187, and further specifies that the first microelectronic component is an interposer, and the interposer includes an organic dielectric material.

Example 189 includes the subject matter of Example 188, and further specifies that the interposer includes a first portion including one or more layers with the organic dielectric material, and a second portion including one or more layers with an inorganic dielectric material.

Example 190 includes the subject matter of any of Examples 188-189, and further specifies that the interposer includes non-Manhattan routing of vias and lines.

Example 191 includes the subject matter of any of Examples 188-190, and further specifies that the interposer does not include any through-substrate vias.

Example 192 includes the subject matter of any of Examples 188-191, and further specifies that the organic dielectric material includes a buildup film.

Example 193 includes the subject matter of any of Examples 188-192, and further specifies that the organic dielectric material includes a polyimide, a polybenzoxazole, or an epoxide.

Example 193A includes the subject matter of Example 193, and further specifies that the organic dielectric material includes an epoxide matrix with inorganic filler particles.

Example 193B includes the subject matter of Example 193A, and further specifies that the inorganic filler particles include silicon and oxygen, aluminum and oxygen, or silicon and nitrogen.

Example 194 includes the subject matter of any of Examples 188-193, and further specifies that the interposer includes at least one via with a non-circular footprint.

Example 195 includes the subject matter of any of Examples 188-194, and further specifies that the interposer includes a via in contact with a line, and a side face of the via coplanar with a side face of the line.

Example 196 includes the subject matter of any of Examples 188-195, and further specifies that a direct bonding interface of the interposer includes first metal contacts and a first dielectric material between adjacent ones of the first metal contacts.

Example 197 includes the subject matter of Example 196, and further specifies that a pitch of the first metal contacts is less than 20 microns.

Example 198 includes the subject matter of any of Examples 196-197, and further specifies that the first metal contacts include copper.

Example 199 includes the subject matter of Example 198, and further specifies that the first metal contacts also include manganese and nickel.

Example 200 includes the subject matter of any of Examples 196-199, and further specifies that the first metal contacts include manganese, titanium, gold, silver, palladium, nickel, aluminum, tantalum, or cobalt.

Example 201 includes the subject matter of Example 200, and further specifies that the first metal contacts include tantalum and nitrogen.

Example 202 includes the subject matter of any of Examples 200-201, and further specifies that the first metal contacts include cobalt and iron.

Example 203 includes the subject matter of any of Examples 196-202, and further specifies that the first metal contacts include a bulk metal region and an interface metal region, and a material composition of the interface metal region is different from a material composition of the bulk metal region.

Example 204 includes the subject matter of any of Examples 196-203, and further specifies that the first metal contacts include metal pads.

Example 205 includes the subject matter of Example 204, and further specifies that the metal pads are in contact with vias, and the vias are in the organic dielectric material.

Example 206 includes the subject matter of any of Examples 196-205, and further specifies that the first metal contacts include metal vias.

Example 207 includes the subject matter of Example 206, and further specifies that the metal vias are in the first dielectric material.

Example 208 includes the subject matter of any of Examples 206-207, and further specifies that the metal vias have a non-circular footprint.

Example 209 includes the subject matter of any of Examples 206-208, and further specifies that the metal vias are in contact with metal lines in the interposer, and at least one side face of an individual metal via is aligned with a side face of an associated individual metal line.

Example 210 includes the subject matter of any of Examples 196-209, and further specifies that the direct bonding region includes a liner material between the first metal contacts and the first dielectric material.

Example 211 includes the subject matter of Example 210, and further specifies that the liner material includes silicon and nitrogen.

Example 212 includes the subject matter of any of Examples 210-211, and further specifies that the interposer includes the liner material between the organic dielectric material and a via therein.

Example 213 includes the subject matter of any of Examples 196-212, and further specifies that the first dielectric material includes an inorganic dielectric material.

Example 214 includes the subject matter of Example 213, and further specifies that the inorganic dielectric material includes silicon and oxygen; silicon and nitrogen; silicon, oxygen, and nitrogen; silicon, carbon, and nitrogen; or silicon, oxygen, carbon, and nitrogen.

Example 215 includes the subject matter of any of Examples 213-214, and further specifies that the first dielectric material includes multiple inorganic dielectric materials.

Example 216 includes the subject matter of Example 215, and further specifies that the first dielectric material includes a first inorganic dielectric material and a second inorganic dielectric material different from the first inorganic dielectric material.

Example 217 includes the subject matter of Example 216, and further specifies that the first inorganic dielectric material includes silicon and oxygen, and the second inorganic dielectric material includes silicon, oxygen, carbon, and nitrogen.

Example 218 includes the subject matter of any of Examples 216-217, and further specifies that the first dielectric material includes more of the first inorganic dielectric material than the second inorganic dielectric material.

Example 219 includes the subject matter of any of Examples 213-218, and further specifies that the direct bonding region is at a face of the interposer, and an organic dielectric material region is also at the face of the interposer.

Example 220 includes the subject matter of any of Examples 213-219, and further specifies that the direct bonding region is a first direct bonding region, the interposer includes a second direct bonding region different from the first direct bonding region, the second direct bonding region includes second metal contacts and a second dielectric material between adjacent ones of the second metal contacts.

Example 221 includes the subject matter of Example 220, and further specifies that the second dielectric material has a different material composition than the first dielectric material.

Example 222 includes the subject matter of Example 221, and further specifies that the second dielectric material has a different thermal conductivity than the first dielectric material.

Example 223 includes the subject matter of any of Examples 220-222, and further specifies that the second dielectric material includes silicon and nitrogen, and the first dielectric material includes silicon and oxygen.

Example 224 includes the subject matter of Example 223, and further specifies that a metal density of the first direct bonding region is less than a metal density of the second direct bonding region.

Example 225 includes the subject matter of any of Examples 220-224, and further specifies that a pitch of the second metal contacts is less than 20 microns.

Example 226 includes the subject matter of any of Examples 220-225, and further specifies that the second metal contacts include copper.

Example 227 includes the subject matter of Example 226, and further specifies that the second metal contacts also include manganese and nickel.

Example 228 includes the subject matter of any of Examples 220-227, and further specifies that the second metal contacts include manganese, titanium, gold, silver, palladium, nickel, aluminum, tantalum, or cobalt.

Example 229 includes the subject matter of Example 228, and further specifies that the second metal contacts include tantalum and nitrogen.

Example 230 includes the subject matter of any of Examples 228-229, and further specifies that the second metal contacts include cobalt and iron.

Example 231 includes the subject matter of any of Examples 220-230, and further specifies that the second metal contacts include a bulk metal region and an interface metal region, and a material composition of the interface metal region is different from a material composition of the bulk metal region.

Example 232 includes the subject matter of any of Examples 220-231, and further specifies that the second metal contacts include metal pads.

Example 233 includes the subject matter of Example 232, and further specifies that the metal pads are in contact with vias, and the vias are in the organic dielectric material.

Example 234 includes the subject matter of any of Examples 220-233, and further specifies that the second metal contacts include metal vias.

Example 235 includes the subject matter of Example 234, and further specifies that the metal vias are in the second dielectric material.

Example 236 includes the subject matter of any of Examples 234-235, and further specifies that the metal vias have a non-circular footprint.

Example 237 includes the subject matter of any of Examples 234-236, and further specifies that the metal vias are in contact with metal lines in the interposer, and at least one side face of an individual metal via is aligned with a side face of an associated individual metal line.

Example 238 includes the subject matter of any of Examples 220-237, and further specifies that the second direct bonding region includes a liner material between the second metal contacts and the second dielectric material.

Example 239 includes the subject matter of Example 238, and further specifies that the liner material includes silicon and nitrogen.

Example 240 includes the subject matter of any of Examples 220-239, and further specifies that the second dielectric material includes an inorganic dielectric material.

Example 241 includes the subject matter of Example 240, and further specifies that the inorganic dielectric material includes silicon and oxygen; silicon and nitrogen; silicon, oxygen, and nitrogen; silicon, carbon, and nitrogen; or silicon, oxygen, carbon, and nitrogen.

Example 242 includes the subject matter of any of Examples 240-241, and further specifies that the second dielectric material includes multiple inorganic dielectric materials.

Example 243 includes the subject matter of Example 242, and further specifies that the second dielectric material includes a first inorganic dielectric material and a second inorganic dielectric material different from the first inorganic dielectric material.

Example 244 includes the subject matter of Example 243, and further specifies that the first inorganic dielectric material includes silicon and oxygen, and the second inorganic dielectric material includes silicon, oxygen, carbon, and nitrogen.

Example 245 includes the subject matter of any of Examples 240-244, and further specifies that the second dielectric material includes more of the first inorganic dielectric material than the second inorganic dielectric material.

Example 246 includes the subject matter of any of Examples 168-245, and further specifies that the microelectronic assembly further includes a mold material around the second microelectronic component.

Example 247 includes the subject matter of Example 246, and further specifies that the mold material does not extend between the second microelectronic component and the first microelectronic component.

Example 248 includes the subject matter of any of Examples 246-247, and further specifies that the mold material includes particles including copper, silver, diamond, silicon carbide, aluminum nitride, or boron nitride.

Example 249 includes the subject matter of any of Examples 246-248, and further specifies that the mold material includes a glass material or an oxide material or a filler material.

Example 250 includes the subject matter of any of Examples 168-249, and further specifies that the first microelectronic component includes second-level interconnects at the second face of the interposer.

Example 251 includes the subject matter of Example 250, and further specifies that the second-level interconnects include metal pads, metal pillars, or solder.

Example 252 includes the subject matter of any of Examples 168-251, and further specifies that the second microelectronic component includes a semiconductor die.

Example 253 includes the subject matter of any of Examples 168-252, and further specifies that the second microelectronic component includes a stack of dies.

Example 254 includes the subject matter of Example 253, and further specifies that the stack of dies is a high-bandwidth memory stack.

Example 255 includes the subject matter of any of Examples 168-254, and further specifies that the microelectronic assembly includes a fourth microelectronic component coupled to the interposer by direct bonding.

Example 256 includes the subject matter of any of Examples 168-255, and further specifies that the first microelectronic component includes a conductive pathway between the first microelectronic component and the second microelectronic component.

Example 257 includes the subject matter of any of Examples 168-256, and further specifies that the microelectronic assembly further includes a heat spreader.

Example 258 includes the subject matter of Example 257, and further specifies that the microelectronic assembly further includes a thermal interface material between the second microelectronic component and the heat spreader.

Example 259 includes the subject matter of any of Examples 168-258, and further specifies that the first microelectronic component includes one or more embedded dies.

Example 260 includes the subject matter of any of Examples 168-259, and further specifies that the first microelectronic component includes a first embedded die and a second die, and the first embedded die is non-coplanar with the second embedded die.

Example 261 is a microelectronic assembly, including: an interposer; a microelectronic component coupled to a face of the interposer; and a metal plane at the face of the interposer, wherein the metal plane is outside a footprint of the microelectronic component, and is electrically coupled to the microelectronic component through at least one via of the interposer.

Example 261A includes the subject matter of Example 261, and further specifies that the metal plane includes routing.

Example 262 includes the subject matter of Example 261, and further specifies that the metal plane is a first metal plane, and the microelectronic assembly further includes a second metal plane at the face of the interposer, separate from the first metal plane.

Example 263 includes the subject matter of any of Examples 262, and further specifies that the second metal plane is outside a footprint of the microelectronic component, and is electrically coupled to the microelectronic component through at least one via of the interposer.

Example 264 includes the subject matter of any of Examples 262-263, and further specifies that the first metal plane is a ground plane, and the second metal plane is a power plane.

Example 265 includes the subject matter of any of Examples 261-264, and further specifies that a thickness of the metal plane is greater than or equal to 5 4 microns.

Example 266 includes the subject matter of any of Examples 261-265, and further specifies that the metal plane is on a dielectric material of the interposer.

Example 267 includes the subject matter of Example 266, and further specifies that the dielectric material includes an inorganic dielectric material.

Example 268 includes the subject matter of Example 267, and further specifies that the interposer includes a metallization stack including an inorganic dielectric material.

Example 269 includes the subject matter of Example 268, and further specifies that the interposer includes one or more through-substrate vias.

Example 270 includes the subject matter of any of Examples 267-269, and further specifies that the interposer includes a metallization stack including an organic dielectric material.

Example 271 includes the subject matter of Example 270, and further specifies that the interposer does not include any through-substrate vias.

Example 272 includes the subject matter of any of Examples 270-271, and further specifies that the organic dielectric material includes a buildup film.

Example 273 includes the subject matter of any of Examples 270-272, and further specifies that the organic dielectric material includes a polyimide, a polybenzoxazole, or an epoxide.

Example 273A includes the subject matter of Example 273, and further specifies that the organic dielectric material includes an epoxide matrix with inorganic filler particles.

Example 273B includes the subject matter of Example 273A, and further specifies that the inorganic filler particles include silicon and oxygen, aluminum and oxygen, or silicon and nitrogen.

Example 274 includes the subject matter of any of Examples 270-273, and further specifies that the interposer includes at least one via with a non-circular footprint.

Example 275 includes the subject matter of any of Examples 270-274, and further specifies that the interposer includes a via in contact with a line, and a side face of the via coplanar with a side face of the line.

Example 276 includes the subject matter of any of Examples 261-275, and further specifies that the microelectronic component is coupled to the face of the interposer by solder.

Example 277 includes the subject matter of any of Examples 261-275, and further specifies that the microelectronic component is coupled to the face of the interposer by direct bonding.

Example 278 includes the subject matter of Example 277, and further specifies that a direct bonding interface of the interposer includes first metal contacts and a first dielectric material between adjacent ones of the first metal contacts.

Example 279 includes the subject matter of Example 278, and further specifies that the first metal contacts include copper.

Example 280 includes the subject matter of Example 279, and further specifies that the first metal contacts also include manganese and nickel.

Example 281 includes the subject matter of any of Examples 278-280, and further specifies that the first metal contacts include manganese, titanium, gold, silver, palladium, nickel, aluminum, tantalum, or cobalt.

Example 282 includes the subject matter of Example 281, and further specifies that the first metal contacts include tantalum and nitrogen.

Example 283 includes the subject matter of any of Examples 281-282, and further specifies that the first metal contacts include cobalt and iron.

Example 284 includes the subject matter of any of Examples 278-283, and further specifies that the first metal contacts include a bulk metal region and an interface metal region, and a material composition of the interface metal region is different from a material composition of the bulk metal region.

Example 285 includes the subject matter of any of Examples 278-284, and further specifies that the first metal contacts include metal pads.

Example 286 includes the subject matter of Example 285, and further specifies that the metal pads are in contact with vias, and the vias are in the first dielectric material.

Example 287 includes the subject matter of any of Examples 278-286, and further specifies that the first metal contacts include metal vias.

Example 288 includes the subject matter of Example 287, and further specifies that the metal vias are in the first dielectric material.

Example 289 includes the subject matter of any of Examples 287-288, and further specifies that the metal vias have a non-circular footprint.

Example 290 includes the subject matter of any of Examples 287-289, and further specifies that the metal vias are in contact with metal lines in the interposer, and at least one side face of an individual metal via is aligned with a side face of an associated individual metal line.

Example 291 includes the subject matter of any of Examples 278-290, and further specifies that the direct bonding interface includes a liner material between the first metal contacts and the first dielectric material.

Example 292 includes the subject matter of Example 291, and further specifies that the liner material includes silicon and nitrogen.

Example 293 includes the subject matter of any of Examples 278-292, and further specifies that the first dielectric material includes an inorganic dielectric material.

Example 294 includes the subject matter of Example 293, and further specifies that the inorganic dielectric material includes silicon and oxygen; silicon and nitrogen; silicon, oxygen, and nitrogen; silicon, carbon, and nitrogen; or silicon, oxygen, carbon, and nitrogen.

Example 295 includes the subject matter of any of Examples 293-294, and further specifies that the first dielectric material includes multiple inorganic dielectric materials.

Example 296 includes the subject matter of Example 295, and further specifies that the first dielectric material includes a first inorganic dielectric material and a second inorganic dielectric material different from the first inorganic dielectric material.

Example 297 includes the subject matter of Example 296, and further specifies that the first inorganic dielectric material includes silicon and oxygen, and the second inorganic dielectric material includes silicon, oxygen, carbon, and nitrogen.

Example 298 includes the subject matter of any of Examples 296-297, and further specifies that the first dielectric material includes more of the first inorganic dielectric material than the second inorganic dielectric material.

Example 299 includes the subject matter of any of Examples 293-298, and further specifies that the direct bonding interface is a first direct bonding interface, the interposer includes a second direct bonding interface different from the first direct bonding interface, the second direct bonding interface includes second metal contacts and a second dielectric material between adjacent ones of the second metal contacts.

Example 300 includes the subject matter of Example 299, and further specifies that the second dielectric material has a different material composition than the first dielectric material.

Example 301 includes the subject matter of Example 300, and further specifies that the second dielectric material has a different thermal conductivity than the first dielectric material.

Example 302 includes the subject matter of any of Examples 299-301, and further specifies that the second dielectric material includes silicon and nitrogen, and the first dielectric material includes silicon and oxygen.

Example 303 includes the subject matter of Example 302, and further specifies that a metal density of the first direct bonding interface is less than a metal density of the second direct bonding interface.

Example 304 includes the subject matter of any of Examples 299-303, and further specifies that the second metal contacts include copper.

Example 305 includes the subject matter of Example 304, and further specifies that the second metal contacts also include manganese and nickel.

Example 306 includes the subject matter of any of Examples 299-305, and further specifies that the second metal contacts include manganese, titanium, gold, silver, palladium, nickel, aluminum, tantalum, or cobalt.

Example 307 includes the subject matter of Example 306, and further specifies that the second metal contacts include tantalum and nitrogen.

Example 308 includes the subject matter of any of Examples 306-307, and further specifies that the second metal contacts include cobalt and iron.

Example 309 includes the subject matter of any of Examples 299-308, and further specifies that the second metal contacts include a bulk metal region and an interface metal region, and a material composition of the interface metal region is different from a material composition of the bulk metal region.

Example 310 includes the subject matter of any of Examples 299-309, and further specifies that the second metal contacts include metal pads.

Example 311 includes the subject matter of Example 310, and further specifies that the metal pads are in contact with vias, and the vias are in the second dielectric material.

Example 312 includes the subject matter of any of Examples 299-311, and further specifies that the second metal contacts include metal vias.

Example 313 includes the subject matter of Example 312, and further specifies that the metal vias are in the second dielectric material.

Example 314 includes the subject matter of any of Examples 312-313, and further specifies that the metal vias have a non-circular footprint.

Example 315 includes the subject matter of any of Examples 312-314, and further specifies that the metal vias are in contact with metal lines in the interposer, and at least one side face of an individual metal via is aligned with a side face of an associated individual metal line.

Example 316 includes the subject matter of any of Examples 299-315, and further specifies that the second direct bonding interface includes a liner material between the second metal contacts and the second dielectric material.

Example 317 includes the subject matter of Example 316, and further specifies that the liner material includes silicon and nitrogen.

Example 318 includes the subject matter of any of Examples 299-317, and further specifies that the second dielectric material includes an inorganic dielectric material.

Example 319 includes the subject matter of Example 318, and further specifies that the inorganic dielectric material includes silicon and oxygen; silicon and nitrogen; silicon, oxygen, and nitrogen; silicon, carbon, and nitrogen; or silicon, oxygen, carbon, and nitrogen.

Example 320 includes the subject matter of any of Examples 318-319, and further specifies that the second dielectric material includes multiple inorganic dielectric materials.

Example 321 includes the subject matter of Example 320, and further specifies that the second dielectric material includes a first inorganic dielectric material and a second inorganic dielectric material different from the first inorganic dielectric material.

Example 322 includes the subject matter of Example 321, and further specifies that the first inorganic dielectric material includes silicon and oxygen, and the second inorganic dielectric material includes silicon, oxygen, carbon, and nitrogen.

Example 323 includes the subject matter of any of Examples 318-322, and further specifies that the second dielectric material includes more of the first inorganic dielectric material than the second inorganic dielectric material.

Example 324 includes the subject matter of any of Examples 261-323, and further specifies that the microelectronic assembly further includes a mold material on the metal plane.

Example 325 includes the subject matter of Example 324, and further specifies that the mold material includes a glass material or an oxide material or a filler material.

Example 326 includes the subject matter of any of Examples 261-325, and further specifies that the face is a first face, the interposer includes a second face opposite to the first face, and the interposer includes second-level interconnects at the second face of the interposer.

Example 327 includes the subject matter of Example 326, and further specifies that the second-level interconnects include metal pads, metal pillars, or solder.

Example 328 includes the subject matter of any of Examples 261-327, and further specifies that the microelectronic component includes a semiconductor die.

Example 329 includes the subject matter of any of Examples 261-328, and further specifies that the microelectronic component includes a stack of dies.

Example 330 includes the subject matter of Example 329, and further specifies that the stack of dies is a high-bandwidth memory stack.

Example 331 includes the subject matter of any of Examples 261-330, and further specifies that the microelectronic component is a first microelectronic component, the microelectronic assembly includes a second microelectronic component, and the first microelectronic component is coupled between the second microelectronic component and the interposer.

Example 332 includes the subject matter of Example 331, and further specifies that the first microelectronic component includes a through-substrate via.

Example 333 includes the subject matter of any of Examples 331-332, and further specifies that the first microelectronic component does not include transistors or diodes.

Example 334 includes the subject matter of any of Examples 331-332, and further specifies that the first microelectronic component includes active circuitry.

Example 335 includes the subject matter of Example 334, and further specifies that the active circuitry includes memory circuitry or power delivery circuitry.

Example 336 includes the subject matter of any of Examples 331-335, and further specifies that the first microelectronic component is coupled to the second microelectronic component by direct bonding.

Example 337 includes the subject matter of any of Examples 261-336, and further specifies that the microelectronic component is a first microelectronic component, and the microelectronic assembly includes a second microelectronic component coupled to the interposer by direct bonding.

Example 338 includes the subject matter of Example 337, and further specifies that the interposer includes a conductive pathway between the first microelectronic component and the second microelectronic component.

Example 339 includes the subject matter of any of Examples 337-338, and further specifies that the first microelectronic component and the second microelectronic component are coupled to a same face of the interposer.

Example 340 includes the subject matter of any of Examples 337-338, and further specifies that the interposer includes a first face and an opposing second face, the first microelectronic component is coupled to the first face, and the second microelectronic component is coupled to the second face.

Example 341 includes the subject matter of any of Examples 261-340, and further specifies that the microelectronic assembly further includes a heat spreader.

Example 342 includes the subject matter of Example 341, and further specifies that the microelectronic assembly further includes a thermal interface material between the microelectronic component and the heat spreader.

Example 343 is a microelectronic assembly, including: a first microelectronic component; and a second microelectronic component, wherein the second microelectronic component has a first face and an opposing second face, the first face of the second microelectronic component is coupled to the first microelectronic component by a direct bonding region, and the second face of the second microelectronic component includes a direct bonding interface.

Example 344 includes the subject matter of Example 343, and further specifies that the first microelectronic component includes an organic dielectric material around a conductive pathway in the first microelectronic component.

Example 345 includes the subject matter of Example 344, and further specifies that the organic dielectric material includes a buildup film.

Example 346 includes the subject matter of any of Examples 344-345, and further specifies that the organic dielectric material includes a polyimide, a polybenzoxazole, or an epoxide.

Example 346A includes the subject matter of Example 346, and further specifies that the organic dielectric material includes an epoxide matrix with inorganic filler particles.

Example 346B includes the subject matter of Example 346A, and further specifies that the inorganic filler particles include silicon and oxygen, aluminum and oxygen, or silicon and nitrogen.

Example 347 includes the subject matter of any of Examples 344-346, and further specifies that the first microelectronic component includes at least one via with a non-circular footprint.

Example 348 includes the subject matter of any of Examples 344-347, and further specifies that the first microelectronic component includes a via in contact with a line, and a side face of the via coplanar with a side face of the line.

Example 349 includes the subject matter of any of Examples 343-348, and further specifies that the first microelectronic component includes an inorganic dielectric material around a conductive pathway in the first microelectronic component.

Example 350 includes the subject matter of any of Examples 343-349, and further specifies that the first microelectronic component includes a semiconductor material around a conductive pathway in the first microelectronic component.

Example 351 includes the subject matter of Example 350, and further specifies that the first microelectronic component includes silicon.

Example 352 includes the subject matter of any of Examples 350-351, and further specifies that the conductive pathway includes a through-silicon via.

Example 353 includes the subject matter of any of Examples 343-352, and further specifies that the direct bonding region includes first metal contacts of the first microelectronic component and a first dielectric material between adjacent ones of the first metal contacts.

Example 354 includes the subject matter of Example 353, and further specifies that a pitch of the first metal contacts is less than 20 microns.

Example 355 includes the subject matter of any of Examples 353-354, and further specifies that the first metal contacts include copper.

Example 356 includes the subject matter of Example 355, and further specifies that the first metal contacts also include manganese and nickel.

Example 357 includes the subject matter of any of Examples 353-356, and further specifies that the first metal contacts include manganese, titanium, gold, silver, palladium, nickel, aluminum, tantalum, or cobalt.

Example 358 includes the subject matter of Example 357, and further specifies that the first metal contacts include tantalum and nitrogen.

Example 359 includes the subject matter of any of Examples 357-358, and further specifies that the first metal contacts include cobalt and iron.

Example 360 includes the subject matter of any of Examples 353-359, and further specifies that the first metal contacts include a bulk metal region and an interface metal region, and a material composition of the interface metal region is different from a material composition of the bulk metal region.

Example 361 includes the subject matter of any of Examples 353-360, and further specifies that the first metal contacts include metal pads.

Example 362 includes the subject matter of any of Examples 353-361, and further specifies that the first metal contacts include metal vias.

Example 363 includes the subject matter of Example 362, and further specifies that the metal vias are in the first dielectric material.

Example 364 includes the subject matter of any of Examples 362-363, and further specifies that the metal vias have a non-circular footprint.

Example 365 includes the subject matter of any of Examples 362-364, and further specifies that the metal vias are in contact with metal lines in the first microelectronic component, and at least one side face of an individual metal via is aligned with a side face of an associated individual metal line.

Example 366 includes the subject matter of any of Examples 353-365, and further specifies that the direct bonding region includes a liner material between the first metal contacts and the first dielectric material.

Example 367 includes the subject matter of Example 366, and further specifies that the liner material includes silicon and nitrogen.

Example 368 includes the subject matter of any of Examples 366-367, and further specifies that the first microelectronic component includes the liner material between a buildup dielectric and a via therein.

Example 369 includes the subject matter of any of Examples 353-368, and further specifies that the first dielectric material includes an inorganic dielectric material.

Example 370 includes the subject matter of Example 369, and further specifies that the inorganic dielectric material includes silicon and oxygen; silicon and nitrogen; silicon, oxygen, and nitrogen; silicon, carbon, and nitrogen; or silicon, oxygen, carbon, and nitrogen.

Example 371 includes the subject matter of any of Examples 369-370, and further specifies that the first dielectric material includes multiple inorganic dielectric materials.

Example 372 includes the subject matter of Example 371, and further specifies that the first dielectric material includes a first inorganic dielectric material and a second inorganic dielectric material different from the first inorganic dielectric material.

Example 373 includes the subject matter of Example 372, and further specifies that the first inorganic dielectric material includes silicon and oxygen, and the second inorganic dielectric material includes silicon, oxygen, carbon, and nitrogen.

Example 374 includes the subject matter of any of Examples 372-373, and further specifies that the first dielectric material includes more of the first inorganic dielectric material than the second inorganic dielectric material.

Example 375 includes the subject matter of any of Examples 369-374, and further specifies that the direct bonding region is at a face of the first microelectronic component, and an organic dielectric material region is also at the face of the first microelectronic component.

Example 376 includes the subject matter of any of Examples 369-375, and further specifies that the direct bonding region is a first direct bonding region, the first microelectronic component includes a second direct bonding region different from the first direct bonding region, the second direct bonding region includes second metal contacts and a second dielectric material between adjacent ones of the second metal contacts.

Example 377 includes the subject matter of Example 376, and further specifies that the second dielectric material has a different material composition than the first dielectric material.

Example 378 includes the subject matter of Example 377, and further specifies that the second dielectric material has a different thermal conductivity than the first dielectric material.

Example 379 includes the subject matter of any of Examples 376-378, and further specifies that the second dielectric material includes silicon and nitrogen, and the first dielectric material includes silicon and oxygen.

Example 380 includes the subject matter of Example 379, and further specifies that a metal density of the first direct bonding region is less than a metal density of the second direct bonding region.

Example 381 includes the subject matter of any of Examples 376-380, and further specifies that a pitch of the second metal contacts is less than 20 microns.

Example 382 includes the subject matter of any of Examples 376-381, and further specifies that the second metal contacts include copper.

Example 383 includes the subject matter of Example 382, and further specifies that the second metal contacts also include manganese and nickel.

Example 384 includes the subject matter of any of Examples 376-383, and further specifies that the second metal contacts include manganese, titanium, gold, silver, palladium, nickel, aluminum, tantalum, or cobalt.

Example 385 includes the subject matter of Example 384, and further specifies that the second metal contacts include tantalum and nitrogen.

Example 386 includes the subject matter of any of Examples 384-385, and further specifies that the second metal contacts include cobalt and iron.

Example 387 includes the subject matter of any of Examples 376-386, and further specifies that the second metal contacts include a bulk metal region and an interface metal region, and a material composition of the interface metal region is different from a material composition of the bulk metal region.

Example 388 includes the subject matter of any of Examples 376-387, and further specifies that the second metal contacts include metal pads.

Example 389 includes the subject matter of any of Examples 376-388, and further specifies that the second metal contacts include metal vias.

Example 390 includes the subject matter of Example 389, and further specifies that the metal vias are in the second dielectric material.

Example 391 includes the subject matter of any of Examples 389-390, and further specifies that the metal vias have a non-circular footprint.

Example 392 includes the subject matter of any of Examples 389-391, and further specifies that the metal vias are in contact with metal lines in the first microelectronic component, and at least one side face of an individual metal via is aligned with a side face of an associated individual metal line.

Example 393 includes the subject matter of any of Examples 376-392, and further specifies that the second direct bonding region includes a liner material between the second metal contacts and the second dielectric material.

Example 394 includes the subject matter of Example 393, and further specifies that the liner material includes silicon and nitrogen.

Example 395 includes the subject matter of any of Examples 376-394, and further specifies that the second dielectric material includes an inorganic dielectric material.

Example 396 includes the subject matter of Example 395, and further specifies that the inorganic dielectric material includes silicon and oxygen; silicon and nitrogen; silicon, oxygen, and nitrogen; silicon, carbon, and nitrogen; or silicon, oxygen, carbon, and nitrogen.

Example 397 includes the subject matter of any of Examples 395-396, and further specifies that the second dielectric material includes multiple inorganic dielectric materials.

Example 398 includes the subject matter of Example 397, and further specifies that the second dielectric material includes a first inorganic dielectric material and a second inorganic dielectric material different from the first inorganic dielectric material.

Example 399 includes the subject matter of Example 398, and further specifies that the first inorganic dielectric material includes silicon and oxygen, and the second inorganic dielectric material includes silicon, oxygen, carbon, and nitrogen.

Example 400 includes the subject matter of any of Examples 395-399, and further specifies that the second dielectric material includes more of the first inorganic dielectric material than the second inorganic dielectric material.

Example 401 includes the subject matter of any of Examples 343-400, and further specifies that the microelectronic assembly further includes a mold material around the second microelectronic component, wherein the mold material does not extend onto the second face of the second microelectronic component.

Example 402 includes the subject matter of Example 401, and further specifies that the mold material does not extend between the second microelectronic component and the first microelectronic component.

Example 403 includes the subject matter of any of Examples 401-402, and further specifies that the mold material includes a glass material or an oxide material or a filler material.

Example 404 includes the subject matter of any of Examples 401-403, and further specifies that the microelectronic assembly further includes a third microelectronic component coupled to the direct bonding contacts of the second microelectronic component by direct bonding.

Example 405 includes the subject matter of any of Examples 343-404, and further specifies that the first microelectronic component has a first face and an opposing second face, the second face is between the first face and the second microelectronic component, and the microelectronic assembly includes second-level interconnects at the first face of the first microelectronic component.

Example 406 includes the subject matter of Example 405, and further specifies that the second-level interconnects include metal pads, metal pillars, or solder.

Example 407 includes the subject matter of any of Examples 343-406, and further specifies that the second microelectronic component includes a semiconductor die.

Example 408 includes the subject matter of any of Examples 343-407, and further specifies that the second microelectronic component includes a stack of dies.

Example 409 includes the subject matter of Example 408, and further specifies that the stack of dies is a high-bandwidth memory stack.

Example 410 includes the subject matter of any of Examples 343-409, and further specifies that the first microelectronic component does not include transistors or diodes.

Example 411 includes the subject matter of any of Examples 343-409, and further specifies that the first microelectronic component includes active circuitry.

Example 412 includes the subject matter of Example 411, and further specifies that the active circuitry includes memory circuitry or power delivery circuitry.

Example 413 includes the subject matter of any of Examples 343-412, and further specifies that the second microelectronic component includes transistors or diodes.

Example 414 includes the subject matter of any of Examples 343-413, and further specifies that the direct bonding interface of the second microelectronic component includes metal contacts and a dielectric material between adjacent ones of the metal contacts.

Example 415 includes the subject matter of Example 414, and further specifies that a pitch of the metal contacts is less than 20 microns.

Example 416 includes the subject matter of any of Examples 414-415, and further specifies that the metal contacts include copper.

Example 417 includes the subject matter of Example 416, and further specifies that the metal contacts also include manganese and nickel.

Example 418 includes the subject matter of any of Examples 414-417, and further specifies that the metal contacts include manganese, titanium, gold, silver, palladium, nickel, aluminum, tantalum, or cobalt.

Example 419 includes the subject matter of Example 418, and further specifies that the metal contacts include tantalum and nitrogen.

Example 420 includes the subject matter of any of Examples 418-419, and further specifies that the metal contacts include cobalt and iron.

Example 421 includes the subject matter of any of Examples 414-420, and further specifies that the metal contacts include a bulk metal region and an interface metal region, and a material composition of the interface metal region is different from a material composition of the bulk metal region.

Example 422 includes the subject matter of any of Examples 414-421, and further specifies that the metal contacts include metal pads.

Example 423 includes the subject matter of any of Examples 414-422, and further specifies that the metal contacts include metal vias.

Example 424 includes the subject matter of Example 423, and further specifies that the metal vias are in the dielectric material.

Example 425 includes the subject matter of any of Examples 423-424, and further specifies that the metal vias have a non-circular footprint.

Example 426 includes the subject matter of any of Examples 423-425, and further specifies that the metal vias are in contact with metal lines in the second microelectronic component, and at least one side face of an individual metal via is aligned with a side face of an associated individual metal line.

Example 427 includes the subject matter of any of Examples 414-426, and further specifies that the direct bonding interface includes a liner material between the metal contacts and the dielectric material.

Example 428 includes the subject matter of Example 427 wherein the liner material includes silicon and nitrogen.

Example 429 includes the subject matter of any of Examples 427-428, and further specifies that the second microelectronic component includes the liner material between a buildup dielectric and a via therein.

Example 430 includes the subject matter of any of Examples 414-429, and further specifies that the dielectric material includes an inorganic dielectric material.

Example 431 includes the subject matter of Example 430, and further specifies that the inorganic dielectric material includes silicon and oxygen; silicon and nitrogen; silicon, oxygen, and nitrogen; silicon, carbon, and nitrogen; or silicon, oxygen, carbon, and nitrogen.

Example 432 includes the subject matter of any of Examples 430-431, and further specifies that the dielectric material includes multiple inorganic dielectric materials.

Example 433 includes the subject matter of Example 432, and further specifies that the dielectric material includes a first inorganic dielectric material and a second inorganic dielectric material different from the first inorganic dielectric material.

Example 434 includes the subject matter of Example 433, and further specifies that the first inorganic dielectric material includes silicon and oxygen, and the second inorganic dielectric material includes silicon, oxygen, carbon, and nitrogen.

Example 435 includes the subject matter of any of Examples 433-434, and further specifies that the dielectric material includes more of the first inorganic dielectric material than the second inorganic dielectric material.

Example 436 includes the subject matter of any of Examples 430-435, and further specifies that an organic dielectric material region is also at the second face of the second microelectronic component.

Example 437 includes the subject matter of any of Examples 343-436, and further specifies that the microelectronic assembly further includes a protective layer over the direct bonding interface.

Example 438 includes the subject matter of Example 437, and further specifies that the protective layer is coupled to the direct bonding interface by an adhesive.

Example 439 is a system, including: a circuit board; and any of the microelectronic assemblies disclosed herein, communicatively coupled to the circuit board.

Example 440 includes the subject matter of Example 439, and further specifies that the circuit board is a motherboard.

Example 441 includes the subject matter of any of Examples 439-440, and further specifies that the system is a handheld computing system.

Example 442 includes the subject matter of any of Examples 439-441, and further specifies that the system is a wearable computing system.

Example 443 includes the subject matter of any of Examples 439-440, and further specifies that the system is a server computing system.

Example 444 includes the subject matter of any of Examples 439-440, and further specifies that the system is a vehicular computing system.

Example 445 includes the subject matter of any of Examples 439-444, and further specifies that the system further includes a display communicatively coupled to the circuit board.

Example 446 includes the subject matter of any of Examples 439-445, and further specifies that the system further includes a wireless communication device communicatively coupled to the circuit board.

Example 447 includes the subject matter of any of Examples 439-446, and further specifies that the system further includes a housing around the microelectronic assembly and the circuit board.

The invention claimed is:

1. A microelectronic assembly, comprising:
an interposer including an organic dielectric material; and
a microelectronic component coupled to the interposer by a direct bonding region, wherein the direct bonding region includes metal contacts and a dielectric material between adjacent ones of the metal contacts, and wherein the dielectric material includes an inorganic dielectric material.

2. The microelectronic assembly of claim 1, wherein the organic dielectric material includes a polyimide, a polybenzoxazole, or an epoxide.

3. The microelectronic assembly of claim 1, wherein the interposer includes at least one via with a non-circular footprint.

4. The microelectronic assembly of claim 1, wherein a direct bonding interface of the interposer includes first metal contacts and a first dielectric material between adjacent ones of the first metal contacts, and wherein the first dielectric material includes a first inorganic dielectric material.

5. The microelectronic assembly of claim 4, wherein a pitch of the first metal contacts is less than 20 microns.

6. The microelectronic assembly of claim 4, wherein the first metal contacts include a bulk metal region and an interface metal region, and a material composition of the interface metal region is different from a material composition of the bulk metal region.

7. The microelectronic assembly of claim 4, wherein the first metal contacts include metal pads.

8. The microelectronic assembly of claim 4, wherein the first metal contacts include metal vias.

9. The microelectronic assembly of claim 8, wherein the metal vias have a non-circular footprint.

10. The microelectronic assembly of claim 4, wherein the first inorganic dielectric material includes silicon and oxygen; silicon and nitrogen; silicon, oxygen, and nitrogen; silicon, carbon, and nitrogen; or silicon, oxygen, carbon, and nitrogen.

11. The microelectronic assembly of claim 4, wherein the first inorganic dielectric material includes multiple inorganic dielectric materials.

12. The microelectronic assembly of claim 4, wherein the direct bonding interface is a first direct bonding interface, the interposer further includes a second direct bonding interface different from the first direct bonding interface, the second direct bonding interface includes second metal contacts and a second dielectric material between adjacent ones of the second metal contacts, and the second dielectric material includes a second inorganic dielectric material.

13. The microelectronic assembly of claim 12, wherein the second dielectric material has a different material composition than the first dielectric material.

14. The microelectronic assembly of claim 13, wherein the second dielectric material has a different thermal conductivity than the first dielectric material.

15. The microelectronic assembly of claim 12, wherein a metal density of the first direct bonding interface is less than a metal density of the second direct bonding interface.

16. The microelectronic assembly of claim 1, wherein the microelectronic assembly further includes an inorganic fill material around the microelectronic component.

17. The microelectronic assembly of claim 1, wherein the microelectronic component includes a semiconductor die.

18. The microelectronic assembly of claim 1, wherein the microelectronic component includes a stack of dies.

19. The microelectronic assembly of claim 1, wherein the microelectronic component is a first microelectronic component, the microelectronic assembly includes a second microelectronic component, and the first microelectronic component is coupled between the second microelectronic component and the interposer.

20. The microelectronic assembly of claim 19, wherein the first microelectronic component includes a through-substrate via.

* * * * *